United States Patent [19]

Sato et al.

[11] Patent Number: 5,573,891

[45] Date of Patent: Nov. 12, 1996

[54] METHOD AND APPARATUS FOR FINE PROCESSING

[75] Inventors: Yasue Sato, Kawasaki; Toshiyuki Komatsu, Hiratsuka; Shinichi Kawate, Machida, all of Japan

[73] Assignee: Canon Kabushiki Kaisha, Tokyo, Japan

[21] Appl. No.: 393,562

[22] Filed: Feb. 23, 1995

Related U.S. Application Data

[62] Division of Ser. No. 164,822, Dec. 9, 1993, Pat. No. 5,409,802, which is a division of Ser. No. 853,435, Mar. 18, 1992, abandoned.

[30] Foreign Application Priority Data

Mar. 20, 1991 [JP] Japan .................................. 3-080651
Mar. 20, 1991 [JP] Japan .................................. 3-080652
Mar. 9, 1992 [JP] Japan .................................. 3-050792

[51] Int. Cl.$^6$ ........................................ G03C 5/00
[52] U.S. Cl. .................. 430/323; 430/325; 430/326; 430/327; 430/945; 156/345; 33/2 R; 33/12; 33/17 A
[58] Field of Search .................................. 430/323, 325, 430/326, 327, 945; 156/345; 33/2 T, 2 R, 12, 17 A

[56] References Cited

U.S. PATENT DOCUMENTS

| | | | |
|---|---|---|---|
| 4,761,199 | 8/1988 | Sato ............................... | 156/345 |
| 4,960,675 | 10/1990 | Tsuo et al. ..................... | 430/325 |
| 5,024,716 | 6/1991 | Sato ............................... | 156/345 |
| 5,024,724 | 6/1991 | Hirono et al. .................. | 156/628 |

*Primary Examiner*—Shelley A. Dodson
*Assistant Examiner*—Duc Truong
*Attorney, Agent, or Firm*—Fitzpatrick, Cella, Harper & Scinto

[57] ABSTRACT

An apparatus for fine processing includes a support for supporting a material to be processed, an active layer forming device for forming an active layer on the surface of the material by irradiating the material with light in a reaction gas, a latent image forming device for selectively irradiating the active layer with energy in the reaction gas to form a latent image, a shield mask forming device for removing either the latent image layer or the active layer to form a shield mask and an etching device for etching the portion other than the mask portion using the portion left unetched as the shield mask.

37 Claims, 22 Drawing Sheets

VACUUM EVACUATION SYSTEM

SiO2 FILM THICKNESS VS OXIDATION TIME 5,573,891

METHOD AND APPARATUS FOR FINE PROCESSING

This application is a divisional of application, Ser. No. 08/164,822 filed Dec. 9, 1993, now U.S. Pat. No. 5,409,802 which application is a divisional of prior application, Ser. No. 07/853,435 filed Mar. 18, 1992, now abandoned.

BACKGROUND OF THE INVENTION

1. Field of the Invention

The present invention relates to a fine processing method for forming patterns on semiconductors, metal or insulating materials and, more particularly, to a method and apparatus for fine processing without employing a resist.

2. Related Background Art

Photolithography is one of the important techniques for manufacturing semiconductor devices, in which the structure of a device is formed on a substrate by fine processing according to a desired pattern. Conventionally, this technique is performed by a rather complicated procedure including resist application, pattern exposure, development, etching, resist removal, etc.

Since, in the processes of resist application, development and resist removal solutions are used, photolithography cannot be performed in a completely dry condition. The resist peeled off the substrate may remain as dust and cause defects, in which case the yield decreases. Therefore, a film forming and etching step containing fine processing, rather than the wet process employing solutions, is mainly a dry process employing a plasma or an excited gas in a vacuum or a low-pressure gas atmosphere.

In the development of devices, such as semiconductor memory devices, of a larger capacity and a higher performance, the circuit patterns and structures thereof have become finer and more complex. Also, in the development of larger-size apparatuses, such as liquid crystal displays or plasma displays, the function of the devices employed therein have become complex. When the above-mentioned photolithography is employed to manufacture such devices, the procedure becomes even more complicated, pushing up production costs, and the number of defects caused by the residues of peeled resist increases, resulting in a lowered yield. Even when the dry process is employed instead of photolithography, the problems resulting from the peeled resist remain unsolved.

In the Lecture Manuscript of the 5th Dry Process Symposium, p.97 (1983), Sekine, Okano and Horiike describe a photoetching technique whose procedure for forming a pattern on a substrate is substantially simplified, compared with the complex process of photolithography employing the above mentioned resist.

FIGS. 12 and 13 schematically illustrate a photoetching apparatus described in the above paper, showing a material to be processed 101, a material supporting table 1202, a vacuum-tight etching chamber 1203, a garb inlet 1204, a light source (an Hg-Xe lamp of 200 W) 1205, a fused quartz lens 1206, a fused quartz window 1207, a light-shield box 1208 and a mask 1309 comprising a fused quartz substrate having an Al pattern thereon.

The photoetching method employing the above-described apparatus will be described. A material 101 is mounted on the material supporting table 1202, and the etching chamber 1203 is vacuum-evacuated to $10^{-4}$ torr or lower. Then, an etching gas is introduced through the gas inlet 1204 into the etching chamber 1203. The pressure in the etching chamber 1203 is set at a desired level in a range from 1 to 760 torr by adjusting a vacuum evacuation system. The Hg-Xe lamp 1205 is turned on to emit UV rays, which are converged by the fused quartz lens 1206 into a spot having a diameter of 2 mm on the surface of the material 101. The area irradiated by the UV rays is etched by the photochemical reaction between the irradiated area and the etching gas. A pattern is directly formed on the material 101 without requiring a resist, by employing the mask 1309 placed in the immediate front of the material 101, as shown in FIG. 13.

When the material 101 is a substrate having a deposited polycrystalline (poly-Si) film, chlorine is used as the etching gas. The above paper reports that normal etching is performed on a non-doped poly-Si at a speed of 80 Å/min or less, on a phosphorus-doped poly-Si ($n^+$-poly-Si) at 7000 Å/min or less, and on a boron-doped poly-Si ($p^+$-poly-Si) at 80 Å/min or less.

A case is reported in which patterning is performed as follows: a non-doped poly-Si is used as the material 101; the mask 1309 is placed at a distance of 100 μm in front of the material 101, as shown in FIG. 13; and the material 101 is selectively irradiated for etching with UV rays coming through the mask 1309 in an atmosphere of chlorine, and thus only the irradiated areas are etched.

The method as described above provides a simple step without requiring resist application, development, resist removal, etc. Thus, this method increases the yield and substantially reduces costs. It also provides etching without damage, unlike the conventional reactive ion etching in which damage is caused by ion irradiation.

However, this photoetching method is unsuitable for high-precision fine processing requiring high fidelity to the pattern because light scatters or diffracts in the fine processing groove. If complete anisotropy etching is to be carried out, a film for protecting the side wall must be formed. Such a film is left as debris in the device after the etching process and gives a bad effect thereto.

As described above, the speed of etching on a non-doped poly-Si or a $p^+$-poly-Si is at fastest 80 Å/min. Such speed is two orders in magnitude smaller than that of plasma etching.

Although UV rays are converged into a spot having a diameter of 2 mm in the above conventional example, UV rays are converged, in real practice, to irradiate the entire surface of a Si substrate of 4 to 8 inches in size. Thus, the irradiation intensity of UV rays reduces to 4/10000 or less of the intensity in the above example. Because the etching speed substantially depends on the irradiation intensity, the speed accordingly becomes very slow.

In the above-described photolithography, there is a tendency that as the process thereof becomes complicated, more debris or trash remains in the device to cause increased defects in the devices and a reduced yield.

Therefore, there is a demand for a thin film pattern forming method which does not require a photoresist.

SUMMARY OF THE INVENTION

It is an object of the present invention to solve the above problems by providing a method for fine processing which provides a high-precision and high-speed fine processing causing no damage to the processed portion and which does not employ a resist, which in the device gives rise to very little trash or debris in the device and provides favorable yield, and by providing an apparatus for carrying out such a method.

It is another object of the present invention to provide a method for fine processing in which energy is applied to the surface of a material to be processed to form a chemically active layer thereon at the first step, and an energy beam is used to selectively irradiate the material to form a latent image thereon at a high rate, and an apparatus for carrying out such a method.

It is still another object of the present invention to provide a method for fine processing wherein the above-mentioned active layer is formed alone or in combination of the following manners: irradiating a material surface with light to form a chemically active layer; applying thermal energy to the material surface to form a thermochemically active layer; and exposing the material surface to a plasma to form a chemically active layer, and an apparatus for carrying out such a method.

It is a further object of the present invention to provide a method for fine processing which employs plasma etching for a faster and more precise etching process so that the entire process of fine processing onto a material is carried out faster and more precisely than a conventional fine processing method employing photoetching.

It is a still further object of the present invention to provide a method for fine processing which provides fine processing without causing damage to the processed area by reducing the energy of excited gas or ions reaching the surface of the material from a plasma.

Further, it is an object of the present invention to provide a fine processing method which does not employ a resist and which produces very little debris or trash and provides a favorable yield.

Further, it is another object of the present invention to provide a fine processing method which can be employed for fine patterning.

Still further, it is an object of the present invention to provide a fine processing method in which a thickness of a protection film to be used as an etching mask can be controlled by successively performing a step of forming a surface modified layer (a latent image) and a step of etching, a plurality of times.

Further, it is an object of the present invention to provide a fine processing method in which the etching amount (depth) depends on the total thickness of the protection film, and thus, even deep etching can be done with an accordingly thick protection film provided, i.e. a desired etching amount (depth) can be easily obtained.

DESCRIPTION OF THE PREFERRED EMBODIMENT

Figure 1A:
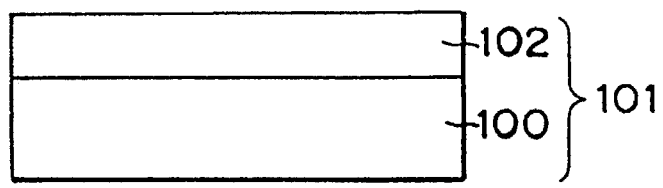
FIGS. 1A to 1E illustrate steps of a fine processing method according to the present invention.

To achieve the above objects by solving the above-described problems in the conventional fine processing method employing photoetching, the present inventors have developed fine processing methods as described below.

A method for fine processing according to the present invention comprises: a first step in which a material to be processed is mounted on a material supporting table provided inside a reaction chamber, and the material is irradiated with light and a first reaction gas is introduced into the reaction chamber to an active layer through a photochemical reaction between the surface of the material and the first reaction gas, followed by a change of the composition of the surface of the material; a second step in which energy is selectively irradiated to the processed surface of the material in an atmosphere of a second reaction gas so that only the portion irradiated with energy is chemically changed into a latent image layer; a third step in which either the latent image layer formed in the second step or the portion other than the latent image layer is removed; and a fourth step in which using the portion left unremoved in the third step as a masked portion, the portion other than the masked portion is etched.

Also, a method for fine processing according to the present invention comprises: a first step in which a material to be processed is mounted on a material supporting table provided inside a reaction chamber, and the material is heated by a heating means provided in the supporting table and a first reaction gas is introduced into the reaction chamber to form an active layer through a thermochemical reaction between the surface of the material and the first reaction gas, followed by a change of the composition of the surface of the material; a second step in which the processed surface of the material in the first step is selectively. irradiated with energy in an atmosphere of a second reaction gas to form a latent image layer through a chemical change of only the portion irradiated with energy; a third step in which either the latent image layer formed in the second step or the portion other than the latent image layer is removed; and a fourth step in which using the portion left unremoved in the third step as a masked portion, the portion other than the masked portion is etched.

Further, a method for fine processing according to the present invention comprises: a first step in which a material to be processed is mounted on a material supporting table provided inside a reaction chamber, and a first reaction gas is introduced into the reaction chamber, and electromagnetic energy is irradiated to the surface of the material to generate a plasma of the reaction gas, and then the plasma is applied to the surface of the material to cause a chemical reaction and to form an active layer by chemically changing the composition of the surface to be processed; a second step in which the processed surface of the material in the first step is selectively irradiated with energy in an atmosphere of a second reaction gas to form a latent image by chemically changing only the portion irradiated with energy; a third step in which either the latent image layer or the portion other than the latent image layer is removed; and a fourth step in which using the portion left unremoved in the third step as a masked portion, the portion other than the masked portion is etched.

In addition, a method for fine processing according to the present invention comprises: a first step in which the surface of a material to be fine-processed is selectively irradiated with light in an atmosphere of a desired reaction gas to selectively form a surface modified layer on the surface of the material to be processed; and a second step in which using the surface modified layer as an etching mask, the material to be processed is etched, wherein the first step and the second step are successively performed a plurality of times.

Further, a method for fine processing according to the present invention comprises: a first step in which a material to be processed is mounted on a material supporting table provided inside a reaction chamber, and the surface of the material is selectively irradiated with energy in an atmosphere of a reaction gas to form a surface modified layer (a latent image layer) having a different composition through a chemical change only in the irradiated portion; and a second step in which a thin film is formed by plating only on the portion other than the latent image layer of the material.

The present invention also provides a fine processing apparatus suitable to carry out a method for fine processing as described above. An apparatus for fine processing according to the present invention is constructed as below.

An apparatus for fine processing according to the present invention comprises: means for supporting a material to be processed; active layer forming means for forming an active layer on the surface of the material by irradiating the material with light in an atmosphere of a reaction gas; latent image forming means for forming a latent image by selectively irradiating energy to the active layer in an atmosphere of a reaction gas; shield mask forming means for removing only the active layer to form a shield mask; and etching means for etching the portion other than the shield mask.

An apparatus for fine processing may comprise shield mask forming means which removes the portion other than the latent image layer to form a shield mask.

An apparatus for fine processing may comprise shield mask forming means which irradiates a plasma to the material.

An apparatus for fine processing may comprise shield mask forming means which irradiates excited species to the material.

More specifically, the above-described apparatus for fine processing comprises a first reaction chamber, a second reaction chamber, a third reaction chamber and means for conveying a material to be processed inside the first, second and third reaction chambers without exposing the material to the atmosphere. The first reaction chamber includes: means for supporting the material to be processed; means for irradiating the material with light; means for introducing a reaction gas into the first reaction chamber; and vacuum evacuation means, in which chamber an active layer is formed on the surface of the material. The second chamber includes: means for supporting the material to be processed; means for introducing a reaction gas into the second reaction chamber; vacuum evacuation means; and means for selectively irradiating energy to the surface of the material, in which chamber a latent image layer is formed in the portion irradiated with energy. The third chamber includes: means for supporting the material to be processed; means for introducing a reaction gas into the third reaction chamber; vacuum evacuation means; and means for introducing a plasma into the third reaction chamber, in which chamber either the portion of the latent image layer or only the portion other than the latent image layer is removed to serve the unremoved portion as a shield mask and the portion other than the shield mask is etched.

An apparatus for fine processing according to the present invention comprises: means for supporting a material to be processed; active layer forming means for forming an active layer on the surface of the material by heating the material in an atmosphere of a reaction gas; latent image forming means for forming a latent image layer by selectively irradiating energy to the active layer; shield mask forming means for removing only the active layer to serve the portion unremoved as a shield mask; and etching means for etching the portion other than the shield mask.

An apparatus for fine processing may comprise shield mask forming means which removes the portion other than the latent image layer to form a shield mask.

An apparatus for fine processing may comprise shield mask forming means which irradiates a plasma to the material.

An apparatus for fine processing may comprise shield mask forming means which irradiates excited species to the material.

An apparatus for fine processing may comprise material supporting means which includes means for heating the material to be processed.

More specifically, the above-described apparatus for fine processing comprises a first reaction chamber, a second reaction chamber, a third reaction chamber and means for conveying a material to be processed inside the first, second and third reaction chambers without exposing the material to the atmosphere. The first reaction chamber includes: means for supporting the material to be processed; means for heating the material; means for introducing a reaction gas into the first reaction chamber; and vacuum evacuation means, in which chamber an active layer is formed on the surface of the material. The second chamber includes: means for supporting the material to be processed; means for introducing a reaction gas into the second reaction chamber; vacuum evacuation means; and means for selectively irradiating energy to the surface of the material, in which chamber a latent image layer is formed on the material in the portion irradiated with energy. The third chamber includes: means for supporting the material to be processed; means for introducing a reaction gas into the third reaction chamber; vacuum evacuation means; and means for introducing a plasma into the third reaction chamber, in which chamber either the portion of the latent image layer or only the portion other than the latent image layer is removed to serve the unremoved portion as a shield mask and the portion other than the shield mask is etched.

Also, an apparatus for fine processing according to the present invention comprises a first airtight reaction chamber which can hold a vacuum therein and in which a first step is carried out, a second airtight reaction chamber which can hold a vacuum therein and in which a second step is carried out and a third airtight reaction chamber which can hold a vacuum therein and in which third and fourth steps are carried out. The first reaction chamber includes: a table provided therein for supporting a material to be processed; means for supplying a treatment gas to be used in the first step into the first reaction chamber; means for supplying electromagnetic energy to generate a plasma in the treatment gas; and vacuum evacuation means for vacuum-evacuating the first reaction chamber. The second reaction chamber includes: a table provided therein having means for supporting a material to be processed; means for supplying a treatment gas to be used in the second step into the second reaction chamber; means for vacuum-evacuating the second reaction chamber; and means which generates an energy beam, controls it and irradiates it onto the material. The third reaction chamber includes: a table provided therein having means for supporting a material to be processed; means for supplying a treatment gas to be used in the third and fourth steps into the third reaction chamber; means for vacuum-evacuating the third reaction chamber; means for generating a plasma inside the third reaction chamber or a plasma chamber provided on the outside of the third reaction chamber for generating a plasma of a treatment gas to be used in the third and fourth steps and provided with at least one of means for supplying only excited gas and for supplying the plasma from the plasma chamber into the third reaction chamber. Preferably, the first, second and third reaction chambers should be connected by means of gate valves, or through gate valves to an airtight vacuum chamber being capable of holding a vacuum therein and including material conveying means and vacuum-evacuating means so that the first, second, third and fourth steps can be carried out without exposing the material to the atmosphere.

According to a method and apparatus for fine processing as described above, the chemically active layer formed on the surface of a material in the first step enables the formation of the latent image layer at a high rate by the selective energy-beam irradiation in the second step.

Because a plasma or excited etching species provide a fast-rate and high-precision etching process, the entire process of the method of the present invention can be performed faster than the conventional process employing photoetching.

According to the present invention, the damage which occurs to the material during fine processing can be eliminated by reducing the energy of the ions which reach from the plasma to the surface of the material. In addition, since the material is not exposed to the atmosphere during the fine processing, the surface of the material can be kept intact. As a result, performance of the produced device is improved.

Since no resist is used, very little trash or debris is produced during processing. Therefore, the yield of the fine processing increases.

By forming the latent image layer in the first step and plating on only the portion other than the latent image in the second step to form a thin film, patterning with a thin film can be carried out without requiring a photoresist.

In a case where the etching selection ratio between the material to be processed and the protection film to function as a mask in the etching process is not substantially high, if the protection film obtained by performing once the step of modifying the surface is thin, the protection film (the mask) is deleted during dry etching before a sufficient etching amount (depth) is obtained on the material to be fine-processed.

To solve such a problem, in a fine processing method according to the present invention, a protection film used as an etching mask having a sufficient thickness can be obtained by successively performing, a plurality of times, a step of forming a surface modified layer (a latent image) and a step of etching. The etching amount (depth) increases as the total thickness of the protection film increases. Thus, even deep etching can be done because a corresponding thick protection film can be provided. In other words, a desired etching amount (depth) can be obtained.

Preferred embodiments of the present invention will now be described in detail with reference to the accompanying drawings

FIRST EMBODIMENT

Figure 1B:
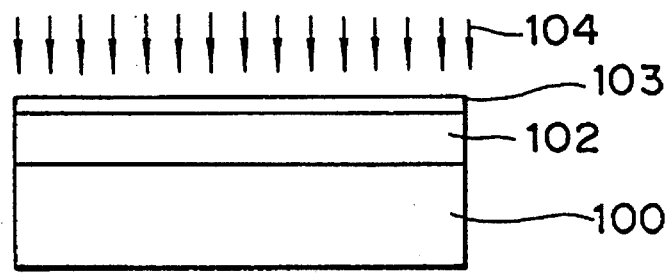
Figure 1C:
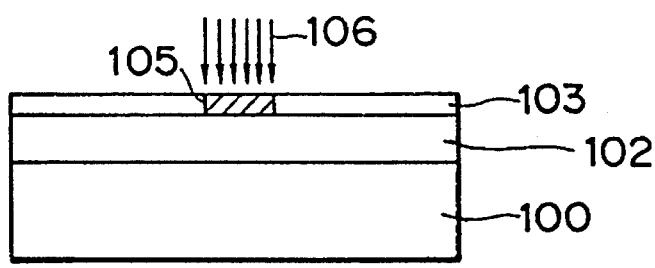
Figure 1D:
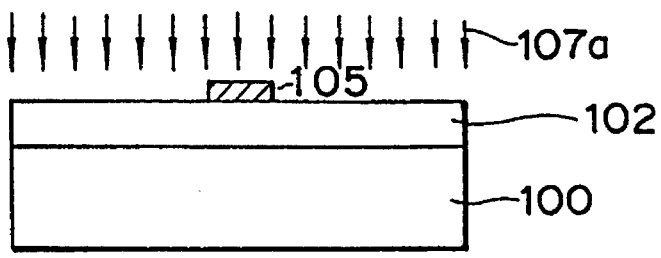
Figure 1E:
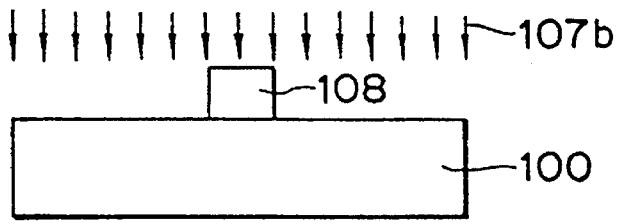

In FIGS. 1A through 1E which illustrate the steps in the flow of the fine processing method according to the present invention, FIG. 1A illustrates a material to be processed, FIG. 1B illustrates a first step, FIG. 1C illustrates a second step, FIG. 1D illustrates a third step, and FIG. 1E illustrates a fourth step. In FIGS. 1A through 1E, reference character 100 denotes a substrate; 101, a material to be processed with a layer 102 to be processed deposited on the substrate 100; 103, an activated layer; 105, a latent image layer formed in the activated layer 103 by an energy beam 106; 107a and 107b, a plasma or excitation species; and 108 a desired pattern formed by etching.

Figure 2:
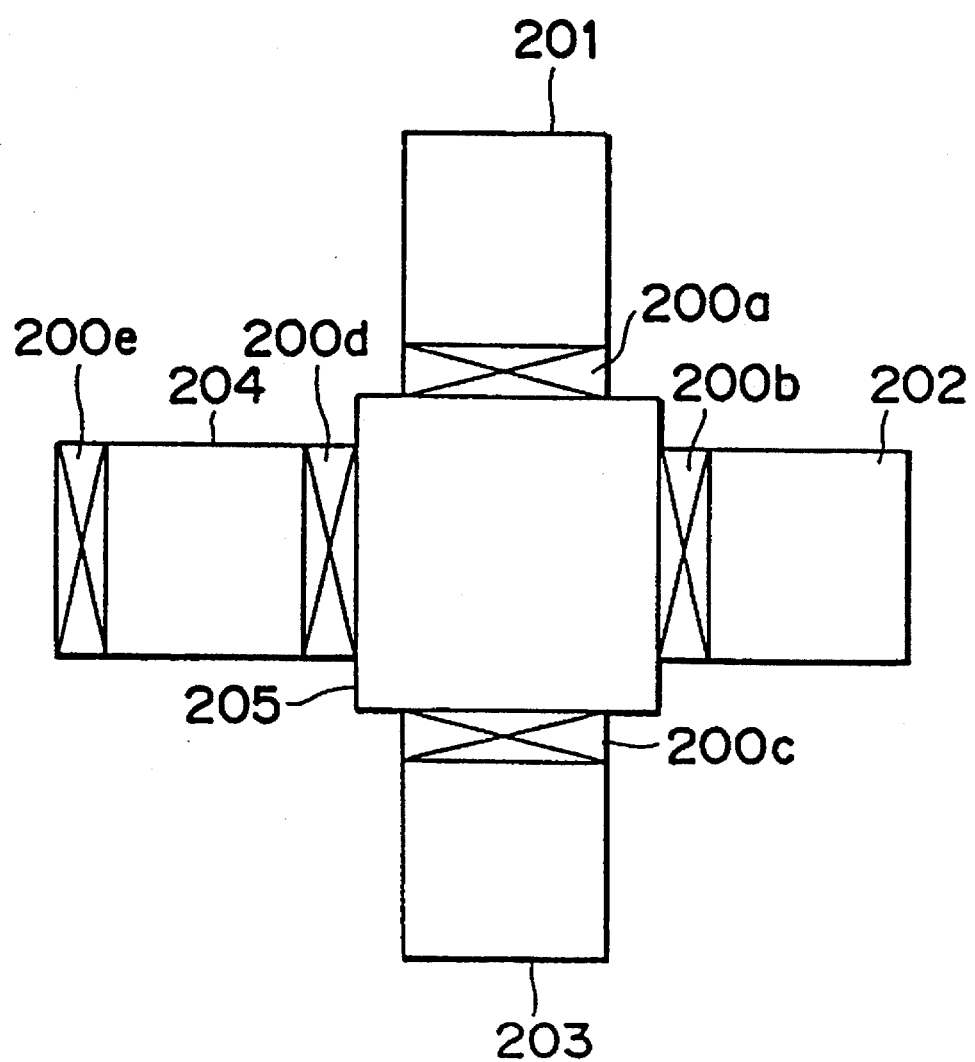
FIG. 2 schematically illustrates a construction of one preferred embodiment of the apparatus according to the present invention.

FIG. 2 schematically illustrates the structure of an example of the fine processing apparatus according to the present invention. In FIG. 2, reference characters 200a, 200b, 200c, 200d and 200e denote gate valves capable ofbeing hermetically vacuum sealed and of passing the material 101 to be processed therethrough; 201, a surface activating unit for performing the first step; 202, a latent image unit for performing the second step; 203, an etching unit for performing the third and fourth steps; 204, a load lock unit for providing the material 101 to be processed under a vacuum and for returning it to the atmosphere; and 205, a conveying unit having a conveying means capable of conveying the material 101 to be processed to each chamber under a vacuum.

The individual units of the apparatus according to the present invention shown in FIG. 2 will be described in detail with reference to FIGS. 3 through 7.

Figure 3:
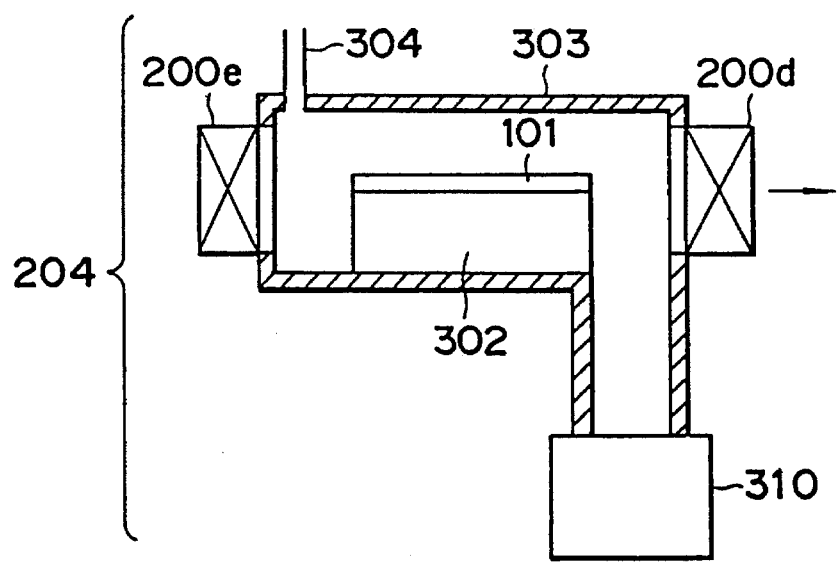
FIG. 3 is a schematic sectional view of a load lock unit.

FIG. 3 schematically illustrates the cross-sectional structure of the load lock unit 204. In FIG. 3, reference character 302 denotes a material holding base; 303, a load lock chamber 303 which can be put under a vacuum; 304, a gas inlet through which nitrogen gas is introduced into the load lock chamber 303 so as to open the chamber 303 to the atmosphere; and 310, a vacuum-evacuating apparatus which can vacuum-evacuate the load lock chamber 303 and whose evacuation rate can be controlled. The other parts designated by the same reference characters as those used in FIGS. 1 and 2 are parts which are the same as those shown in FIGS. 1 and 2.

Figure 4:
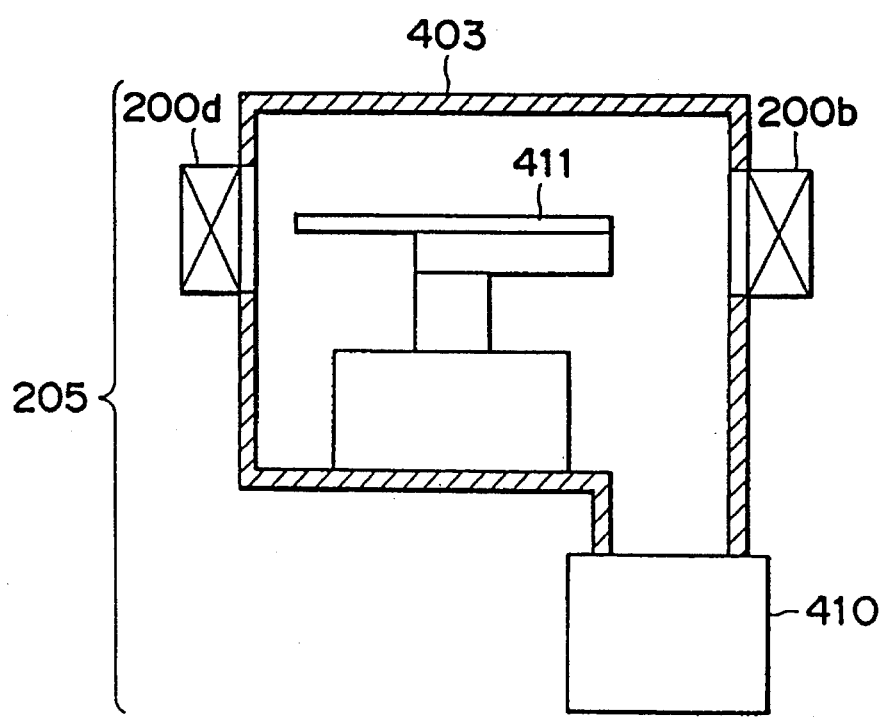
FIG. 4 is a schematic sectional view of a conveying unit.

FIG. 4 is a schematic cross-sectional view of the conveying unit 205. In FIG. 4, reference character 403 denotes a conveying chamber which can be put under a vacuum; 410, a vacuum-evacuating apparatus which can vacuum-evacuate the conveying chamber 403; and 411, a robot for conveying the material to be processed. The other parts designated by the same reference characters as those used in FIGS. 1 and 2 are parts which are the same as those shown in FIGS. 1 and 2.

Figure 5:
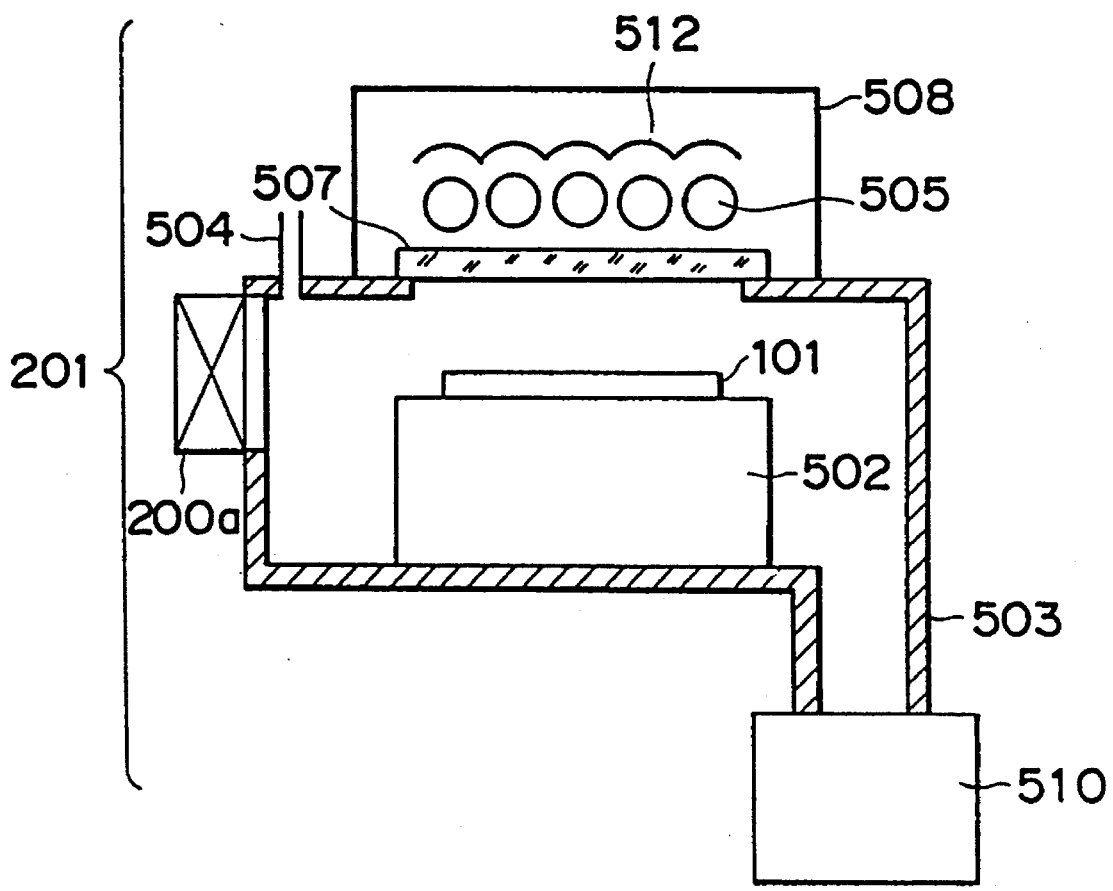
FIG. 5 is a schematic sectional view of a surface activating unit.

FIG. 5 is a schematic cross-sectional view of the surface activating unit 201. In FIG. 5, reference character 502 denotes a material holding base for holding the material to be processed 101; 503, a surface activating chamber which can be put under a vacuum; 504, a gas inlet for introducing a reactive gas for forming the activated layer 103 on the surface of the material 101 in the first step; 505, a low-pressure mercury lamp which is a light source; 507, a light incident window which transmits the lamp light therethrough and which can hermetically seal the surface activating chamber 503 in a vacuum; 508, a light blocking box for preventing leakage of light; 512, a reflecting mirror for effectively illuminating the lamp light to the material to be processed 101; and 510, a vacuum-evacuating apparatus which can vacuum-evacuate the surface activating chamber 503 and whose evacuation rate can be controlled. The other parts designated by the same reference characters as those used in FIGS. 1 and 2 are parts which are the same as those shown in FIGS. 1 and 2.

Figure 6:
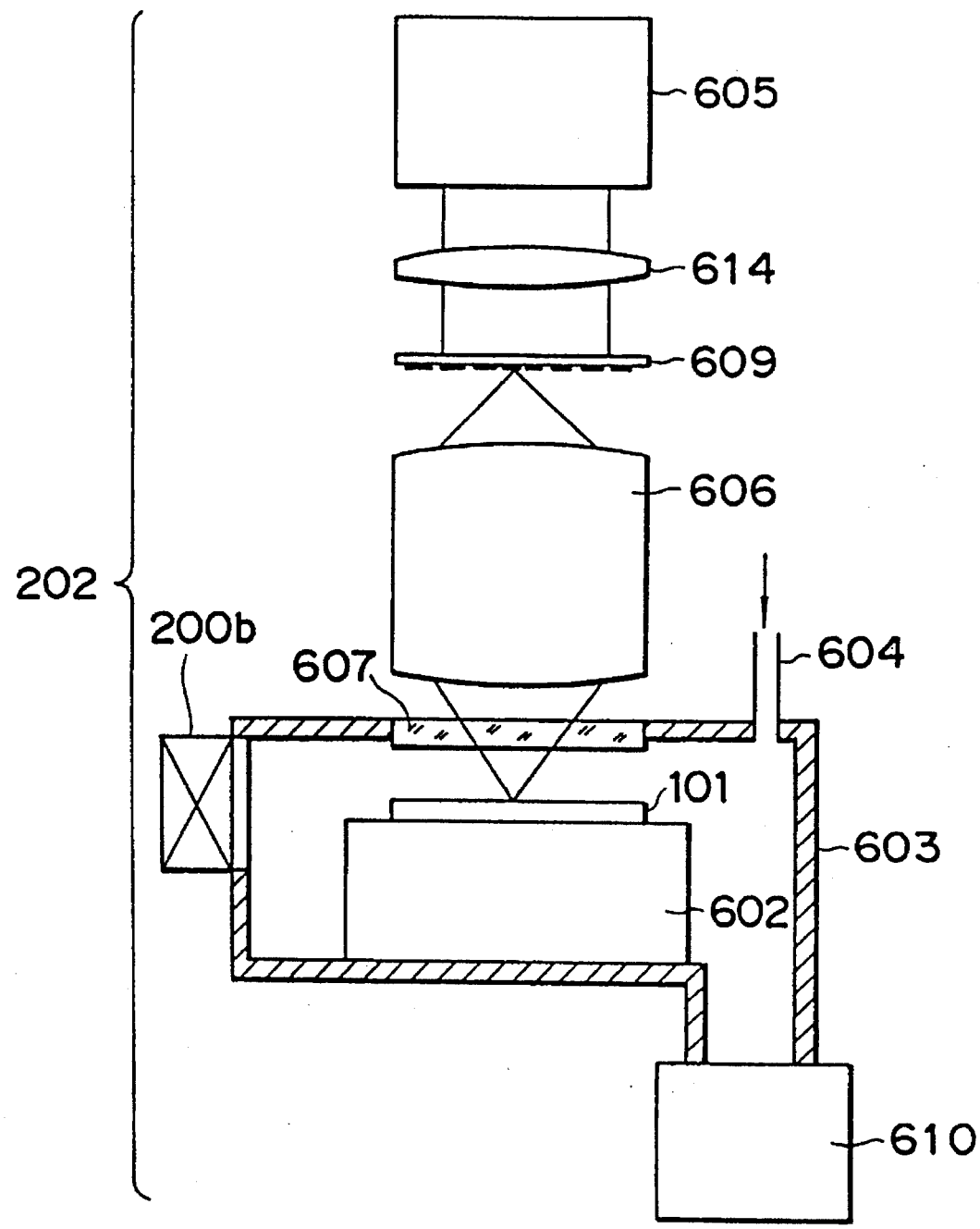
FIG. 6 is a schematic sectional view of a latent image forming unit.

FIG. 6 is a schematic cross-sectional view of the latent image unit 202. In FIG. 6, reference character 602 denotes a material holding base; 603, a latent image chamber which can be put in a vacuum; 604, a gas inlet for introducing a reactive gas required to perform the second step, i.e., to form the latent image layer 105; 605, a light source serving as an energy beam generating source, which is a KrF excimer laser in this embodiment; 614, an illumination optical system for illuminating a mask 609 having a desired pattern with the light of the excimer laser; 606, a projection optical system for forming a mask image onto the surface of the material 101 to be processed; 607, a light incident window which transmits the light of the excimer laser therethrough, which can hermetically seal the latent image chamber in a vacuum and which is made of fused quartz in this embodiment; and 610, a vacuum-evacuating apparatus which can vacuum-evacuate the latent image chamber 603 and whose evacuation rate can be controlled. The other parts designated by the same reference characters as those used in FIGS. 1 and 2 are parts which are the same as those shown in FIGS. 1 and 2.

Figure 7:
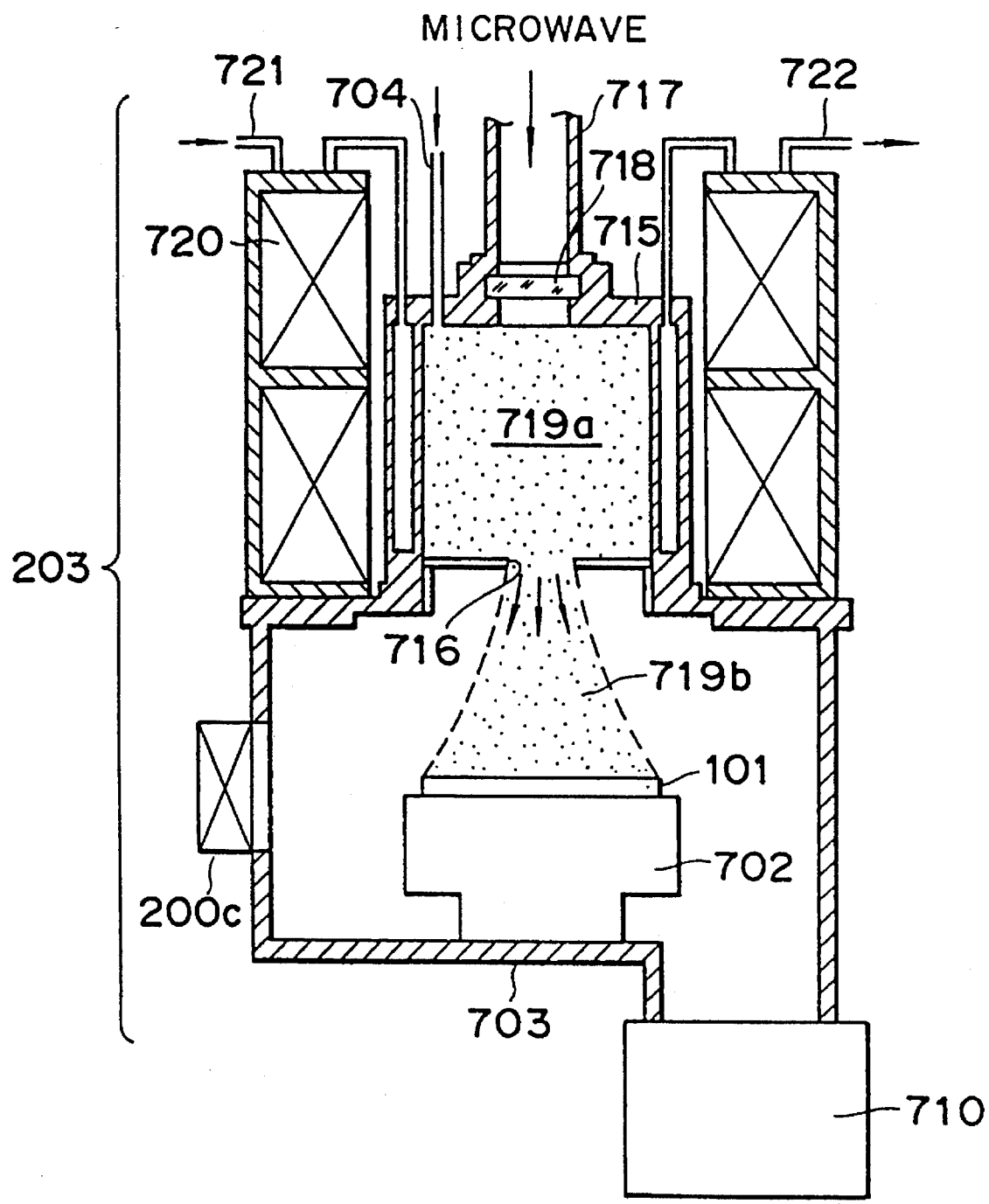
FIG. 7 is a schematic sectional view of an etching unit.

FIG. 7 is a schematic cross-sectional view of the etching unit 203. In FIG. 7, reference character 702 denotes a material holding base; 703, an etching chamber which can be put in a vacuum; 704, a gas inlet through which processing gases required in the third and fourth steps, i.e., a removing gas and an etching gas, are introduced; 715, a plasma chamber; 716, a plasma emitting port through which a plasma is emitted from the plasma chamber 715 into the etching chamber 703; 717, a wave guide for transmitting the microwave (2.45 GHz) generated by a microwave oscillator (a magnetron, not shown) without leakage; 718, a microwave transmitting window which can transmit the microwave therethrough and which can seal the plasma chamber in a vacuum; 719a, a plasma generated by the microwave energy; 719b, a plasma stream which is part of the plasma 719a taken out through the plasma emitting port 716 and illuminated on the material 101 to be processed; 720, an electromagnetic coil for generating a magnetic field in the plasma chamber; 721, a cooling water inlet through which a cooling water used to cool the electromagnetic coil 720 and the plasma chamber 715 is introduced; 722, a cooling water outlet; and 710, a vacuum-evacuating apparatus which can vacuum-evacuate the etching chamber 703 and the plasma chamber 715 and whose evacuation rate can be controlled. The other parts designated by the same reference characters as those used in FIGS. 1 and 2 are parts which are the same as those shown in FIGS. 1 and 2.

The fine processing method according to the present invention will be described below. The method is performed according to the step flow shown in FIG. 1 using the fine processing apparatus having the aforementioned structure.

First, the substrate 100 or the material 101 to be processed with the layer 102 to be processed deposited on the substrate 100 which may be a quartz substrate or a Si substrate, shown in FIG. 1A, is introduced into the load lock chamber 303 opened to the atmosphere, shown in FIG. 3, through the gate valve 200e, and is placed on the material holding base 302. The gate valve 200e is closed, and the load lock chamber 303 is vacuum-evacuated to $10^{-6}$ torr or less by the vacuum-evacuating apparatus 310.

The conveying chamber 403 shown in FIG. 4 is kept under a vacuum of $10^{-6}$ torr or less by the vacuum-evacuating apparatus 410. The gate valve 200d is opened, and the material 101 to be processed on the material holding base 302 in the load lock chamber 303 is carried into the conveying chamber 403 by the conveying robot 411. Thereafter, the gate valve 200d is closed.

The first step will now be described with reference to FIG. 5.

First, the interior of the surface activating chamber 503 is vacuum-evacuated to $10^{-7}$ torr or less by the vacuum-evacuating apparatus 510. Next, the gate valve 200a is opened, and the material 101 is conveyed into the surface activating chamber 503 and placed on the material holding base 502 by the robot 411. The gate valve 200a is closed.

Thereafter, the interior of the surface activating chamber 503 is vacuum-evacuated to $10^{-7}$ torr or less by the vacuum-evacuating apparatus 510.

Subsequently, a first reactive gas (a surface activating gas) is introduced into the surface activating chamber 503 from the gas inlet 504, and the evacuation rate of the vacuum-evacuating apparatus 510 is controlled such that the inner pressure of the activating chamber is between 0.1 torr and 760 torr.

The low-pressure mercury lamp 505 is turned on, and the surface of the material 101 is thereby irradiated with UV radiation 104. The surface irradiated with the UV radiations photochemically reacts with the surface activating gas (the first reactive gas) to change to a compound containing the constituent of the layer 102 to be processed, thereby forming the activated layer 103 (see FIG. 1B).

The low-pressure mercury lamp is used as the light source 505 in this embodiment. However, any light source which can irradiate light of a wavelength that induces photochemical reaction on the surface of the material 101 can be used.

Such a light source may be a lamp light source, such as a xenon lamp or a high-pressure mercury lamp, or a laser light source, such as a KrF excimer laser, an ArF excimer laser, a XeCl excimer laser or an Ar laser.

The window made of fused quartz is used because it does not absorb the light of the low-pressure mercury lamp but phases it therethrough. However, any other substance can be used as the material of the window so long as it passes through the light emitted from the light source 505 and can withstand the pressure difference between the inside and outside of the surface activating chamber 503. It includes $CaF_2$, $MgF_2$, $LiF_2$, sapphire glass, etc.

To accelerate the photochemical reaction, the material to be processed may be heated while it is being irradiated with light. In that case, a heater or infrared lamp incorporated in the material holding base may be used as the heating means. However, any other heating means which can keep a desired temperature may also be used.

After the activated layer 103 has been formed in a desired thickness, supply of the gas is stopped, and the surface activating chamber 503 is vacuum-evacuated to $10^{-7}$ torr or less. The gate valve 200a is opened, and the material 101 to be processed is taken out by the robot 411. The gate valve 200a is closed, and the material 101 is conveyed into the conveying chamber 403.

The second step will now be described in detail with reference to FIG. 6.

The latent image chamber 603 is vacuum-evacuated to $10^{-7}$ torr or less by the vacuum-evacuating apparatus 610 beforehand. The gate valve 200b is opened, and the material 101 is introduced into the latent image chamber 603 and placed on the material holding base 602 by the conveying robot 411. The gate valve 200b is closed.

Next, the latent image chamber 603 is vacuum-evacuated to $10^{-7}$ torr or less by the vacuum-evacuating apparatus 610.

Thereafter, a second reactive gas (a latent image forming gas) is introduced into the latent image chamber 603 from the gas inlet 604, and the evacuation rate of the vacuum-evacuating apparatus 610 is controlled such that the inner pressure of the chamber is between 0.1 torr and 760 torr.

Next, a laser beam having a wavelength of 248 nm generated by the KrF excimer laser 605 is uniformly illuminated on the mask 609 having a desired pattern as the selectively irradiated energy 106 by the illumination optical system 614, and the patterned image of the mask 609 is formed on the material 101 through the light incident window 607 by the projection optical system 606. On the surface of the activated layer 103 on the layer 102 to be processed on which the mask image is formed, the latent image forming gas and the activated layer irradiated with the light photochemically react with each other, by which the latent image layer 105 (see FIG. 1C) is formed.

After the latent image layer 105 having a desired thickness is formed, supply of the gas is stopped, and the latent image chamber 603 is vacuum-evacuated to $10^{-7}$ torr or less. Thereafter, the gate valve 200b is opened, and the material 101 to be processed is taken out by the robot 411. The gate valve 200b is closed, and the material 101 to be processed is carried into the conveying chamber 403.

In this embodiment, the KrF excimer laser is used as the light source 605. However, any light source which can irradiate light of a wavelength that induces photochemical reaction on the surface of the material 101 can be used. Such a light source may be a lamp light source, such as a xenon lamp or a high-pressure mercury lamp, or a laser light source, such as an ArF excimer laser, a XeCl excimer laser or an Ar laser.

The light incident window made of fused quartz is used because it does not absorb the light of the wavelength of 248 nm but passes it therethrough. However, any other substance can be used as the material of the window so long as it passes through the light emitted from the light source 605 and can withstand the pressure difference between the inside and outside of the surface latent image chamber 603. It includes $CaF_2$, $MgF_2$, $LiF_2$, sapphire glass, etc.

The third step will be described below with reference to FIG. 7.

The etching chamber 703 and the plasma chamber are vacuum-evacuated to $10^{-7}$ torr or less beforehand by the vacuum evacuation apparatus 710.

The gate valve 200c is opened, and the material 101 to be processed is moved into the etching chamber 703 by the robot 411 and is placed on the material holding base 702. The gate valve 200c is closed.

Next, the etching chamber 703 and the plasma chamber 715 are vacuum-evacuated to $10^{-7}$ torr or less by the vacuum-evacuation apparatus 710. The removing gas is introduced into the plasma chamber 715 from the gas inlet 704, and the evacuation rate of the vacuum evacuation apparatus 710 is controlled such that the inner pressure of the plasma chamber is between $2 \times 10^{-4}$ torr and $1 \times 10^{-2}$ torr.

To cool the electromagnetic coil 720 and the plasma chamber 715, a cooling water is introduced from the cooling water inlet 721 and is drained from the outlet 722.

A d.c. current is supplied to the electromagnetic coil 720 to generate a magnetic field within the plasma chamber 715. A microwave of 2.45 GHz oscillated by the microwave oscillator (not shown) is propagated using the wave guide 717 and is supplied into the plasma chamber 715 through the microwave transmitting window 718. In the plasma chamber 715, electrons are effectively accelerated by the electric field of the microwave and the magnetic field, and the neutral molecules of the removing gas are thereby ionized to generate the plasma 719a. Generation of the plasma is effectively performed by setting the magnitude of the magnetic field to that in which electron cyclotron resonance takes place (which is 875 Gauss in the case of the microwave of 2.45 GHz).

A part of the plasma 719a generated in the plasma chamber 715 enters the etching chamber 703 from the plasma emitting port 716. That plasma 719a is accelerated in the direction of the line of magnetic force by the diffused magnetic field, and reaches the surface of the material 101 to be processed in a plasma stream 719b. On the surface of the material 101 to be processed, the portion of the activated layer 103 other than the latent image layer 105 is removed by the ions and radicals in the plasma stream 719b (see FIG. 1D. In FIG. 1, reference character 107a denotes this plasma stream 719b).

In the third step, wet removal may be performed on the material 101 to be processed which is taken out of the apparatus using a removing solution.

In the third step, the latent image layer 105 may be removed in place of the portion of the activated layer 103 other than the latent image layer 105.

After the activated layer 103 is completely removed, supply of the gas is stopped, and the etching chamber 703 and the plasma chamber 715 are vacuum-evacuated to $10^{-7}$ torr or less.

Next, the fourth step will be described with reference to FIG. 7. First, the etching gas is introduced into the plasma chamber 715 from the gas inlet 704, and the evacuation rate of the vacuum-evacuation apparatus 710 is controlled such that the inner pressure of the plasma chamber 715 is between $2\times10^{-4}$ torr and $1\times10^{-2}$ torr.

Thereafter, the plasma 719a is generated in the same manner as that in the third step, and the plasma stream 719b which enters the etching chamber from the plasma chamber 715 is irradiated on the material 101 to be processed to etch the layer 102 to be processed using the latent image layer 105 as the mask by the ions and radicals in the plasma stream and thereby form a desired pattern (see FIG. 1E. In FIG. 1, reference character 107b denotes this plasma stream 719b).

At that time, the latent image layer 105 is also etched slightly. Therefore, the thickness of the latent image layer 105 is determined such that the latent image layer 105 is etched at the time that etching of the layer 102 to be processed is completed. Alternatively, the latent image layer 105 is removed by introducing the latent image layer etching gas and then by performing the fourth step again.

In this etching method, since the gas pressure is low, ions reach the surface of the material 101 to be processed without colliding against the other particles in the ion sheath region, thus ensuring excellently anisotropic etching. The ion energy is at most several tens of eV, and less damaged etching is provided.

In the case where the activated layer 103 is left in the third step, the fine processing can be conducted similarly by using the layer as the mask in the fourth step.

After etching, supply of the etching gases is stopped, and the etching chamber 703 and the plasma chamber 715 are vacuum-evacuated to $10^{-7}$ torr or less. Thereafter, the gate valve 200c is opened, and the material 101 is moved into the load lock chamber 303 by the robot 411. The gate valve 200c is closed, and nitrogen gas is introduced into the load lock chamber 303 from the gas inlet 304 to open it to the atmosphere. Thereafter, the processed material 101 is taken out, by which a desired fine processing is completed.

SECOND EMBODIMENT

Figure 8:
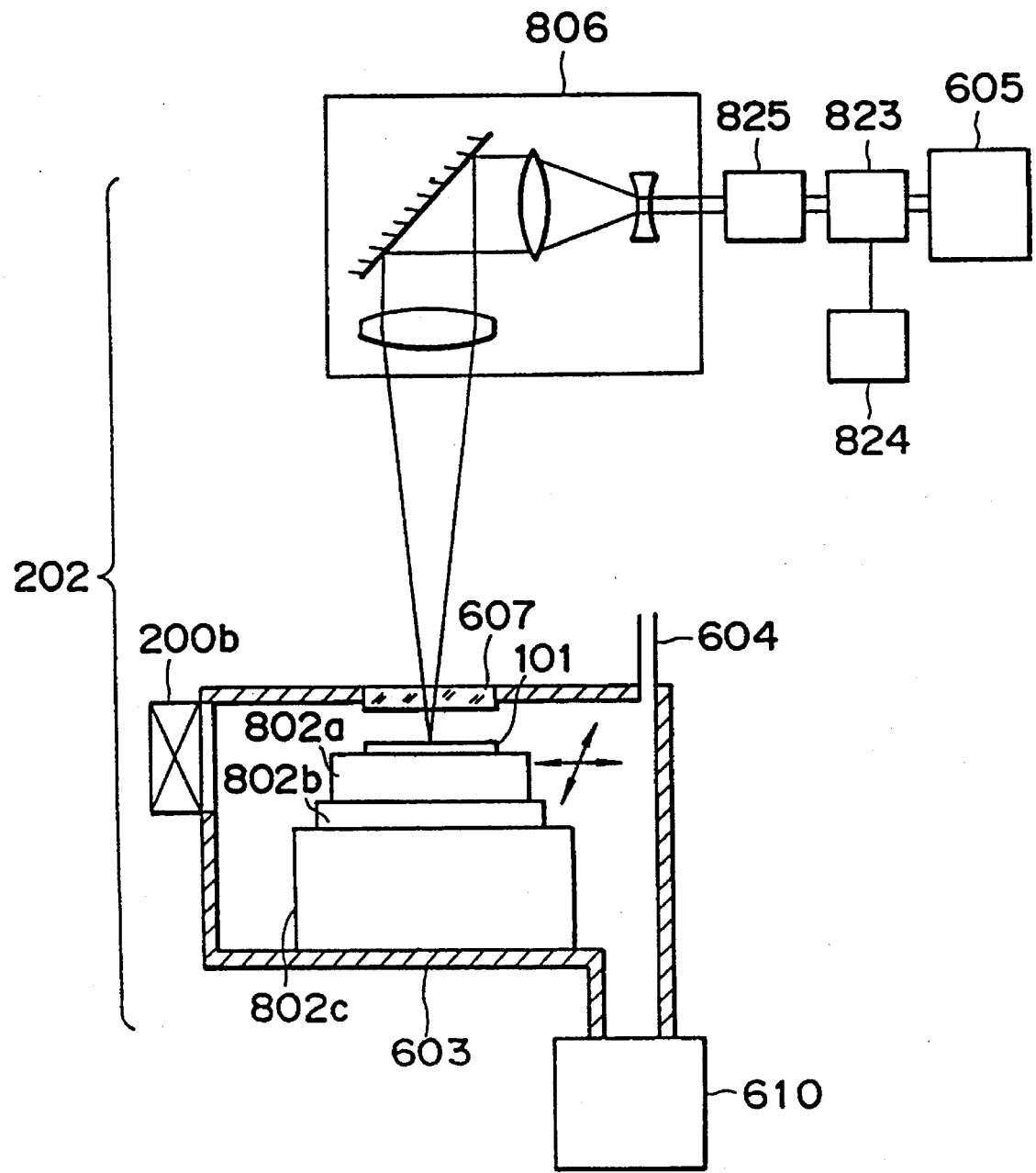
FIG. 8 is a schematic sectional view of a latent image forming unit not employing a mask.

In the above-described embodiment, selective light irradiation is performed using a mask in the second step. However, it can be performed without using the mask by using a light beam scanning device shown in FIG. 8. In FIG. 8, reference character 802a denotes a material holding base placed on a two-dimensionally movable stage 802b; 802c, a drive device controlled by a computer (not shown) for two-dimensionally moving the stage 802b; 806, a projection optical system; 823, a shutter; 824, a shutter controlling device for controlling the shutter 823; and 825, a beam shaping device for eliminating coherence of the laser light to provide a uniform laser beam. The other parts designated by the same reference characters as those used in FIGS. 1, 2 and 6 are parts which are the same as those shown in FIGS. 1, 2 and 6.

The method of forming the latent image layer 105 using the latent image unit 202 arranged in the manner described above will now be described.

The first step is performed in the same manner as that of the first embodiment.

The latent image chamber 603 is vacuum-evacuated to $10^{-7}$ torr or less beforehand by the vacuum-evacuation apparatus 610 shown in FIG. 8. The gate valve 200b is opened, and the material 101 to be processed is carried into the latent image chamber 603 and placed on the material holding base 802a by the robot 411. The gate valve 200b is closed.

The latent image chamber 603 is vacuum-evacuated to $10^{-7}$ torr or less by the vacuum-evacuation apparatus 610.

Thereafter, the latent image forming gas is introduced into the latent image chamber 603 from the gas inlet 604, and the evacuation rate of the vacuum evacuation apparatus 610 is controlled such that the inner pressure of the latent image chamber 603 is a predetermined pressure between 0.1 torr and 760 torr.

A laser beam generated by the KrF excimer laser 605 enters the shutter 823 controlled by the shutter control device 824 and the intensity thereof is thereby limited. Thereafter, the beam shaping device 825 eliminates coherence of the laser beam and thereby makes the beam spatially uniform. The resultant laser beam is irradiated on the surface of the material 101 in a desired spot through the light transmitting window 607 by the projection optical system 806.

When light is irradiated, the surface of the material 101 photochemically reacts with the latent image forming gas, by which the latent image layer 105 is formed. When the laser beam is blocked by the shutter 823, photochemical reaction does not take place on the surface and the latent image layer 105 is thus not formed. The laser beam can be irradiated on the entire surface of the material 101 by two-dimensionally moving the stage 802b with the material holding base 802a thereon by use of the driving device 802c. The latent image layer 105 having a desired pattern can be formed without using the mask by synchronously controlling the irradiated position and the opening/closing of the shutter 823.

In this embodiment, the irradiated position is controlled by moving the material holding base. However, it may also be controlled by scanning the laser beam using a scanning optical system. The subsequent steps are performed in the same manner as that of the first embodiment.

THIRD EMBODIMENT

Figure 9:
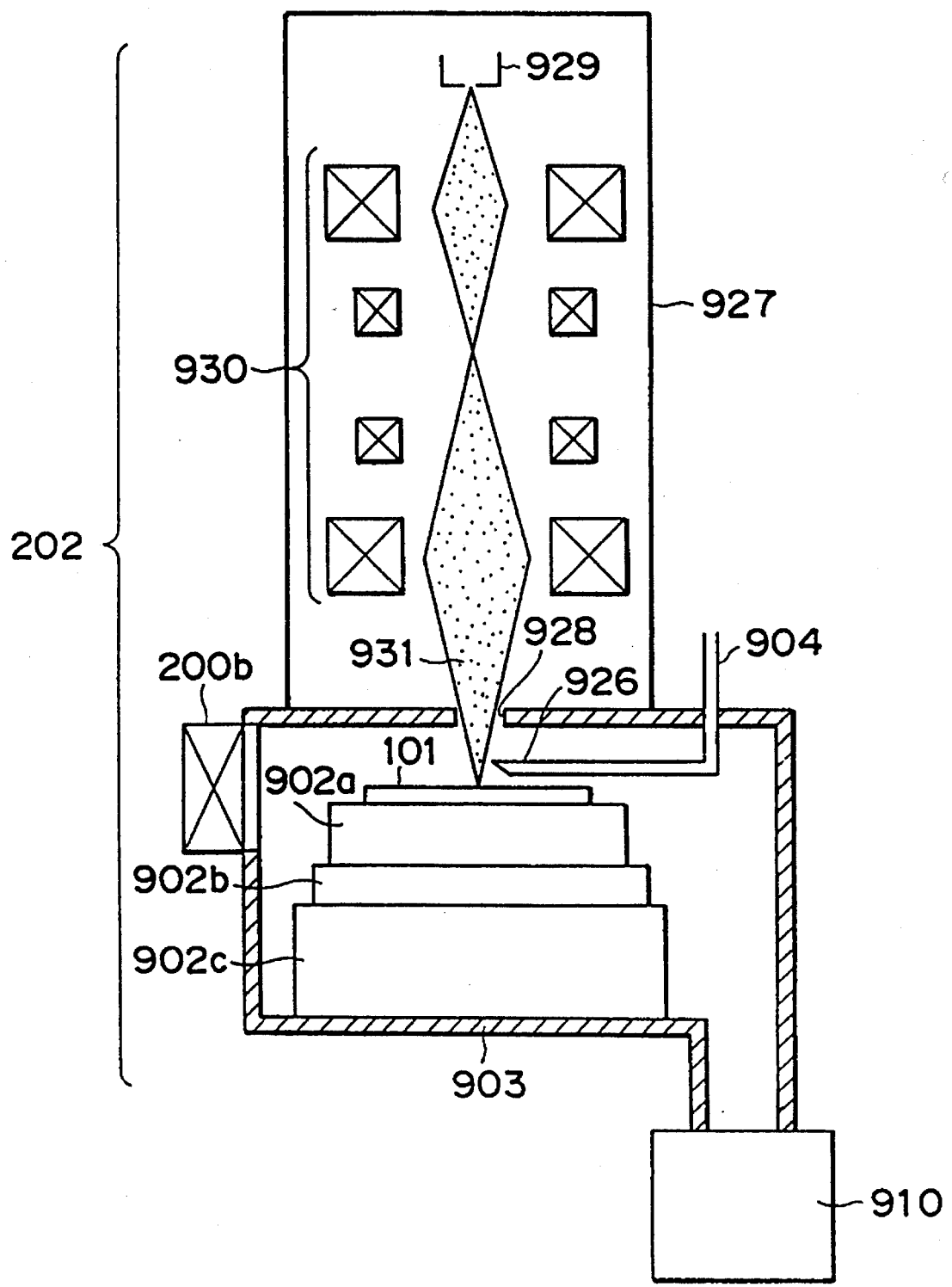
FIG. 9 is a schematic sectional view of a latent image forming unit using an electron beam.

In the above-described two embodiments, light is used as the energy beam which is irradiated on the material 101 to be processed in the second step. However, the second step can also be performed using an electron beam. FIG. 9 is a schematic cross-sectional view of the processing unit which employs an electron beam. In FIG. 9, reference character 902a denotes a material holding base placed on a two-dimensionally movable stage 902b; 902c, a drive device controlled by a computer (not shown) for two-dimensionally moving the stage 902b; 903, a latent image chamber; 904, a gas inlet; 926, a gas ejecting nozzle; 910, a vacuum-evacuating apparatus which can vacuum-evacuate the latent image chamber 903 and whose evacuation rate can be controlled; 928, an electron beam generating unit whose inside is kept in a vacuum of $1\times10^{-7}$ torr or less by an ion pump (not shown); 929, an electron gun; 930, an electron optical system; 931, an electric beam; and 928, an electron beam emitting opening. The other parts designated by the same reference characters as those used in FIGS. 1 and 2 are parts which are the same as those shown in FIGS. 1 and 2.

The method of forming the latent image layer 105 using the latent image unit 202 arranged in the manner described above will be described.

The first step is performed in the same manner as that of the first embodiment.

The latent image chamber 903 is vacuum-evacuated to $10^{-7}$ torr or less beforehand by the vacuum-evacuation apparatus 910. The gate valve 200b is opened, and the material 101 to be processed is carried into the latent image chamber 903 and placed on the material holding base 902a by the conveying robot 411. The gate valve 200b is closed. The latent image chamber 903 is vacuum-evacuated to $10^{-7}$ torr or less by the vacuum-evacuation apparatus 910.

Thereafter, the latent image forming gas introduced from the gas inlet 904 is ejected from the gas ejecting nozzle 926 toward the surface of the material 101 irradiated with the electron beam 931, and the evacuation rate of the vacuum evacuation apparatus 610 is controlled such that the inner pressure of the latent image chamber 903 is a predetermined pressure between $1\times10^{-4}$ torr and $5\times10^{-3}$ torr.

Next, the electron beam generating unit 927 is operated, that is, electrons are generated by the electron gun 929 and the generated electron beam 931 is accelerated and converged by the electron optical system 930, and the resultant electron beam is thereby irradiated on the surface of the material 101 placed in the latent image chamber 903 from the electron beam ejecting opening 928 in a desired spot size.

On the surface of the material 101 irradiated with the electron beam 931, the electron beam 931 is made incident on the activated layer 103, and the chemical reaction between the latent image forming gas and the activated layer 103 is accelerated by the lost energy, by which the latent image layer 105 is formed.

The electron beam 931 can be irradiated on the entire surface of the material 101 by two-dimensionally moving the stage 902b on which the material holding base 902a is placed by the driving device 902c. The latent image layer 105 having a desired pattern can be formed without using the mask by synchronously controlling the irradiated position and the opening/closing of the electron beam shutter (not shown) incorporated in the electron optical system 930.

In this embodiment, the irradiated position is controlled by moving the material holding base 902a. However, it may also be controlled by scanning the electron beam 931 using a scanning electron optical system.

The subsequent steps are performed in the same manner as that of the first embodiment.

FOURTH EMBODIMENTS

In the aforementioned third embodiment, an electron beam is used as the energy beam which is irradiated on the material 101 in the second step. However, an ion beam can be used in this embodiment.

Figure 10:
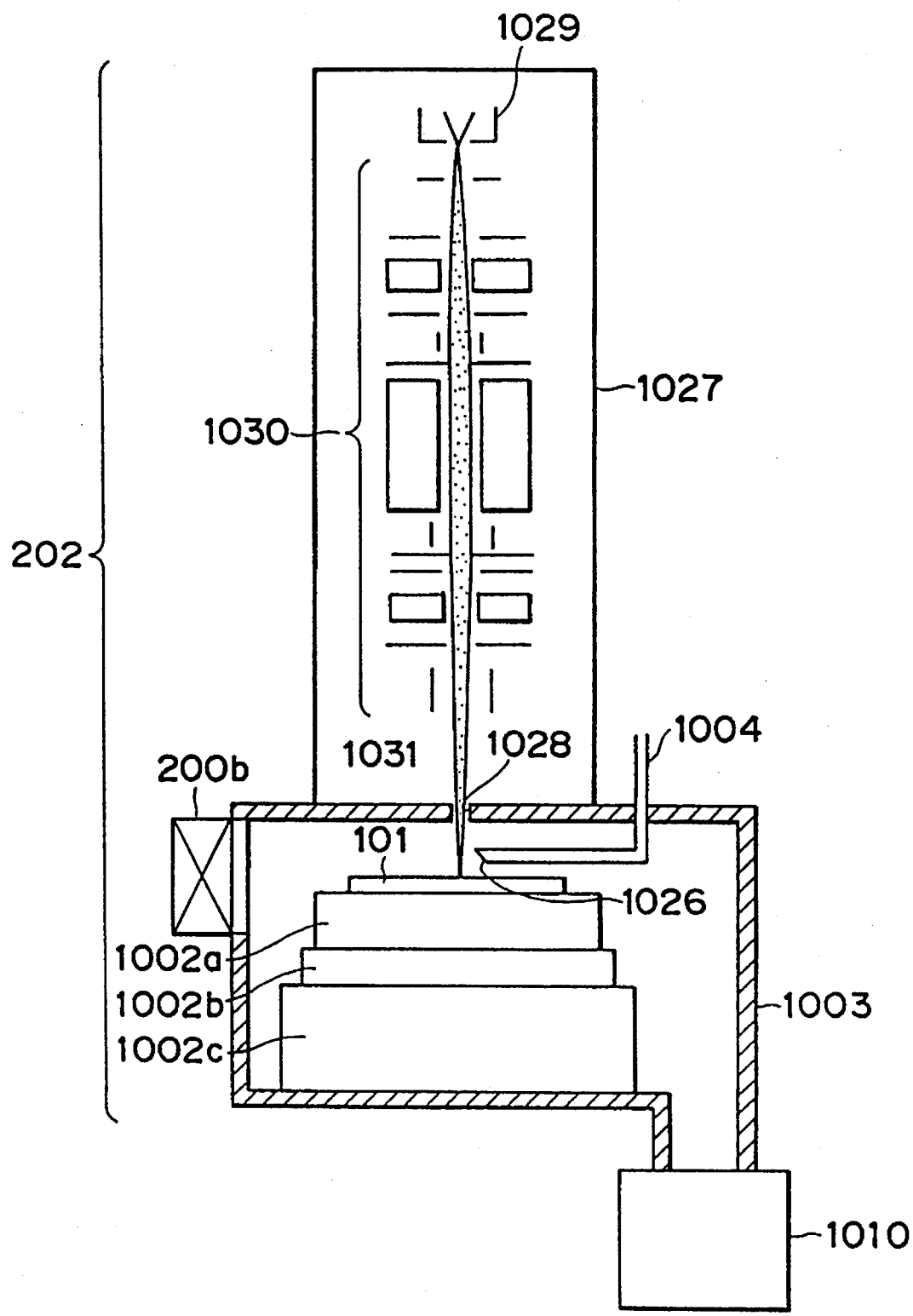
FIG. 10 is a schematic sectional view of a latent image forming unit using an ion beam.

FIG. 10 is a schematic cross-sectional view of the unit which employs an ion beam. In FIG. 10, reference character 1002a denotes a material holding base placed on a two-dimensionally movable stage 1002b; 1002c, a drive device controlled by a computer (not shown) for two-dimensionally moving the stage 1002b; 1003, a latent image chamber; 1004, a gas inlet; 1026, a gas ejecting nozzle; 1010, a vacuum-evacuating apparatus which can vacuum-evacuate the latent image chamber 1003 and whose evacuation rate can be controlled; 1027, an ion beam generating unit whose inside is kept in a vacuum of $1\times10^{-7}$ torr or less by an ion pump (not shown); 1029, an ion source; 1030, an ion optical system; 1031, an ion beam; and 1028, an ion beam emitting opening. The other parts designated by the same reference characters as those used in FIGS. 1 and 2 are parts which are the same as those shown in FIGS. 1 and 2.

The method of forming the latent image layer 105 using the latent image unit 202 arranged in the manner described above will be described.

The first step is performed in the same manner as that of the first embodiment.

The latent image chamber 1003 is vacuum-evacuated to $10^{-7}$ torr or less beforehand by the vacuum-evacuation apparatus 1010. The gate valve 200b is opened, and the material 101 to be processed is carried into the latent image chamber 1003 and placed on the material holding base 1002a by the conveying robot 411. The gate valve 200b is closed.

The latent image chamber 1003 is vacuum-evacuated to $10^{-7}$ torr or less by the vacuum-evacuation apparatus 1010. Thereafter, the latent image forming gas introduced from the gas inlet 1004 is ejected from the gas ejecting nozzle 1026 toward the surface of the material 101 irradiated with the ion beam 1031, and the evacuation rate of the vacuum evacuation apparatus 1010 is controlled such that the inner pressure of the latent image chamber 1003 is a predetermined pressure between $1\times10^{-4}$ torr and $5\times10^{-3}$ torr.

Next, the ion beam generating unit 1027 is operated, that is, ions are generated from the ion source 1029 and the generated ion beam 1031 is accelerated and converged by the ion optical system 1030, and the resultant ion beam is thereby irradiated on the surface of the material 101 placed in the latent image chamber 1003 from the ion beam ejecting opening 1028 in a desired spot size.

On the surface of the material 101 irradiated with the ion beam 1031, the electron beam 1031 is made incident on the activated layer 103, and the chemical reaction between the latent image forming gas and the activated layer 103 is accelerated by the lost energy, by which the latent image layer 105 is formed. The ion beam 1031 can be irradiated on the entire surface of the material 101 by two-dimensionally moving the stage 1002b on which the material holding base 1002a is placed by the driving device 1002c. The latent image layer 105 having a desired pattern can be formed without using the mask by synchronously controlling the irradiated position and the opening/closing of the ion beam shutter (not shown) incorporated in the ion optical system 1030.

In this embodiment, the irradiated position is controlled by moving the material holding base 1002a. However, it may also be controlled by scanning the ion beam 1031 using a scanning ion optical system.

The subsequent steps are performed in the same manner as that of the first embodiment.

FIFTH EMBODIMENTS

In the aforementioned third and fourth embodiments, plasma generated by the microwave energy is used in the third and fourth steps. Although the fine processing properties may not be very excellent, excitation species (chemically activated molecules, atoms, i.e., radicals) may also be used to perform the third and fourth steps without inducing damage at all.

Figure 11:
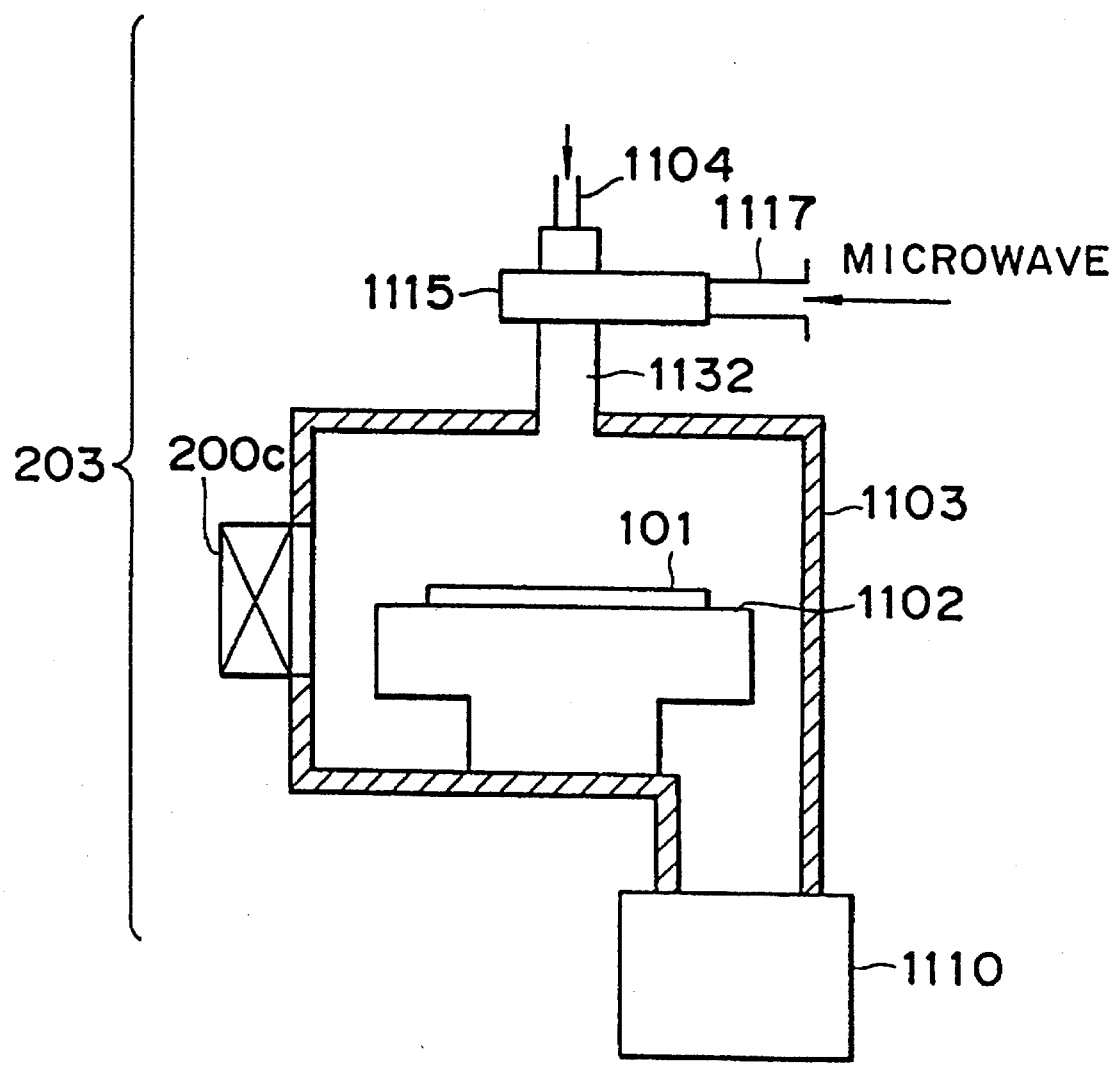
FIG. 11 is a schematic sectional view of an etching unit using an excited gas.
Figure 12:
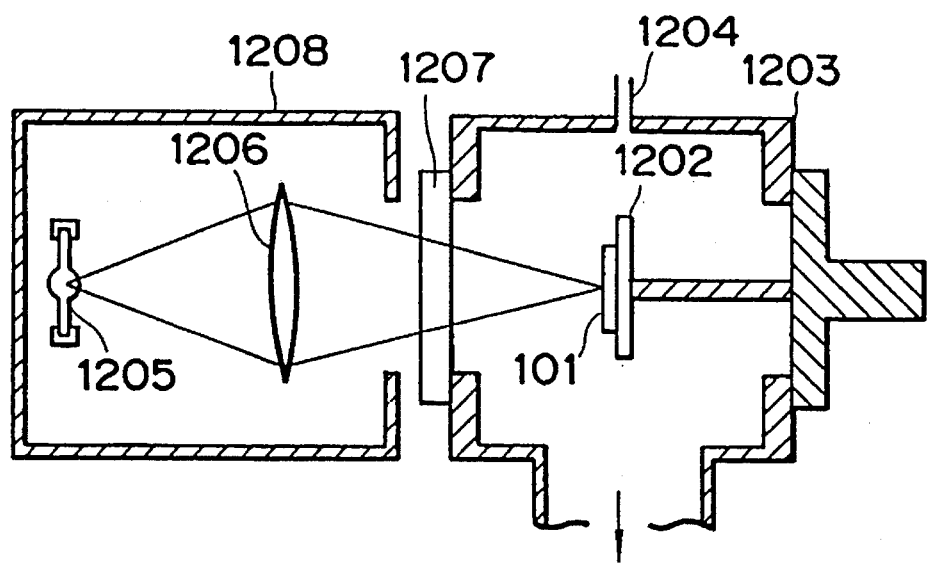
FIG. 12 schematically illustrates a photoetching apparatus.
Figure 13:
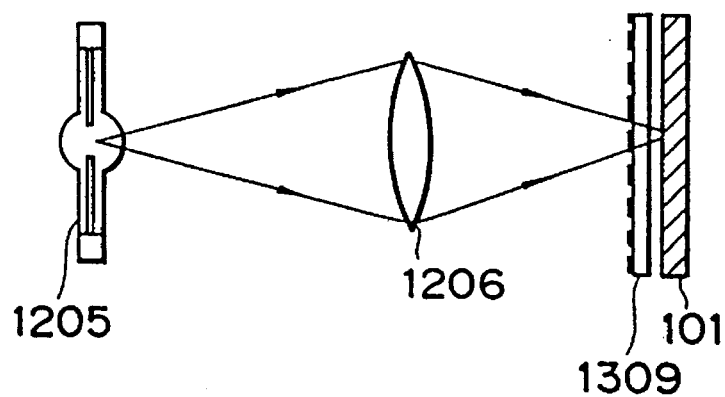
FIG. 13 schematically illustrates the photoetching apparatus when a mask is employed.

FIG. 11 is a schematic cross-sectional view of the etching unit 203 which performs the third and fourth steps using the excitation species. In FIG. 11, reference character 1102 denotes a material holding base; 1103, an etching chamber which can be put in a vacuum; 1104, a gas inlet; 1115, a microwave plasma exciting device; 1117, a wave guide; 1132, and a transport pipe through which the excitation species generated by the microwave plasma exciting device 1115 is transported to the etching chamber 1103. The other parts designated by the same reference characters as those used in FIGS. 1, 2 and 7 are parts which are the same as those shown in FIGS. 1, 2 and 7.

Now the third and fourth steps are performed using the etching unit 203 will be described below.

First, the third step will be described. After the first and second steps have been performed in the manner described in the detailed description of the preferred embodiments, the etching chamber 1103 is vacuum-evacuated to $10^{-7}$ torr or less by the vacuum-evacuation apparatus 1110. A removing gas is introduced into the microwave plasma exciting device 1115 from the gas inlet 1104, and the evacuation rate of the vacuum-evacuation apparatus 1110 is controlled such that the inner pressure of the etching chamber 1103 is set at a predetermined value between 0.01 torr and 1 torr.

A microwave of 2.45 GHz oscillated by a microwave oscillator (not shown) is transferred using the microwave guide 1117, and is supplied to the microwave plasma exciting device 1115 and then generate a plasma in the exciting device 1115. The resulting gas components other than the charged particles, particularly, the radicals are introduced into the etching chamber 1103 through the transport pipe 1132, and are diffused onto the surface of the material 101. The surface of the material 101 reacts with the radicals, by which the activated layer 103 is removed with only the latent image layer 105 being left (see FIG. 1D. In this embodiment, reference character 107a in FIG. 1 denotes the radicals).

After removal, supply of the gas is stopped, and the etching chamber 1103 is vacuum-evacuated to $10^{-7}$ torr or less.

In the fourth step, the etching gas introduced into the microwave plasma exciting device 1115 from the gas inlet 1104, and the evacuation rate of the vacuum-evacuation apparatus 1110 is controlled such that the inner pressure of the etching chamber 1103 is a predetermined value between 0.01 torr and 1 torr.

Thereafter, radicals are generated by the microwave plasma exciting device 1115 in the same manner as that of the third step, and the generated radicals are diffused onto the surface of the material 101 placed in the etching chamber 1103, by which the layer 102 is chemically etched in a desired pattern using the latent image layer 105 as the mask.

Since the etching conducted in this embodiment is chemical etching, etching progresses in an isotropic fashion. That is, a finely processed pattern having no damage can be obtained although fine processing properties may not be very excellent. Therefore, the above-described etching is suitable for the manufacturing process of devices which require a less damaged fine pattern but do not require processing properties.

SIXTH EMBODIMENT

In this sixth embodiment, fine processing is performed in the same manner as that of the first embodiment with the exception that thermochemical reaction of first reactive gas is utilized to form the activated layer on the surface of the material to be processed in the first step. Thus, the step flow of this fine processing method is the same as that shown in FIG. 1. Since units of the apparatus used in this embodiment which are the same as those of the first embodiment are used, description thereof is omitted.

Figure 15:
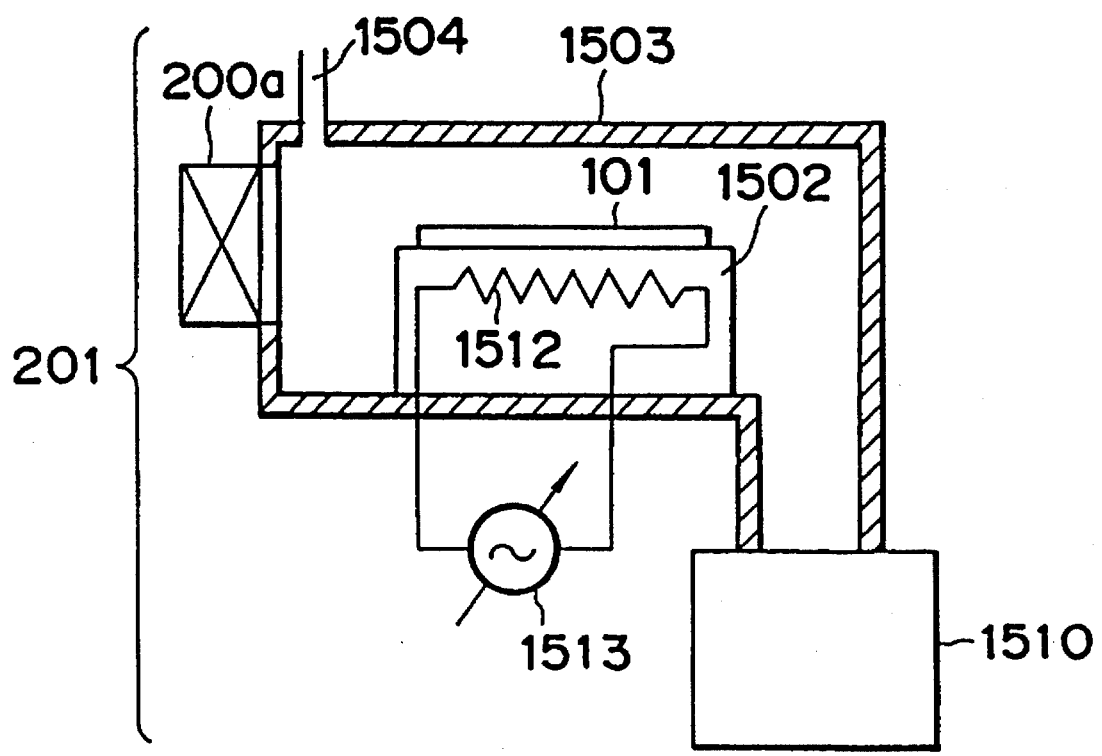
FIGS. 15 and 16 are schematic sectional views of surface activating units according to different embodiments of the present invention.

In this embodiment, since the first step is different from that of the first embodiment, the surface activating unit 201 has a different structure from that of the first embodiment. FIG. 15 shows the surface activating unit 201 of this embodiment.

FIG. 15 is a schematic cross-sectional view of the surface activating unit 201. In FIG. 15, reference numeral 1502 denotes a material holding base having a heater 1512 for heating the material 101 to be processed incorporated therein; 1503, a surface activating chamber which can be put in a vacuum; 1504, a gas inlet through which a reactive gas required to perform the first step, i.e., to form the activated layer 103, is introduced; 1510, a vacuum-evacuating apparatus which can vacuum-evacuate the surface activating chamber 1503 and whose evacuation rate can be controlled; and 1513, an a.c. power source whose voltage for supplying power to the heater 1512 can be controlled. The other parts designated by the same reference characters as those used in the aforementioned embodiment are parts which are the same as those shown in the aforementioned embodiment.

In this embodiment, the surface activating chamber 1503 is vacuum-evacuated to $10^{-7}$ torr or less by the vacuum-evacuation apparatus 1510. Next, the gate valve 200a is opened, and the material 101 to be processed is carried by the conveying robot 411 into the surface activating chamber 1503 and placed on the material holding base 1502 heated to a predetermined temperature between 100° C. and 800° C. by the heater 1512. The gate valve 200a is closed. The a.c. power source 1513 supplies power to the heater 1512 and the applied voltage is adjusted to the predetermined temperature range.

The surface activating chamber 1503 is vacuum-evacuated to $10^{-7}$ torr or less by the vacuum-evacuation apparatus 1510, and the temperature of the material 101 to be processed is increased until a predetermined temperature is obtained.

Next, the first reactive gas (the surface activating gas) is introduced into the activating chamber 1503 from the gas inlet 1504, and the evacuation rate of the vacuum evacuation apparatus 1510 is controlled such that the inner pressure of the surface activating chamber 1503 is set at a predetermined pressure between 0.1 torr and 760 torr. In this state, the surface of the material 101 to be processed thermochemically reacts with the activating gas and thereby changes into a compound containing the constituent of the layer 102 to be processed, by which the activated layer 103 (see FIG. 1B) is formed.

In this embodiment, the heater is used as the heating means. However, any other means, such as an infrared lamp, can also be used as long as it can heat the material to a desired temperature.

After the activated layer 103 is formed in a desired thickness, supply of the gas is stopped, and the surface activating chamber 1503 is vacuum-evacuated to $10^{-7}$ torr or less. The gate valve 200a is opened, and the material 101 to be processed is taken out by the robot 411. The gate valve 200a is closed, and the material 101 is carried into the conveying chamber 403.

The subsequent steps are performed in the same manner as that of the first embodiment.

It is to be noted that the modifications described in the second through fifth embodiments are applicable in this embodiment.

SEVENTH EMBODIMENT

In this seventh embodiment, fine processing is performed in the same manner as that of the first and sixth embodiments with the exception that plasma chemical reaction between the material to be processed and the first reactive gas is utilized to form the activated layer on the surface of the material to be processed in the first step. Thus, the step flow of this fine processing method is the same as that shown in FIG. 1. The same apparatus as that of the first embodiment is used except for the first step. Therefore, only the different unit will be described below and the other units are omitted.

Figure 16:
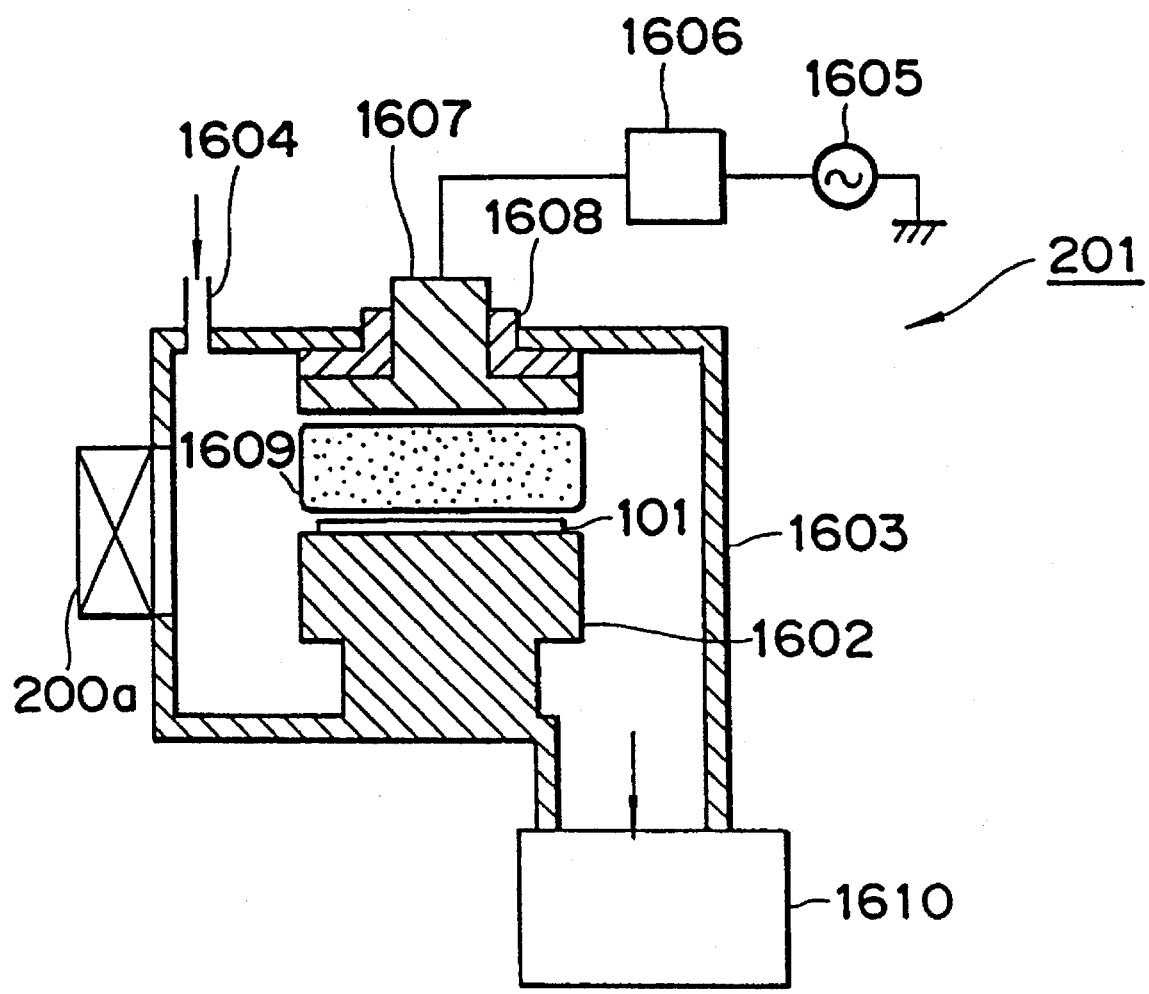

Since the first step in this embodiment is modified, the surface activating unit 201 has a different structure from that of the first and sixth embodiments. FIG. 16 is a schematic cross-sectional view of the surface activating unit 201 of this embodiment.

In FIG. 16, reference numeral 1602 denotes a material holding base; 1603, a surface activating chamber which can be put in a vacuum; 1604, a gas inlet through which a reactive gas required to perform the first step, i.e., to form the activated layer 103, is introduced; 1605, a high-frequency power source for generating high-frequency power which is an electromagnetic energy; 1606, a matching box for matching an impedance between the high-frequency power source 1605 and the load; 1607, a counter electrode used to apply a high-frequency electric field in a space between the counter electrode and the material holding base 1602; 1608, an insulator for electrically insulating the counter electrode; 1609, a plasma of the reactive gas generated by the high-frequency electric field; and 1610, a vacuum-evacuating apparatus which can vacuum-evacuate the surface activating chamber 1603 and whose evacuation rate can be controlled. The other parts designated by the same reference characters as those used in the aforementioned embodiment are parts which are the same as those shown in the aforementioned embodiment.

The first step conducted in this embodiment will be described below. First, the surface activating chamber 1603 is vacuum-evacuated to $10^{-7}$ torr or less by the vacuum-evacuation apparatus 1610. Next, the gate valve 200a is opened, and the material 101 to be processed is carried by the conveying robot 411 into the surface activating chamber 1603 and placed on the material holding base 1602. The gate valve 200a is closed. The surface activating chamber 1603 is vacuum-evacuated to $10^{-7}$ torr or less by the vacuum-evacuation apparatus 1610. The surface activating gas is introduced into the activating chamber 1603 from the gas inlet 1604, and the evacuation rate of the vacuum evacuation apparatus 1610 is controlled such that the inner pressure of the surface activating chamber 1603 is set at a predetermined pressure between 0.05 torr and 2 torr. Thereafter, a 50 to 1000 W high-frequency power generated by the high-frequency power source 1605 is supplied to the counter electrode 1607 to generate a plasma 1609 while impedance matching is performed by the matching box 1606. The surface of the material 101 to be processed by being exposed to the plasma chemically reacts with the reactive ions or neutral radicals present in the plasma and has an energy and thereby changes into a compound containing the constituent of the layer 102 to be processed, by which the activated layer 103 (see FIG. 1B) is formed.

A high-frequency power source 1605 of 13.56 MGz is used in this embodiment. However, there is no limitation to the frequency of the high-frequency power source. Any means for generating a plasma, such as means for generating a microwave of d.c. power or 2.45 GHz can also be used.

In this embodiment, the material may be heated in order to accelerate the reaction which takes place on the surface of the material to be processed. Any means for heating the material to a desired temperature, such as a heater or infrared lamp incorporated in the material holding base, can be used as the heating means.

After the activated layer 103 is formed in a desired thickness, supply of the gas is stopped, and the surface activating chamber 1603 is vacuum-evacuated to $10^{-7}$ torr or less. The gate valve 200a is opened, and the material 101 to be processed is taken out by the conveying robot 411. The gate valve 200a is closed, and the material 101 is carried into the conveying chamber 403.

The subsequent steps are performed in the same manner as that of the first embodiment.

It is to be noted that the modifications described in the second through fifth embodiments are applicable in this embodiment.

In the aforementioned embodiments, hydrogen sulfide ($H_2S$) may be used as the first reactive gas, i.e., the surface activating gas, so that a sulfide such as a silicon sulfide compound ($SiS_x$) can be formed as the activated layer. Alternatively, an iodide such as silicon iodide compound ($SiI_x$) may be formed as a the activated layer by using hydrogen iodide (HI).

Oxygen or a mixture of oxygen, hydrogen, etc. may be used as the second reactive gas, i.e., the latent image forming gas.

EIGHTH EMBODIMENT

Figure 17A:
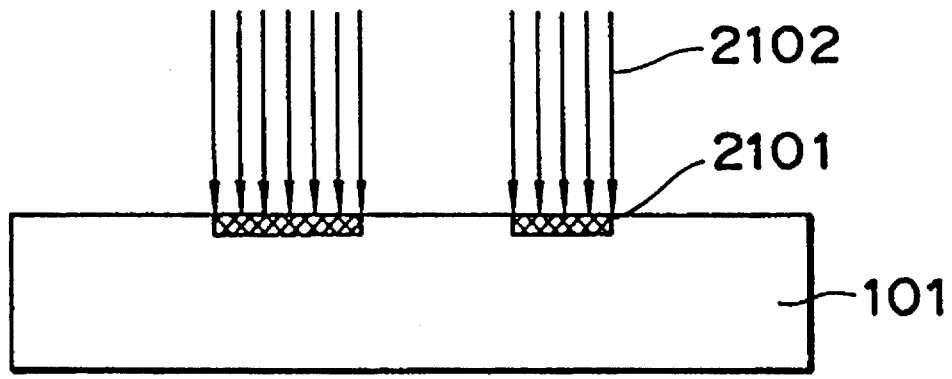
FIGS. 17A and 17B schematically illustrate steps of a fine pattern forming method using a fine processing method according to the present invention.
Figure 17B:
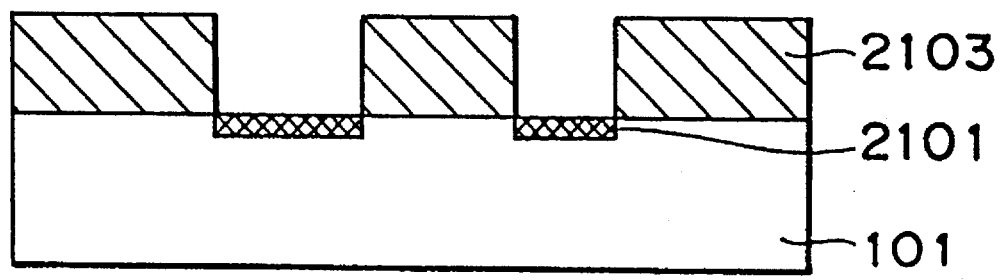

FIGS. 17A and 17B illustrate the step flow of the method of forming a thin-film pattern utilizing the fine processing method according to the present invention. In FIG. 17A which shows the first step of the thin film pattern forming method, reference numeral 101 denotes a substrate; 2101, a patterned latent image layer formed on the substrate 101; and 2102, a patterned energy beam for selectively forming the latent image layer 2101. In FIG. 17B which shows the second step of the method, reference numeral 2103 denotes a thin film pattern formed by the selective plating in a desired pattern on the portion of the substrate 101 other than the latent image layer.

The unit described in the first embodiment shown in FIG. 6 is used as the latent image forming unit so as to conduct the first step.

Figure 18:
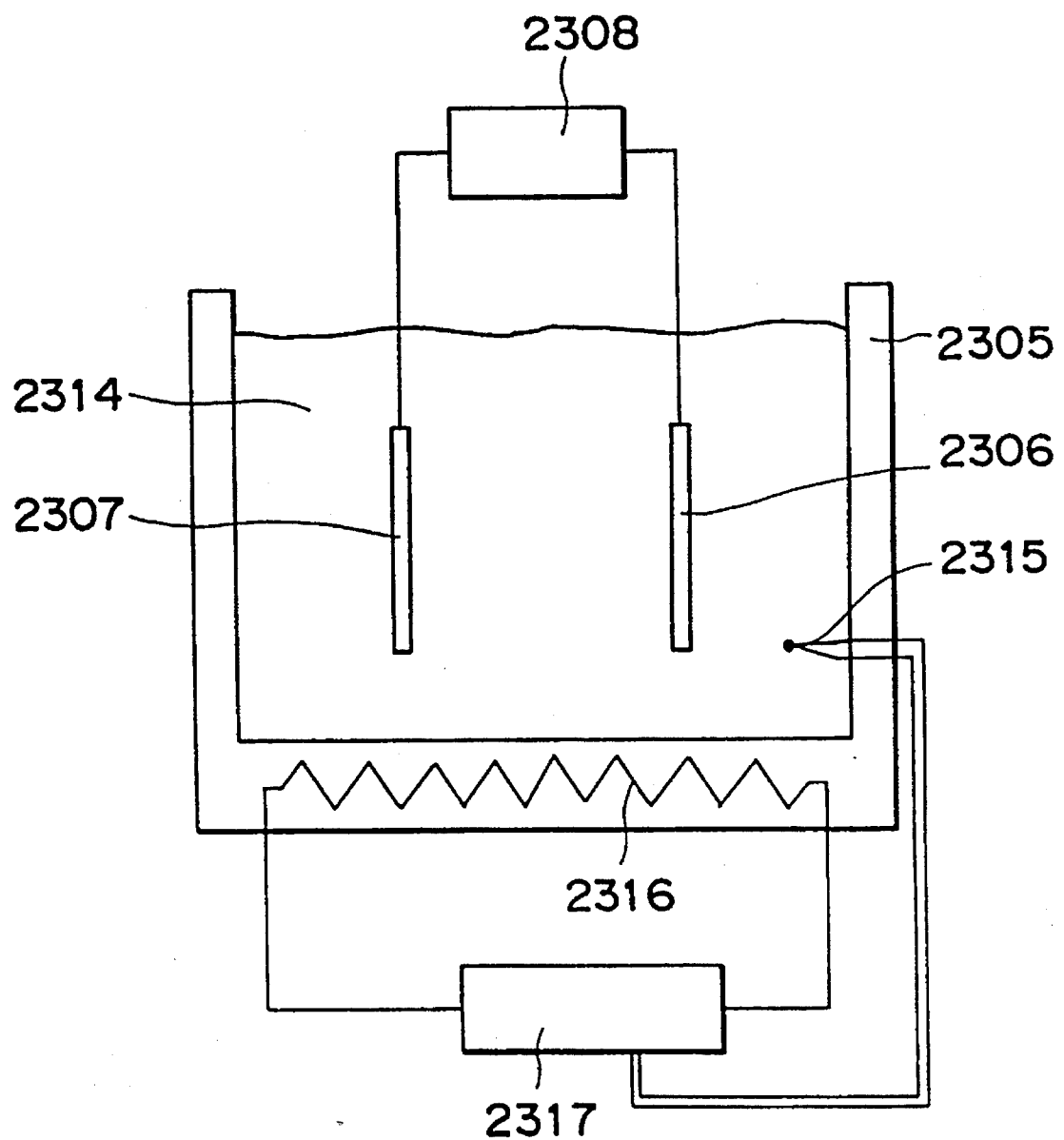
FIG. 18 schematically illustrates a plating apparatus used in the fine pattern forming.

FIG. 18 is a schematic view of a plating unit for selectively forming a thin film. In FIG. 18, reference numeral 2305 denotes a solution tank; 2306, an anode for electrolytic plating; 2307, a cathode for electrolytic plating; 2308, a d.c. power source, 2314, a solution; 2315, a temperature measuring element, such as a thermocouple, for measuring the temperature of the solution; 2316, a heater for heating the solution 2314; and 2317, a power source having a mechanism for maintaining the temperature of the solution to a constant value by controlling the voltage applied to the heater 2316 on the basis of the temperature signal obtained by the thermocouple 2315.

The thin film pattern forming method according to the present invention, which employs the aforementioned devices, will be described below.

First, the first step will be described. The gate valve 200b is opened, and the substrate 101 which is the material is placed on the material holding base 602. The gate valve 200b is closed, and the latent image chamber 603 is vacuum-evacuated to $10^{-7}$ torr or less by the vacuum-evacuating apparatus 610. A latent image forming gas such as $O_2$ is introduced into the latent image chamber 603 from the gas inlet 604, and the evacuation rate of the vacuum-evacuating apparatus is controlled such that the inner pressure of the latent image chamber is set at a predetermined value between 0.1 torr and 760 torr. Next, a laser beam having a wavelength of 248 nm and generated by the KrF excimer laser 605 is uniformly irradiated on the mask 609 having a desired pattern by the illumination optical system 614, and the patterned image of the mask 609 is formed on the material 101 through the light incident window 607 by the projection optical system 606. The surface of the substrate on which the mask image is formed, at the portion of the surface irradiated with light, the latent image forming gas photochemically react with each other, by which the latent image layer 2101 (see FIG. 17A) is formed. If $O_2$ is used as the latent image forming gas, an oxide is obtained as the latent image layer. After the latent image layer 2101 having a desired thickness (20 to 100 Å) is formed, supply of the gas is stopped, and the latent image chamber 603 is vacuum-evacuated to $10^{-7}$ torr or less. Thereafter, the gate valve 200b is opened, and the material is taken out.

In this embodiment, the KrF excimer laser is used as the light source 605. However, any light source which can irradiate light of a wavelength that induces photochemical reaction on the surface of the material can be used. Such a light source may be a lamp light source, such as a xenon lamp or a low-pressure mercury lamp, or a laser light source, such as an ArF excimer laser, a XeCl excimer laser or an Ar laser.

The light incident window made of fused quartz is used because it does not absorb the light of the wavelength of 248 nm but passes it therethrough. However, any other substance can be used as the material of the window so long as it passes through the light emitted from the light source 605 and which can withstand the pressure difference between the inside and outside of the surface activating chamber 603. It includes $CaF_2$, $MgF_2$, $LiF_2$ and sapphire glass, etc.

Next, electrolytic plating which is the second step is conducted. In this step, a desired thin film is formed on the portion of the material other than the latent image layer 2101 formed in the first step. Electrolytic plating can be conducted when the material 101 is made of a conductor or semiconductor while the latent image layer is made of an insulator.

To perform electrolytic plating, the solution 2314 containing the substrate to be deposited is filled in the solution tank 2305, and a d.c. current is applied by the d.c. power source 2308 using the substrate 101 as the cathode 2307 and Pt as the anode 2306, respectively. On the surface of the substrate 101 which is the cathode 2307, the latent image layer (oxide) 2101 is an insulator while the substrate 101 is a conductor or semiconductor. Therefore electrons are supplied to only the portion of the substrate 101 other than the latent image layer and then a metal is deposited on the portion other than the latent image layer to form the thin film pattern.

This embodiment was started with the latent image forming step. However, as in the case of the aforementioned embodiments, the first step may be conducted after the activated layer has been formed.

The apparatuses and methods described in the second through fifth embodiments are applicable in this embodiment.

Furthermore, a series of steps, consisting of the latent image forming step and the etching step (or the latent image forming step and the plating step), may be repeated a plurality of times in each of the aforementioned embodiments.

Such a repetition of the series of steps assures etching of deeper depth, a combination of etching or patterning or etching or patterning having different thicknesses or depths.

EXAMPLES

The present invention will now be described below by way of examples. It is, however, to be noted that the present invention is not limited to the following examples.

Example 1

In Example 1, fine processing was performed on the surface of a 4-inch Si substrate using the units shown in FIGS. 2 through 7 on the basis of the manufacturing steps shown in FIG. 1.

First, the first step was conducted. According to the procedures described in the aforementioned detailed description of the preferred embodiments, a Si substrate 101, which was a material to be processed, was placed in the load lock chamber 303 shown in FIG. 3, and the chamber was vacuum-evacuated. Next, the substrate was moved into the surface activating unit 201 shown in FIG. 5 and was placed on the material holding base 502 by the conveying robot 411. The surface activating chamber 503 was vacuum-evacuated to $10^{-7}$ torr or less.

Next, the inner pressure of the surface activating chamber 503 was set to 20 torr by respectively introducing hydrogen sulfide ($H_2S$), which was the first reactive gas, into the surface activating chamber 503 from the gas introducing port 504 at a desired flow rate of and by controlling the evacuation rate of the vacuum-evacuation apparatus 510. The low-pressure mercury lamp 505 was turned on and ultraviolet radiation was illuminated on the Si substrate for five minutes, by which photochemical reaction took place on the surface of the Si substrate 101 and the activated layer 103 was thereby formed (see FIG. 1B).

Another Si substrate subjected to the above treatment was taken out and the surface of the activated layer 103 formed was analyzed by the ESCA method. It was found that the surface of the Si substrate 101 was turned into a silicon sulfide compound $SiS_x$. The thickness of the silicon sulfide compound was about 50 Å.

After the activated layer 103 was formed, supply of the gas was stopped, and the activating chamber 503 was vacuum-evacuated to $10^{-7}$ torr or less. Thereafter, the gate valve 200a was opened, and the material 101 to be processed was taken out by the robot 411. The gate valve 200a was closed, and the material 101 to be processed was moved into the conveying chamber 403.

Next, the second step was performed in the manner described below. First, the inner pressure of the latent image chamber 603 shown in FIG. 6 was vacuum-evacuated to $10^{-7}$ torr or less by the vacuum-evacuation apparatus 610 beforehand. Next, the gate valve 200b was opened, and the Si substrate 101 with the activated layer 103 formed thereon was moved into the latent image chamber 603 by the robot 411 and was placed on the material holding base 602. The gate valve 200b was closed, and the latent image chamber 603 was vacuum-evacuated to $10^{-7}$ torr or less by the vacuum-evacuation apparatus 610.

Thereafter, the inner pressure of the latent image chamber 603 was set to 10 torr by introducing oxygen into the latent image chamber 603 as the second reactive gas from the gas introducing port 604 at a flow rate of 800 sccm and by controlling the evacuation rate of the vacuum evacuation apparatus 610.

Next, a laser beam of a wavelength of 248 nm which was generated by the KrF excimer laser 605 was uniformly illuminated onto the mask 609 having a desired pattern as a selectively illuminating energy by the illumination optical system 614, and the pattern of the mask 609 was formed on the material to be processed 101 by the projection optical system 606. The material 101 was illuminated with such a patterned laser beam for three minutes (at an illumination light intensity of 50 mW/cm$^2$ at the surface of the Si substrate 101), by which the latent image layer 105 was formed (see FIG. 1C).

Another Si substrate 101 subjected to the above-mentioned latent image layer forming step was taken out and the laser beam illuminated portion on the surface of the latent image layer 105 was analyzed by the ESCA method. It was found that the illuminated portion was turned into a silicon oxide compound SiO$_x$. The thickness of the silicon oxide compound was about 40 Å. No sulfur component was detected. The portion of the surface of the material 101 to be processed on which no laser beam was illuminated was also analyzed by the ESCA method. Only the silicon sulfide compound was present in that portion and there was no change.

After illumination, supply of the gas was stopped, and the latent image chamber 603 was vacuum-evacuated to 10$^{-7}$ torr or less. Thereafter, the gate valve 200b was opened, and the material 101 to be processed was taken out by the robot 411. The gate valve 200b was closed, and the material 101 was carried into the conveying chamber 403.

Next, the third step was performed. In the etching unit 203 shown in FIG. 7, the etching chamber 703 was vacuum-evacuated to 10$^{-7}$ torr or less beforehand by the vacuum evacuation apparatus 710. The gate valve 200c was opened, and the Si substrate 101 was moved into the etching chamber 703 by the robot 411 and was placed on the material holding base 702. The gate valve 200c was closed, and the etching chamber 703 and the plasma chamber 715 were vacuum-evacuated to 10$^{-7}$ torr or less by the vacuum-evacuation apparatus 710.

Thereafter, the inner pressure was set to 5×10$^{-3}$ torr by respectively introducing NF$_3$ and O$_2$ into the plasma chamber 715 from the gas introducing port 704 at flow rates of 30 sccm and 5 sccm and by controlling the evacuation rate of the vacuum evacuation apparatus 710.

To cool the electromagnetic coil 720 and the plasma chamber 715, a cooling water was introduced from the cooling water inlet 721 and was drained from the outlet 722. A d.c. current of 150 Å was supplied to the electromagnetic coil 720 to generate a magnetic field having a magnetic flux density of 875 Gauss in the plasma chamber 715.

A microwave of 2.45 GHz and 200 W was supplied to the plasma chamber 715 so that the plasma 719a was generated by the combination of the electric field of the microwave and the magnetic field. A part of the plasma 719a was accelerated from the plasma emitting port 716 in the direction of the line of magnetic force by the diffused magnetic field, and reached the surface of the material 101 to be processed in a plasma stream 719b. The activated layer 103 was removed by plasma processing the surface thereof for one minute by the plasma stream 719b (see FIG. 1D).

In this step, in the portion of the activated layer 103 other than the latent image layer 105, a volatile sulfur fluoride compound (SF$_x$) and a silicon fluoride compound (SiF$_x$) were formed, and only the activated layer 103 composed of the silicon sulfide compound was removed.

At that time, the latent image layer 105 was also etched slightly. Another Si substrate subjected to the above step was taken out and the thickness of the latent image layer 105 was evaluated by the ESCA method. It was found that the thickness of the latent image layer 105 was 30 Å. After the activated layer 103 was removed, supply of the gas was stopped, and the etching chamber 703 and the plasma chamber 715 were vacuum-evacuated to 10$^{-7}$ torr or less.

In the third step, i.e., in the activated layer 103 removing step, another method may also be employed. That is, the activated layer 103 may be removed by taking out the Si substrate 101 outside of the apparatus and by processing that Si substrate 101 using a solution (nitric acid+hydrofluoric acid) for 15 seconds.

Next, the fourth step was performed. The inner pressure of the plasma chamber 715 was set to 6×10$^{-4}$ torr by respectively introducing Cl$_2$ and NF$_3$ into the plasma chamber 715 at flow rates of 30 sccm and 2 sccm from the gas inlet 704 shown in FIG. 7 and by controlling the evacuation rate of the vacuum evacuation apparatus 710.

Next, a 2.45 GHz and 400 W microwave and a magnetic field having a magnetic flux density of 875 gauss were supplied to the plasma chamber 715 in the same manner as that in the third step so as to generate the plasma 719a. The plasma stream 719b was irradiated on the material 101 to be processed for one minute and the portion of the Si substrate 101 exposed to the plasma stream 719b was thereby etched using the latent image layer 105 (SiO$_x$) as a mask.

After etching, supply of the etching gases was stopped, and the etching chamber 703 and the plasma chamber 715 were vacuum-evacuated to 10$^{-7}$ torr or less. Thereafter, the gate valve 200c was opened, and the Si substrate 101 was moved into the load lock chamber 303 by the robot 411. After the load lock chamber 303 was opened to the atmosphere, the Si substrate 101 was taken out.

The etched depth measured using a step gauge was 4500 Å. It was observed by the scanning type electron microscope (SEM) that the side of the etched portion was not etched. That is, excellent anisotropic fine processing was provided (see FIG. 1E).

It took sixteen minutes for the first, second and third steps to be completed.

Comparative Example 1

To compare Example 1 with a conventional photoetching method, photoetching was conducted on the material 101 to be processed which was the same Si substrate as that used in Example 1 using the latent image unit 202 shown in FIG. 6 in the manner described below.

First, a non-processed Si substrate 101 was placed on the material holding base 602 located in the latent image chamber 603 through the load lock unit 204 and the conveying unit 205, and the latent image chamber 603 was vacuum-evacuated to 10$^{-7}$ torr or less.

The inner pressure was set to 0.4 torr while supplying chlorine into the latent image chamber 603 from the gas inlet 604 at a flow rate of 200 sccm by controlling the evacuation rate of the vacuum evacuation apparatus 610.

Next, a laser beam having a wavelength of 248 nm generated by the KrF excimer laser 605 was uniformly irradiated on the mask 609 having a desired pattern by the illumination optical system 614, and the pattern of the mask 609 was formed on the material to be processed 101 by the projection optical system 606. The material 101 was irradiated with such a patterned laser beam for twenty minutes (at an irradiation light intensity of 50 mW/cm$^2$ at the surface of the Si substrate 101), by which the surface of the Si substrate was etched.

After etching, the etched substrate 101 was taken out through the load lock unit 204 and the conveying unit 205, and the etched depth was measured by the step gauge. It was 1500 Å. This means that it takes one hour for the same depth (4500 Å) as that of Example 1 to be etched. In the aforementioned Example 1, it took sixteen minutes for the etching depth of 4500 Å to be obtained. It is therefore possible according to the present invention to shorten the fine processing time to about one fourth.

It was observed by the SEM that the processed surface was irregular due to irregular reflection of light and was very dirty as compared with Example 1, i.e., that the fine processing property was poor.

The fine processing time (from washing of the Si substrate to peeling off of the resist) was greatly shortened also as compared with the conventional steps which employed a resist.

Example 2

In Example 2, fine processing was performed on an amorphous silicon film (a-Si of a thickness of 5000 Å) deposited on a 4-inch quartz substrate by the plasma CVD process, using the devices shown in FIGS. 2 through 5, the device shown in FIG. 8 as the latent image unit 202 and the device shown in FIG. 11 as the etching unit 203, on the basis of the steps shown in FIG. 1.

First, the first step was conducted. The quartz substrate 101 with the a-Si film deposited thereon as the material to be processed in the same procedures as those of Example 1 was placed on the material holding base 502 shown in FIG. 5. The surface activating chamber 503 was vacuum-evacuated to 10$^{-7}$ torr or less.

Next, the inner pressure of the surface activating chamber 593 was set to 30 torr while respectively introducing hydrogen iodide (HI), which was the first reactive gas, into the surface activating chamber 503 from the gas inlet 504 at a flow rate of 800 sccm and by controlling the evacuation rate of the vacuum-evacuation apparatus 510. The low-pressure mercury lamp 505 was turned on and ultraviolet radiation was irradiated on the quartz substrate for five minutes, by which photochemical reaction took place on the surface of the a-Si film 102 and the activated layer 103 was thereby formed (see FIG. 1B).

Another quartz substrate subjected to the above process was taken out and the surface of the activated layer 103 formed on the surface thereof was analyzed by the ESCA method. It was found that the surface of the substrate was changed to a silicon iodide compound SiI$_x$. The thickness of the silicon iodide compound was about 70 Å.

After the activated layer 103 was formed, the same processing as that of Example 1 was performed, and then the second step was performed.

In the second step, the quartz substrate 101 with an a-Si film deposited thereon was placed on the material holding base 802a of the apparatus of the latent image unit 202 shown in FIG. 8 in the same procedures as those of Example 1, and the latent image chamber 603 was vacuum-evacuated to 10$^{-7}$ torr or less by the vacuum-evacuation apparatus 610.

Thereafter, the inner pressure of the latent image chamber 603 was set to 10 torr by introducing oxygen and hydrogen into the latent image chamber 603 as the second reactive gas from the gas introducing port 604 at flow rates of 200 sccm and 600 sccm respectively and by controlling the evacuation rate of the vacuum evacuation apparatus 610.

Next, a laser beam generated by the KrF excimer laser 605 was irradiated onto the surface of the material 101 to be processed in a spot of a diameter of 10 μm as a selectively irradiating energy by the projection optical system 806 while the intensity thereof was being limited by the shutter 823.

Also, the stage 802b on which the material holding base 802a was placed was moved two-dimensionally by the drive device 802c synchronously with the opening/closing of the shutter 823, by which the latent image layer 105 having the same pattern as that of Example 1 was formed without using the mask (see FIG. 1C).

After irradiation, supply of the gas was stopped, and the latent image chamber 603 was vacuum-evacuated to 10$^{-7}$ torr or less. Thereafter, the gate valve 200b was opened, and the material 101 to be processed was taken out by the robot 411. The gate valve 200b was closed, and the material 101 to be processed was carried into the conveying chamber 403.

It took four minutes for the first and second steps to be completed.

Next, the third and fourth steps were performed in sequence using the device shown in FIG. 11 as the etching unit 203. The quartz substrate 101 with the a-Si film deposited thereon, which was subjected to the first and second steps, was moved into the etching chamber 1103 vacuum-evacuated to 10$^{-7}$ torr or less and was placed on the material holding base 1102.

The inner pressure of the etching chamber 1103 was set to 0.3 torr torr by respectively introducing NF$_3$ and O$_2$ into the microwave plasma exciting device 1115 from the gas introducing port 1105 at flow rates of 500 sccm and 100 sccm. The plasma was generated within the microwave plasma exciting chamber 1115 by supplying microwaves (2.45 GHz, 800 W) to the microwave plasma exciting device 1115, by which the active layer 103 was removed first and then the a-Si film was etched.

After etching, supply of the etching gases was stopped, and the etching chamber 1103 was vacuum-evacuated to 10$^{-7}$ torr or less. Thereafter, the gate valve 200c was opened, and the quartz substrate 101 with the a-Si film deposited thereon was taken out by the robot 411. After the substrate 101 was placed in the load lock chamber 303, the load lock chamber 303 was opened to the atmosphere so as to allow the substrate to be taken out.

The etched depth measured using a step gauge was 4000 Å (see FIG. 1E).

It took fourteen minutes for the first, second, third and fourth processes to be completed.

Comparative Example 2

To compare Example 2 with a conventional photoetching method, photoetching was conducted on the quartz substrate 101 with an a-Si film deposited thereon in the same manner as that of Comparative Example 1 using the latent image unit 202 shown in FIG. 6. Etching time was twenty minutes.

Similarly, the etched depth was measured by the step gauge. It was 2000 Å. This means that it takes forty minutes for the same depth (4000 Å) as that of Example 2 to be etched. In the aforementioned Example 2, it took fourteen minutes for the etching depth of 4000 Å to be obtained, as mentioned above. It is therefore seen that the present invention shortens the fine processing time to about one third.

It was observed that the processed surface was irregular due to irregular reflection of light and was very dirty as compared with Example 2.

The fine processing time (from washing of the quartz substrate with the a-Si film deposited thereon to peeling off of the resist) was greatly shortened also as compared with the conventional process which employed a resist.

Example 3

In Example 3, fine processing was performed on an Al film (having a thickness of 5000 Å) formed on a 4-inch Si substrate by sputtering, using the devices shown in FIGS. 2 through 5, the device shown in FIG. 9 as the latent image unit 202 and the device shown in FIG. 7 as the etching unit, on the basis of the manufacturing process shown in FIG. 1.

First, the first step was conducted. The substrate 101 with the Al film deposited thereon was placed on the material holding base 502 shown in FIG. 5 as the material to be processed in the same procedures as those of Example 1. The surface activating chamber 503 was vacuum-evacuated to $10^{-7}$ torr or less.

Next, the inner pressure of the surface activating chamber 503 was set to 20 torr by introducing hydrogen sulfide ($H_2S$), which was the first reactive gas, into the surface activating chamber 503 from the gas inlet 504 at a flow rate of 800 sccm and by controlling the evacuation rate of the vacuum-evacuation apparatus 510. The low-pressure mercury lamp 505 was turned on and ultraviolet light 104 was irradiated on the substrate for five minutes, by which photochemical reaction took place on the surface of the Al film 102 and the active layer 103 was thereby formed (see FIG. 1B).

After the active layer 103 was formed, the same processing as that of Example 1 was performed, and then the second process was performed.

In the second process, the Si substrate 101 with the Al film deposited thereon was placed on the material holding base 902a of the device in the latent image unit 202 shown in FIG. 9 in the same procedures as those of Example 1, and the latent image chamber 903 was vacuum-evacuated to $10^{-7}$ torr or less by the vacuum-evacuation apparatus 910.

Thereafter, oxygen introduced from the gas introducing port 904 as the second reactive gas at a flow rate of 10 sccm was sprayed on the surface of the Al film from the gas ejecting nozzle 926, by which the inner pressure of the latent image chamber 903 was set to $3\times10^{-3}$ torr.

Next, an electron beam was converged on the surface of the Al film 102 in a spot having a diameter of 0.4 μm as the selectively irradiating energy by operating an electron beam generating unit 927, i.e., by generating electrons by the electron gun 929 and then by accelerating the generated electron beam 931 to 2 kV by the electron optical system 930, while the stage 902b on which the material holding base 902a was placed was moved two-dimensionally by the drive device 902c synchronously with the electron beam shutter (not shown), by which the latent image layer 105 made up of lines and spaces of 0.4 μm was formed without using the mask.

After irradiation, supply of the gas was stopped, and the latent image chamber 903 was vacuum-evacuated to $10^{-7}$ torr or less. Thereafter, the gate valve 200b was opened, and the Si substrate 101 was taken out by the robot 411. The gate valve 200b was closed, and the Si substrate 101 was carried into the conveying chamber 403.

Next, the third step was performed. The etching chamber 70.3 was vacuum-evacuated to $10^{-7}$ torr or less beforehand by the vacuum evacuation apparatus 710 shown in FIG. 7. The gate valve 200c was opened, and the material 101 to be processed was moved into the etching chamber 703 by the robot 411 and was placed on the material holding base 702. The gate valve 200c was closed, and the etching chamber 703 and the plasma chamber 715 were vacuum-evacuated to $10^{-7}$ torr or less by the vacuum-evacuation apparatus 710.

Thereafter, the inner pressure was set to $5\times10^{-3}$ torr by respectively introducing $NF_3$ and $Cl_2$ into the plasma chamber 715 from the gas introducing port 704 at a flow rate of 20 sccm and by controlling the evacuation rate of the vacuum evacuation apparatus 710. That is, the same process as the third step in Example 1 was performed to remove the active layer 103 (see FIG. 1D).

After the active layer was removed, supply of the gases was stopped, and the etching chamber 703 and the plasma chamber 715 were vacuum-evacuated to $10^{-7}$ torr or less.

Next, the fourth step was conducted. The inner pressure of the plasma chamber 715 was set to $6\times10^{-4}$ torr by introducing $Cl_2$ into the plasma chamber 715 at a flow rate of 30 sccm from the gas inlet 704 shown in FIG. 7 and by controlling the evacuation rate of the vacuum evacuation apparatus 710. The plasma 719a was generated in the same manner as that of Example 1, and the surface of the Al film 102 was irradiated with the plasma stream 719b for one minute for etching.

After etching, supply of the etching gas was stopped, and the etching chamber 703 and the plasma chamber 715 were vacuum-evacuated to $10^{-7}$ torr or less. Thereafter, the gate valve 200c was opened, and the Si substrate 101 was moved into the load lock chamber 303 by the robot 411. After the load lock chamber 303 was opened to the atmosphere, the Si substrate 101 was taken out.

The etching depth was measured using the step gauge. It was found that the Al film in the etched portion was completely removed. It was observed by the scanning type electronic microscope (SEM) that the lines and spaces of 0.4 μm were formed and that the side surface was not etched. That is, excellent anisotropic fine processing was provided (see FIG. 1E).

Example 4

In Example 4, fine processing was performed on the same material to be processed as that employed in Example 3 using the same devices as those used in Example 3 except that the latent image unit 202 in FIG. 10 is used on the basis of the same steps as that of Example 3.

First, the first step was conducted in the same manner as that of Example 3, and then the second step was performed.

In the second step, the Si substrate 101 with the Al film deposited thereon was placed on the material holding base 1002a in the latent image unit shown in FIG. 10 in the same procedures as those of Example 1, and the latent image chamber 1003 was vacuum-evacuated to $10^{-7}$ torr or less by the vacuum-evacuation apparatus 1010.

Thereafter, oxygen introduced from the gas introducing port 1004 as the second reactive gas at a flow rate of 10 sccm was sprayed on the surface of the Al film from the gas ejecting nozzle 1026, by which the inner pressure of the latent image chamber 1003 was set to $3\times10^{-3}$ torr.

Next, an ion beam was converged on the surface of the Al film 102 in a spot having a diameter of 0.3 μm as the selectively irradiating energy by operating an ion beam generating unit 1027, i.e., by generating Al$^+$ ions from the ion source 1029 and then by accelerating the generated ion beam 1031 to 2 kV by the ion optical system 1030, while the stage 1002b on which the material holding base 1002a was placed was moved two-dimensionally by the drive device 1002c synchronously with the opening/closing of the ion beam shutter (not shown), by which the latent image layer 105 made up of lines and spaces of 0.3 μm was formed without using the mask.

After irradiation, supply of the gas was stopped, and the latent image chamber 1003 was vacuum-evacuated to $10^{-7}$ torr or less. Thereafter, the gate valve 200b was opened, and the Si substrate 101 was taken out by the robot 411. The gate valve 200b was closed, and the Si substrate 101 was carried into the conveying chamber 403.

Next, the third and fourth steps were performed in the same manner as that of Example 3 to finely process the Al film. The etching depth was measured using the step gauge. It was found that the Al film was completely etched. It was observed by the scanning type electronic microscope (SEM) that the lines and spaces of 0.3 μm were formed and that the side surface was not etched. That is, excellent anisotropic fine processing was provided (see FIG. 1E).

Example 5

In Example 5, the latent image layer 105 was removed in the third step, and etching was conducted using the remaining portion as a mask in the fourth step. Fine processing was performed on the same Si substrate as that employed in Example 1 using the same devices as those of Example 1.

The active layer 103 made of silicon sulfide compound was formed on the surface of the Si substrate 101 by conducting the first step in the same manner as that of Example 1.

Next, the second step was performed in the manner described below: the Si substrate 101 with the active layer 103 formed thereon was placed on the material holding base 602 shown in FIG. 6 in the same manner as that of Example 1, and the latent image chamber 603 was vacuum-evacuated to $10^{-7}$ torr or less. Thereafter, the inner pressure of the latent image chamber 603 was set to 10 torr by introducing hydrogen into the latent image chamber 603 from the gas introducing port 604 at a flow rate of 800 sccm as the second reactive gas and by controlling the evacuation rate of the vacuum evacuation apparatus 610.

Next, a laser beam of a wavelength of 193 nm generated by the ArF excimer laser 605 was uniformly irradiated onto the mask 609 having a desired pattern as a selectively irradiating energy by the illumination optical system 614, and the pattern of the mask 609 was formed on the material to be processed 101 by the projection optical system 606. The material 101 was irradiated with such a patterned laser beam for three minutes (at an irradiation light intensity of 30 mW/cm$^2$ at the surface of the Si substrate 101), by which the latent image layer 105 was formed.

After irradiation, supply of the gas was stopped, and the latent image chamber 603 was vacuum-evacuated to $10^{-7}$ torr or less. Thereafter, the gate valve 200b was opened, and the material 101 to be processed was taken out by the robot 411. The gate valve 200b was closed, and the material 101 was moved into the conveying chamber 403.

Next, the third and fourth steps were performed in sequence. The Si substrate 101 was placed on the material holding base 702 shown in FIG. 7 in the same manner as that of Example 1, and the etching chamber 703 and the plasma chamber 715 were vacuum-evacuated to $10^{-7}$ torr or less. Thereafter, Cl$_2$ and NF$_3$ were respectively introduced into the plasma chamber 715 from the gas introducing port 704 at flow rates of 30 sccm and 2 sccm, and the evacuation rate of the vacuum evacuation apparatus 710 was controlled such that the inner pressure was set to $6 \times 10^{-4}$ torr.

A microwave of 2.45 GHz and 400 W and a magnetic field having a flux density of 875 gauss were supplied to the plasma chamber 715 in the same manner as that described in the third step of Example 1 to generate the plasma 719a by the combination of the electric fields of the microwave and the magnetic field. The material to be processed was irradiated by the plasma stream 719b for one minute for etching.

After etching, supply of the etching gases was stopped, and the etching chamber 703 and the plasma chamber 715 were vacuum-evacuated to $10^{-7}$ torr or less. Thereafter, the gate valve 200c was opened, and the Si substrate 101 was carried into the load lock chamber 303 by the robot 411. After the load lock chamber 303 was opened to the atmosphere, the Si substrate 101 was taken out.

The etched depth measured using a step gauge was 4500 Å. It was observed by the scanning type electron microscope (SEM) that a pattern reverse to that of Example 1 was removed and that the side surface was not etched. That is, excellent anisotrpic fine processing was provided at a high speed (see FIG. 1E).

Example 6

Fine processing was performed on the surface of the 4-inch Si substrate using the devices shown in FIGS. 2 through 4, 6, 7 and 15 on the basis of the manufacturing steps shown in FIGS. 1A to 1E.

First, the first step was conducted. According to the procedures described above in the detailed description of the preferred embodiments, the Si substrate 101, which was a material to be processed, was placed in the load lock chamber 303 shown in FIG. 3, and the chamber was vacuum-evacuated. Next, the substrate was moved into the surface activating unit 1503 shown in FIG. 15 and was placed on the material holding base 1502 heated to 500° C. by the robot 411. The surface activating chamber 1503 was vacuum-evacuated to $10^{-7}$ torr or less.

Next, the inner pressure of the surface activating chamber was set to 2 torr by introducing hydrogen sulfide (H$_2$S), which was the first reactive gas, into the surface activating chamber 1503 from the gas introducing port 1504 at a desired flow rate and by controlling the evacuation rate of the vacuum-evacuation apparatus 1510. Hydrogen sulfide was supplied for four minutes. By thermochemical change of the surface of the Si substrate 101, the active layer 103 was formed (see FIG. 1B).

Another Si substrate subjected to the above process was taken out and the surface of the active layer 103 formed was analyzed by the ESCA method. It was found that a silicon sulfide compound SiS$_x$ was formed on the surface of the Si substrate 101. The thickness of the silicon sulfide compound was about 50 Å.

After the active layer 103 was formed, supply of the gas was stopped, and the activating chamber 1503 was vacuum-evacuated to $10^{-7}$ torr or less. Thereafter, the gate valve 200a was opened, and the material 101 to be processed was moved taken out by the robot 411. The gate valve 200a was closed, and the material 101 to be processed was moved into the conveying chamber 403.

Next, the second step was performed in the manner described below. First, the inner pressure of the latent image chamber 603 shown in FIG. 6 was vacuum-evacuated to $10^{-7}$ torr or less by the vacuum-evacuation apparatus 610 beforehand. Next, the gate valve 200b was opened, and the Si substrate 101 with the active layer 103 formed thereon was moved into the latent image chamber 603 by the robot 411 and was placed on the material holding base 602. The gate valve 200b was closed, and the latent image chamber 603 was vacuum-evacuated to $10^{-7}$ torr or less by the vacuum-evacuation apparatus 610.

Thereafter, the inner pressure of the latent image chamber 603 was set to 10 torr by introducing oxygen into the latent image chamber 603 as the second reactive gas from the gas introducing port 604 at a flow rate of 800 sccm and by controlling the evacuation rate of the vacuum evacuation apparatus 610.

Next, a laser beam of a wavelength of 248 nm generated by the KrF excimer laser 605 was uniformly irradiated onto the mask 609 having a desired pattern as a selectively irradiating energy by the illumination optical system 614, and the pattern of the mask 609 was formed on the material to be processed 101 by the projection optical system 606. The material 101 was irradiated with such a patterned laser beam for three minutes (at an irradiation light intensity of 50 mW/cm$^2$ at the surface of the Si substrate 101), by which the latent image layer 105 was formed (see FIG. 1C).

Another Si substrate 101 subjected to the above-mentioned latent image layer forming step was taken out and the laser beam irradiated portion on the surface of the latent image layer 105 was analyzed by the ESCA method. It was found that the irradiated portion was changed to a silicon oxide compound SiO$_x$. The thickness of the silicon oxide compound was about 40 Å. No sulfur component was detected in the silicon oxide compound. The portion of the surface of the material 101 to be processed which was not irradiated with the laser beam was also analyzed by the ESCA method. Only the silicon sulfide compound was present in that portion.

After irradiation, supply of the gas was stopped, and the latent image chamber 603 was vacuum-evacuated to $10^{-7}$ torr or less. Thereafter, the gate valve 200b was opened, and the material 101 to be processed was taken out by the robot 411. The gate valve 200b was closed, and the material 101 was carried into the conveying chamber 403.

Next, the third step was performed. In the etching unit 203 shown in FIG. 7, the etching chamber 703 was vacuum-evacuated to $10^{-7}$ torr or less beforehand by the vacuum evacuation apparatus 710. The gate valve 200c was opened, and the Si substrate 101 was moved into the etching chamber 703 by the robot 411 and was placed on the material holding base 702. The gate valve 200c was closed, and the etching chamber 703 and the plasma chamber 715 were vacuum-evacuated to $10^{-7}$ torr or less by the vacuum-evacuation apparatus 710.

Thereafter, the inner pressure was set to $5\times10^{-3}$ torr by respectively introducing NF$_3$ and O$_2$ into the plasma chamber 715 from the gas introducing port 704 at flow rates of 30 sccm and 5 sccm and by controlling the evacuation rate of the vacuum evacuation apparatus 710.

To cool the electromagnetic coil 720 and the plasma chamber 715, a cooling water was introduced from the cooling water inlet 721 and was drained from the outlet 722. A d.c. current of 150 A was supplied to the electromagnetic coil 720 to generate a magnetic field having a magnetic flux density of 875 Gauss in the plasma chamber 715.

A microwave of 2.45 GHz and 200 W was supplied to the plasma chamber 715 so that the plasma 719a was generated by the combination of the electric field of the microwave and the magnetic field. Part of the plasma 719a was accelerated from the plasma emitting port 716 in the direction of the line of magnetic force by the diffused magnetic field and reached the surface of the material 101 to be processed in a plasma stream 719b. The active layer 103 was removed by plasma processing the surface thereof for one minute by the plasma stream 719b (see FIG. 1D).

In this step, in the portion of the active layer 103 other than the latent image layer 105, a volatile sulfur fluoride compound (SF$_x$) and a silicon fluoride compound (SiF$_x$) were generated, and only the active layer 103 composed of the silicon sulfide compound was removed.

At that time, the latent image layer 105 was also etched slightly. Another Si substrate subjected to the above process was taken out and the thickness of the latent image layer 105 was evaluated by the ESCA method. The thickness of the latent image layer 105 was 30 Å. After the active layer 103 was removed, supply of the gas was stopped, and the etching chamber 703 and the plasma chamber 715 were vacuum-evacuated to $10^{-7}$ torr or less.

In the third step, i.e., in the active layer 103 removing step, another method may also be employed. That is, the active layer 103 may be removed by taking the Si substrate 101 outside of the apparatus and by processing that Si substrate 101 using a solution (nitric acid+hydrofluoric acid) for 15 seconds.

Next, the fourth step was performed. The inner pressure of the plasma chamber 715 was set to $6\times10^{-4}$ torr by respectively introducing Cl$_2$ and NF$_3$ into the plasma chamber 715 at flow rates of 30 sccm and 2 sccm from the gas inlet 704 shown in FIG. 7 and by controlling the evacuation rate of the vacuum evacuation apparatus 710.

Next, a 2.45 GHz and 400 W microwave and a magnetic field having a magnetic flux density of 875gauss were supplied to the plasma chamber 715 in the same manner as that in the third step to generate the plasma 719a. The plasma stream 719b was irradiated on the material 101 to be processed for one minute and the portion of the Si substrate 101 exposed to the plasma stream 719b was thereby etched using the latent image layer 105 (SiO$_x$) as a mask.

After etching, supply of the etching gases was stopped, and the etching chamber 703 and the plasma chamber 715 were vacuum-evacuated to $10^{-7}$ torr or less. Thereafter, the gate valve 200c was opened, and the Si substrate 101 was moved into the load lock chamber 303 by the robot 411. After the load lock chamber 303 was opened to the atmosphere, the Si substrate 101 was taken out.

The etched depth measured using a step gauge was 4500 Å. It was observed by the scanning type electron microscope (SEM) that the side surface was not etched. That is, excellent anisotropic fine processing was provided (see FIG. 1E).

It took fifteen minutes for the first, second and third steps to be completed.

Comparative Example 3

To compare Example 6 with a conventional photoetching method, photoetching was conducted on the same type of Si substrate 101 as that used in Example 6 using the latent image unit 202 shown in FIG. 6 in the manner described below.

First, a non-processed Si substrate 101 was placed on the material holding base 602 located in the latent image chamber 603 through the load lock unit 204 and the conveying unit 205, and the latent image chamber 603 was vacuum-evacuated to $10^{-7}$ torr or less.

The inner pressure was set to 0.4 torr by supplying chlorine into the latent image chamber 603 from the gas inlet 604 at a flow rate of 200 sccm and by controlling the evacuation rate of the vacuum evacuation apparatus 610.

Next, a laser beam having a wavelength of 248 nm and generated by the KrF excimer laser 605 was uniformly irradiated on the mask 609 having a desired pattern by the illumination optical system 614, and the pattern of the mask 609 was formed on the material to be processed 101 by the projection optical system 606. The material 101 was irradiated with such a patterned laser beam for twenty minutes (at an irradiation light intensity of 50 mW/cm² at the surface of the Si substrate 101), by which the surface of the Si substrate was etched.

After etching, the etched substrate 101 was taken out through the load lock unit 204 and the conveying unit 205, and the etched depth was measured by the step gauge. It was 1500 Å. This means that it takes one hour for the same depth (4500 Å) as that of Example 6 to be etched. In the aforementioned Example 6, it took fifteen minutes for the etching depth of 4500 Å to be obtained. It is therefore possible according to the present invention to shorten the fine processing time to about one fourth.

It was observed by the SEM that the processed surface was irregular due to irregular reflection of light and was very dirty as compared with Example 6, i.e., that the fine processing property was poor.

The fine processing time (from washing of the Si substrate to peeling off of the resist) was greatly shortened also as compared with the conventional steps which employed a resist.

Example 7

In Example 7, fine processing was performed on an amorphous silicon film (a-Si of a thickness of 5000 Å) deposited on a 4-inch quartz substrate by the CVD process, using the devices shown in FIGS. 2 through 5 and 15, the device shown in FIG. 8 as the latent image unit 202 and the device shown in FIG. 11 as the etching unit 203, on the basis of the manufacturing steps shown in FIG. 1.

First, the first step was conducted. The quartz substrate 101 with the a-Si film deposited thereon was placed on the material holding base 1502 heated to 200° C., shown in FIG. 15, as the material to be processed in the same procedures as those of Example 6, and the surface activating chamber 1503 was vacuum-evacuated to $10^{-7}$ torr or less.

Next, the inner pressure of the surface activating chamber was set to 5 torr by introducing hydrogen iodide (HI), which was the first reactive gas, into the surface activating chamber 1503 from the gas introducing port 1504 at a flow rate of 800 sccm and by controlling the evacuation rate of the vacuum-evacuation apparatus 1510. Hydrogen iodide was supplied for four minutes. By thermochemical change of the surface of the Si substrate 101, the active layer 103 was formed (see FIG. 1B).

Another quartz substrate subjected to the above process was taken out and the surface of the active layer 103 formed on the surface thereof was analyzed by the ESCA method. It was found that the surface of the substrate was changed to a silicon iodide compound $SiI_x$. The thickness of the silicon iodide compound was about 70 Å.

After the active layer 103 was formed, the same processing as that of Example 6 was performed, and then the second step was performed.

In the second step, the quartz substrate 101 with the a-Si film deposited thereon was placed on the material holding base 802a of the device in the latent image unit 202 shown in FIG. 8 in the same procedures as those of Example 6, and the latent image chamber 603 was vacuum-evacuated to $10^{-7}$ torr or less by the vacuum-evacuation apparatus 610.

Thereafter, the inner pressure of the latent image chamber 603 was set to 10 torr by introducing oxygen and hydrogen into the latent image chamber 603 as the second reactive gas from the gas introducing port 604 at flow rates of 200 sccm and 600 sccm, respectively, and by controlling the evacuation rate of the vacuum evacuation apparatus 610.

Next, a laser beam generated by the KrF excimer laser 605 was irradiated onto the surface of the material 101 to be processed in a spot of a diameter of 10 µm as a selectively irradiating energy by the projection optical system 806 while the intensity thereof was being limited by the shutter 823.

Also, the stage 802b on which the material holding base 802a was placed was moved two-dimensionally by the drive device 802c synchronously with the opening/closing of the shutter 823, by which the latent image layer 105 having the same pattern as that of Example 6 was formed without using the mask (see FIG. 1C).

After irradiation, supply of the gas was stopped, and the latent image chamber 603 was vacuum-evacuated to $10^{-7}$ torr or less. Thereafter, the gate valve 200b was opened, and the material 101 to be processed was taken out by the robot 411. The gate valve 200b was closed, and the material 101 to be processed was carried into the conveying chamber 403.

It took four minutes for the first and second steps to be completed.

Next, the third and fourth steps were performed in sequence using the device shown in FIG. 11 as the etching unit 203. The quartz substrate 101 with the a-Si film deposited thereon, which was subjected to the first and second steps, was moved into the etching chamber 1103 which was vacuum-evacuated to $10^{-7}$ torr or less and was placed on the material holding base 1102.

$NF_3$ and $O_2$ were respectively introduced into the microwave plasma exciting device 1115 from the gas introducing port 1104 at flow rates of 500 sccm and 100 sccm, by which the inner pressure of the etching chamber 1103 was set to 0.3 torr. The plasma was generated within the plasma exciting chamber 1115 by supplying microwaves (2.45 GHz, 800 W) to the microwave plasma exciting device 1115, by which the active layer 103 was removed first and then the a-Si film was etched.

After etching, supply of the etching gases was stopped, and the etching chamber 1103 was vacuum-evacuated to $10^{-7}$ torr or less. Thereafter, the gate valve 200c was opened, and the quartz substrate 101 with the a-Si film deposited thereon was taken out by the robot 411. After the substrate 101 was placed in the load lock chamber 303, the load lock chamber 303 was opened to the atmosphere so as to allow the substrate to be taken out.

The etched depth measured using a step gauge was 4000 Å (see FIG. 1E).

It took thirteen minutes for the first, second, third and fourth steps to be completed.

Comparative Example 4

To compare Example 7 with a conventional photoetching method, photoetching was conducted on the quartz substrate 101 with the a-Si film deposited thereon in the same manner as that of Comparative Example 3 using the latent image unit 202 shown in FIG. 6. Etching time was twenty minutes.

Similarly, the etched depth was measured by the step gauge. It was 2000 Å. This means that it takes forty minutes for the same depth (4000 Å) as that of Example 7 to be etched. In the aforementioned Example 7, it took thirteen minutes for the etching depth of 4000 Å to be obtained, as mentioned above. It is therefore possible according to the present invention to shorten the fine processing time to about one third.

It was observed that the processed surface was irregular due to irregular reflection of light and was very dirty as compared with Example 7.

The fine processing time (from washing of the quartz substrate with the a-Si film deposited thereon to peeling off of the resist) was greatly shortened also as compared with the conventional step which employed a resist.

Example 8

In Example 8, fine processing was performed on an Al film (having a thickness of 5000 Å) formed on a 4-inch Si substrate by sputtering, using the devices shown in FIGS. 2 through 4 and 15, the device shown in FIG. 9 as the latent image unit 202 and the device shown in FIG. 7 as the etching unit, on the basis of the manufacturing steps shown in FIG. 1.

First, the first step was conducted. The substrate 101 with the Al film deposited thereon was placed on the material holding base 1502 heated to 400° C., shown in FIG. 15, as the material to be processed in the same procedures as those of Example 1. The surface activating chamber 1503 was vacuum-evacuated to $10^{-7}$ torr or less.

Next, the inner pressure of the surface activating chamber 1503 was set to 15 torr by introducing hydrogen sulfide ($H_2S$), which was the first reactive gas, into the surface activating chamber 1503 from the gas inlet 1504 at a flow rate of 800 sccm and by controlling the evacuation rate of the vacuum-evacuation apparatus 1510. Hydrogen sulfide was supplied for four minutes. By thermochemical change of the surface of the Al film 102, the active layer 103 was formed (see FIG. 1B).

After the active layer 103 was formed, the same processing as that of Example 1 was performed, and then the second step was performed.

In the second step, the Si substrate 101 with the Al film deposited thereon was placed on the material holding base 902a of the device in the latent image unit 202 shown in FIG. 9 in the same procedures as those of Example 6, and the latent image chamber 903 was vacuum-evacuated to $10^{-7}$ torr or less by the vacuum-evacuation apparatus 910.

Thereafter, oxygen introduced from the gas introducing port 904 as the second reactive gas at a flow rate of 10 sccm was sprayed on the surface of the Al film from the gas ejecting nozzle 926, by which the inner pressure of the latent image chamber 903 was set to $3\times10^{-3}$ torr.

Next, an electron beam was converged on the surface of the Al film 102 in a spot having a diameter of 0.4 μm as the selectively irradiating energy by operating an electron beam generating unit 927, i.e., by generating electrons by the electron gun 929 and then by accelerating the generated electron beam 931 to 2 kV by the electron optical system 930, while the stage 902b on which the material holding base 902a was placed was moved two-dimensionally by the drive device 902c synchronously with the opening/closing of the electron beam shutter (not shown), by which the latent image layer 105 made up of lines and spaces of 0.4 μm was formed without using the mask.

After irradiation, supply of the gas was stopped, and the latent image chamber 903 was vacuum-evacuated to $10^{-7}$ torr or less. Thereafter, the gate valve 200b was opened, and the Si substrate 101 was taken out by the robot 411. The gate valve 200b was closed, and the Si substrate 101 was carried into the conveying chamber 403.

Next, the third step was performed. The etching chamber 703 was vacuum-evacuated to $10^{-7}$ torr or less beforehand by the vacuum evacuation apparatus 710 shown in FIG. 7. The gate valve 200c was opened, and the material 101 to be processed was moved into the etching chamber 703 by the robot 411 and was placed on the material holding base 702. The gate valve 200c was closed, and the etching chamber 703 and the plasma chamber 715 were vacuum-evacuated to $10^{-7}$ torr or less by the vacuum-evacuation apparatus 710.

Thereafter, the inner pressure was set to $5\times10^{-3}$ torr by introducing $NF_3$ and $Cl_2$ into the plasma chamber 715 from the gas introducing port 704 each at a flow rate of 20 sccm and by controlling the evacuation rate of the vacuum evacuation apparatus 710. That is, the same process as the third step in Example 6 was performed to remove the active layer 103 (see FIG. 1D).

After the active layer was removed, supply of the gases was stopped, and the etching chamber 703 and the plasma chamber 715 were vacuum-evacuated to $10^{-7}$ torr or less.

Next, the fourth step was conducted. The inner pressure of the plasma chamber 715 was set to $6\times10^{-4}$ torr by introducing $Cl_2$ into the plasma chamber 715 at a flow rate of 30 sccm from the gas inlet 704 shown in FIG. 7 and by controlling the evacuation rate of the vacuum evacuation apparatus 710. The plasma 719a was generated in the same manner as that of Example 6, and the surface of the Al film 102 was irradiated with the plasma stream 719b for one minute for etching.

After etching, supply of the etching gas was stopped, and the etching chamber 703 and the plasma chamber 715 were vacuum-evacuated to $10^{-7}$ torr or less. Thereafter, the gate valve 200c was opened, and the Si substrate 101 was moved into the load lock chamber 303 by the robot 411. After the load lock chamber 303 was opened to the atmosphere, the Si substrate 101 was taken out.

The etching depth was measured using the step gauge. It was found that the Al film was completely etched. It was observed by the scanning type electron microscope (SEM) that the lines and spaces of 0.4 μm were formed and that the side surface was not etched and excellent anisotropic fine processing was obtained (see FIG. 1E).

Example 9

In Example 9, fine processing was performed on the same material to be processed as that employed in Example 8 using the same devices as those used in Example 8 except that the latent image unit 202 shown in FIG. 10 was used on the basis of the same manufacturing steps as that of Example 8.

First, the first step was conducted in the same manner as that of Example 8 and then the second step was performed as follows.

In the second step, the Si substrate 101 with the Al film deposited thereon was placed on the material holding base 1002a of the device in the latent image unit shown in FIG.

10 in the same procedures as those of Example 6, and the latent image chamber 1003 was vacuum-evacuated to $10^{-7}$ torr or less by the vacuum-evacuation apparatus 1010.

Thereafter, oxygen introduced from the gas introducing port 1004 as the second reactive gas at a flow rate of 10 sccm was sprayed on the surface of the Al film from the gas ejecting nozzle 1026, by which the inner pressure of the latent image chamber 1003 was set to $3\times10^{-3}$ torr.

Next, an ion beam was converged on the surface of the Al film 102 in a spot having a diameter of 0.3 μm as the selectively irradiating energy by operating an ion beam generating unit 1027, i.e., by generating $A^+$ ions from the ion source 1029 and then by accelerating the generated ion beam 1031 to 2 kV by the ion optical system 1030, while the stage 1002b on which the material holding base 1002a was placed was moved two-dimensionally by the drive device 1002c synchronously with the opening/closing of the ion beam shutter (not shown), by which the latent image layer 105 made up of lines and spaces of 0.3 μm was formed without using the mask.

After irradiation, supply of the gas was stopped, and the latent image chamber 1003 was vacuum-evacuated to $10^{-7}$ torr or less. Thereafter, the gate valve 200b was opened, and the Si substrate 101 was taken out by the robot 411. The gate valve 200b was closed, and the Si substrate 101 was carried into the conveying chamber 403.

Next, the third and fourth steps were performed in the same manner as that of Example 8 to finely process the Al film. The etching depth was measured using the step gauge. It was found that the Al film was completely etched. It was observed by the scanning type electron microscope (SEM) that the lines and spaces of 0.3 μm were formed and that the side surface was not etched and excellent anisotropic fine processing was provided (see FIG. 1E).

Example 10

In Example 10, the latent image layer 105 was removed in the third step, and etching was conducted using the remaining portion as a mask in the fourth step. Fine processing was performed on the same Si substrate as that employed in Example 6 using the same devices as those of Example 6.

The active layer 103 made of silicon sulfide compound was formed on the surface of the Si substrate 101 by conducting the first step in the same manner as that of Example 6.

Next, the second step was performed in the manner described below: the Si substrate 101 with the active layer 103 formed thereon was placed on the material holding base 602 shown in FIG. 6 in the same manner as that of Example 6, and the latent image chamber 603 was vacuum-evacuated to $10^{-7}$ torr or less. Thereafter, the inner pressure of the latent image chamber 603 was set to 10 torr by introducing hydrogen into the latent image chamber 603 from the gas introducing port 604 at a flow rate of 800 sccm as the second reactive gas and by controlling the evacuation rate of the vacuum evacuation apparatus 610.

Next, a laser beam of a wavelength of 193 nm generated by the ArF excimer laser 605 was uniformly irradiated onto the mask 609 having a desired pattern as a selectively irradiating energy by the illumination optical system 614, and the pattern of the mask 609 was formed on the material to be processed 101 by the projection optical system 606. The material 101 was irradiated with such a patterned laser beam for three minutes (at an irradiation light intensity of 30 mW/cm$^2$ at the surface of the Si substrate 101), by which the latent image layer 105 was formed.

After irradiation, supply of the gas was stopped, and the latent image chamber 603 was vacuum-evacuated to $10^{-7}$ torr or less. Thereafter, the gate valve 200b was opened, and the material 101 to be processed was taken out by the robot 411. The gate valve 200b was closed, and the material 101 was moved into the conveying chamber 403.

Next, the third and fourth steps were performed in sequence. The Si substrate 101 was placed on the material holding base 702 shown in FIG. 7 in the same manner as that of Example 6, and the etching chamber 703 and the plasma chamber 715 were vacuum-evacuated to $10^{-7}$ torr or less. Thereafter, the inner pressure was set to $6\times10^{-4}$ torr by respectively introducing $Cl_2$ and $NF_3$ into the plasma chamber 715 from the gas introducing port 704 at flow rates of 30 sccm and 2 sccm and by controlling the evacuation rate of the vacuum evacuation apparatus 710.

Next, a microwave of 2.45 GHz and 400 W and a magnetic field having a flux density of 875 gauss were supplied to the plasma chamber 715 in the same manner as that described in the third step of Example 6 to generate the plasma 719a by the combination of electric fields of the microwave and the magnetic field. The material to be processed was irradiated by the plasma stream 719b for one minute for etching.

After etching, supply of the etching gases was stopped, and the etching chamber 703 and the plasma chamber 715 were vacuum-evacuated to $10^{-7}$ torr or less. Thereafter, the gate valve 200c was opened, and the Si substrate 101 was carried into the load lock chamber 303 by the robot 411. After the load lock chamber 303 was opened to the atmosphere, the Si substrate 101 was taken out.

The etched depth measured using a step gauge was 4500 Å, which was the same as that obtained in Example 6. It was observed by the scanning type electronic microscope (SEM) that a pattern reverse to that of Example 6 was etched and that the side surface portion was not etched and excellent anisotropic fine processing was provided at a high speed (see FIG. 1E).

Example 11

Fine processing was performed on the surface of the 4-inch Si substrate using the devices shown in FIGS. 2 through 4, 6, 7 and 16 on the basis of the manufacturing steps shown in FIGS. 1A to 1E.

First, the first process was conducted. According to the procedures described above in the detailed description of the preferred embodiments, the Si substrate 101, which was a material to be processed, was placed in the load lock chamber 303 shown in FIG. 3, and the chamber was vacuum-evacuated. Next, the substrate 101 was placed on the material holding base 1602 by the robot 411, and the surface activating chamber 1603 was vacuum-evacuated to $10^{-7}$ torr or less.

Next, the inner pressure of the surface activating chamber 1603 was set to 0.1 torr by introducing hydrogen sulfide ($H_2S$) into the surface activating chamber 1603 from the gas introducing port 1604 at a flow rate of 100 sccm and by controlling the evacuation rate of the vacuum-evacuation apparatus 1610. The plasma 1609 was generated by applying a high-frequency power of 300 W from the high-frequency power source 1605 to the counter electrode 1607, and the surface of the substrate 101 was exposed to the plasma for two minutes. By chemical change of the surface, the active layer 103 was formed (see FIG. 1B).

Another Si substrate subjected to the above step was taken out and the surface of the active layer 103 formed was analyzed by the ESCA method. It was found that the surface of the Si substrate 101 was changed to a silicon sulfide compound $SiS_x$. The thickness of the silicon sulfide compound was about 50 Å.

After the active layer 103 was formed, supply of the gas was stopped, and the activating chamber 1603 was vacuum-evacuated to $10^{-7}$ torr or less. Thereafter, the gate valve 200a was opened, and the material 101 to be processed was taken out by the robot 411. The gate valve 200a was closed, and the material 101 to be processed was moved into the conveying chamber 403.

Next, the second step was performed in the manner described below. First, the inner pressure of the latent image chamber 603 was vacuum-evacuated to $10^{-7}$ torr or less by the vacuum-evacuation apparatus 610 beforehand. Next, the gate valve 200b was opened, and the Si substrate 101 with the active layer 103 formed thereon was moved into the latent image chamber 603 by the robot 411 and was placed on the material holding base 602. The gate valve 200b was closed, and the latent image chamber 603 was vacuum-evacuated to $10^{-7}$ torr or less by the vacuum-evacuation apparatus 610.

Thereafter, the inner pressure of the latent image chamber 603 was set to 10 torr by introducing oxygen into the latent image chamber 603 from the gas introducing port 604 at a flow rate of 800 sccm and by controlling the evacuation rate of the vacuum evacuation apparatus 610.

Next, a laser beam of a wavelength of 248 nm and generated by the KrF excimer laser 605 was uniformly irradiated onto the mask 609 having a desired pattern by the illumination optical system 614, and the pattern of the mask 609 was formed on the material to be processed 101 by the projection optical system 606. The material 101 was irradiated by such a patterned laser beam for three minutes (at an irradiation light intensity of 50 mW/cm² at the surface of the Si substrate 101) to form the latent image layer 105 (see FIG. 1C).

Another Si substrate 101 subjected to the above-mentioned latent image layer forming step was taken out and the laser beam irradiated portion on the surface of the latent image layer 105 was analyzed by the ESCA method. It was found that the irradiated portion was changed to a silicon oxide compound $SiO_x$. The thickness of the silicon oxide compound was about 40 Å. No sulfur component was detected in the silicon oxide compound. The portion of the surface of the material 101 to be processed which was not irradiated with the laser beam was also analyzed by the ESCA method. Only the silicon sulfide compound was present in that portion.

After irradiation, supply of the gas was stopped, and the latent image chamber 603 was vacuum-evacuated to $10^{-7}$ torr or less. Thereafter, the gate valve 200b was opened, and the material 101 to be processed was taken out by the robot 411. The gate valve 200b was closed, and the material 101 was carried into the conveying chamber 403.

Next, the third step was performed. In the etching unit 203, the etching chamber 703 was vacuum-evacuated to $10^{-7}$ torr or less beforehand by the vacuum evacuation apparatus 710. The gate valve 200c was opened, and the Si substrate 101 was moved into the etching chamber 703 by the robot 411 and was placed on the material holding base 702. The gate valve 200c was closed, and the etching chamber 703 and the plasma chamber 715 were vacuum-evacuated to $10^{-7}$ torr or less by the vacuum-evacuation apparatus 710.

Thereafter, the inner pressure was set to $5 \times 10^{-3}$ torr by respectively introducing $NF_3$ and $O_2$ into the plasma chamber 715 from the gas introducing port 704 at flow rates of 30 sccm and 5 sccm and by controlling the evacuation rate of the vacuum evacuation apparatus 710.

To cool the electromagnetic coil 720 and the plasma chamber 715, a cooling water was introduced from the cooling water inlet 721 and was drained from the outlet 722. A d.c. current of 150 A was supplied to the electromagnetic coil 720 to generate a magnetic field having a magnetic flux density of 875 Gauss in the plasma chamber 715.

A microwave of 2.45 GHz and 200 W was supplied to the plasma chamber 715 so that the plasma 719a was generated by the combination of the electric field of the microwave and the magnetic field. Part of the plasma 719a was accelerated from the plasma emitting port 716 in the direction of the line of magnetic force by the diffused magnetic field and reached the surface of the material 101 to be processed in a plasma stream 719b. The surface of the substrate 101 was plasma processed for one minute by the plasma stream 719b, by which the active layer 103 was removed (see FIG. 1D).

In this process, in the portion of the active layer 103 other than the latent image layer 105, a volatile sulfur fluoride compound ($SF_x$) and a silicon fluoride compound ($SiF_x$) were formed, and only the active layer 103 composed of the silicon sulfide compound was removed.

At that time, the latent image layer 105 was also etched slightly. Another Si substrate subjected to the above step was taken out and the thickness of the latent image layer 105 was evaluated by the ESCA method. The thickness of the latent image layer 105 was 30 Å. After the active layer 103 was removed, supply of the gas was stopped, and the etching chamber 703 and the plasma chamber 715 were vacuum-evacuated to $10^{-7}$ torr or less.

In the third step, i.e., in the active layer 103 removing step, another method may also be employed. That is, the active layer 103 may be removed by taking out the Si substrate 101 outside of the apparatus and by processing that Si substrate 101 using a solution (nitric acid+hydrofluoric acid) for 15 seconds.

Next, the fourth step was performed. The inner pressure of the plasma chamber 715 was set to $6 \times 10^{-4}$ torr by respectively introducing $Cl_2$ and $NF_3$ into the plasma charger 715 at flow rates of 30 sccm and 2 sccm from the gas inlet 704 and by controlling the evacuation rate of the vacuum evacuation apparatus 710.

Next, a 2.45 GHz and 400 W microwave and a magnetic field having a magnetic flux density of 875 gauss were supplied to the plasma chamber 715 in the same manner as that in the third step to generate the plasma 719a. The plasma stream 719b was irradiated on the material 101 to be processed for one minute and the portion of the Si substrate 101 exposed to the plasma stream 719b was thereby etched using the latent image layer 105 ($SiO_x$) as a mask.

After etching, supply of the etching gases was stopped, and the etching chamber 703 and the plasma chamber 715 were vacuum-evacuated to $10^{-7}$ torr or less. Thereafter, the gate valve 200c was opened, and the Si substrate 101 was moved into the load lock chamber 303 by the robot 411. After the load lock chamber 303 was opened to the atmosphere, the Si substrate 101 was taken out.

The etched depth measured using a step gauge was 4500 Å. It was observed by the scanning type electron microscope (SEM) that the side surface was not etched and excellent anisotropic fine processing was provided (see FIG. 1E).

It took fourteen minutes for the first, second and third steps to be completed.

Comparative Example 5

To compare Example 11 with a conventional photoetching method, photoetching was conducted on the same type of Si substrate 101 as that used in Example 11 using the latent image unit 202 shown in FIG. 6 in the manner described below.

First, a non-processed Si substrate 101 was placed on the material holding base 602 located in the latent image chamber 603 through the load lock unit 204 and the conveying unit 205, and the latent image chamber 603 was vacuum-evacuated to $10^{-7}$ torr or less.

The inner pressure was set to 0.4 torr by supplying chloride into the latent image chamber 603 from the gas inlet 604 at a flow rate of 200 sccm and by controlling the evacuation rate of the vacuum evacuation apparatus 610.

Next, a laser beam having a wavelength of 248 nm and generated by the KrF excimer laser 605 was uniformly illuminated on the mask 609 having a desired pattern by the illumination optical system 614, and the pattern of the mask 609 was formed on the material to be processed 101 by the projection optical system 606. The material 101 was illuminated with such a patterned laser beam for three minutes (at an illumination light intensity of 50 mW/cm$^2$ at the surface of the Si substrate 101), by which the surface of the Si substrate was etched for 20 minutes.

After etching, the etched substrate 101 was taken out through the load lock unit 204 and the conveying unit 205, and the etched depth was measured by the step gauge. It was 1500 Å. This means that it takes one hour for the same depth (4500 Å) as that of Example 11 to be etched. It is therefore possible according to the present invention to shorten the fine processing time to about one fourth.

It was observed by the SEM that the processed surface was irregular due to irregular reflection of light and was very dirty as compared with Example 11, i.e., that the fine processing property was poor.

The fine processing time (from washing of the Si substrate to peeling off of the resist) was greatly shortened also as compared with the conventional process which employed a resist.

Example 12

In Example 12, fine processing was performed on an amorphous silicon film (a-Si of a thickness of 5000 Å) deposited on a 4-inch quartz substrate by the CVD process, using the devices shown in FIGS. 2 through 4 and 16, the device shown in FIG. 8 as the latent image unit 202 and the device shown in FIG. 11 as the etching unit 203, on the basis of the manufacturing process shown in FIG. 1.

First, the first step was conducted. The quartz substrate 101 with the a-Si film deposited thereon was placed on the material holding base 1602 as the material to be processed by the same procedures as those of Example 11, and the surface activating chamber 1603 was vacuum-evacuated to $10^{-7}$ torr or less.

Next, the inner pressure of the surface activating chamber was set to 0.07 torr by introducing hydrogen iodide (HI) into the surface activating chamber 1603 from the gas introducing port 1604 at a flow rate of 50 sccm and by controlling the evacuation rate of the vacuum-evacuation apparatus 1610. The plasma 1609 was generated by applying 400 W high-frequency power to the counter electrode from the high-frequency power source 1605, and the surface of the substrate 101 was exposed to the plasma 1609 for two minutes, by which chemical reaction took place on the surface and the activated layer 103 was thereby formed (see FIG. 1B).

Another quartz substrate subjected to the above process was taken out and the surface of the activated layer 103 formed on the surface thereof was analyzed by the ESCA method. It was found that a silicon iodide compound SiI$_x$ was formed on the surface of the substrate. The thickness of the silicon iodide compound was about 70 Å.

After the activated layer 103 was formed, the same processing as that of Example 11 was performed, and then the second step was performed.

In the second step, the quartz substrate 101 with the a-Si film deposited thereon was placed on the material holding base 802a of the device in the latent image unit 202 shown in FIG. 8 in the same procedures as those of Example 11, land the latent image chamber 603 was vacuum-evacuated to $10^{-7}$ torr or less by the vacuum-evacuation apparatus 610.

Thereafter, the inner pressure of the latent image chamber 603 was set to 10 torr by introducing oxygen and hydrogen into the latent image chamber 603 as the second reactive gas from the gas introducing port 604 at flow rates of 200 sccm and 600 sccm, respectively, and by controlling the evacuation rate of the vacuum evacuation apparatus 610.

Next, a laser beam generated by the KrF excimer laser 605 was illuminated onto the surface of the material 101 to be processed in a spot of a diameter of 10 μm by the projection optical system 806 while the intensity thereof was being limited by the shutter 823.

Also, the stage 802b on which the material holding base 802a was placed was moved two-dimensionally by the drive device 802c synchronously with the opening/closing of the shutter 823, by which the latent image layer 105 having the same pattern as that of Example 11 was formed without using the mask (see FIG. 1C).

After illumination, supply of the gas was stopped, and the latent image chamber 603 was vacuum-evacuated to $10^{-7}$ torr or less. Thereafter, the gate valve 200b was opened, and the material 101 to be processed was taken out by the robot 411. The gate valve 200b was closed, and the material 101 to be processed was carried into the conveying chamber 403.

Next, the third and fourth steps were performed in sequence using the device shown in FIG. 11 as the etching unit 203. The quartz substrate 101 with the a-Si film deposited thereon, which was subjected to the first and second processes, was moved into the etching chamber 1103 which was vacuum-evacuated to $10^{-7}$ torr or less and was placed on the material holding base 1102.

The inner pressure of the etching chamber 1103 was set to 0.3 torr by respectively introducing NF$_3$ and O$_2$ into the microwave plasma exciting device 1115 from the gas introducing port 1104 at flow rates of 500 sccm and 100 sccm. The plasma was generated within the plasma exciting chamber 1115 by supplying microwaves (2.45 GHz, 800 W) to the microwave plasma exciting device 1115, by which the activated layer 103 was removed first and then the a-Si film was etched. It took four minutes for the first and second processes to be completed.

After etching, supply of the etching gases was stopped, and the etching chamber 703 and the plasma chamber 715 were vacuum-evacuated to $10^{-7}$ torr or less. Therefore, the gate valve 200c was opened, and the quartz substrate 101 with the a-Si film deposited thereon was taken out by the robot 411. After the substrate 101 was placed in the load lock chamber 303, the load lock chamber 303 was opened to the atmosphere so as to allow the substrate to be taken out.

The etched depth measured using a step gauge was 400 Å (see FIG. 1E).

It took twelve minutes for the first, second, third and fourth steps to be completed.

Comparative Example 6

To compare Example 12 with a conventional photoetching method, photoetching was conducted on the quartz substrate 101 with the a-Si film deposited thereon in the same manner as that of Comparative Example 5 using the latent image unit 202 shown in FIG. 6. Etching time was twenty minutes.

Similarly, the etched depth was measured by the step gauge. It was 2000 Å. This means that it takes forty minutes for the same depth (4000 Å) as that of Example 11 to be etched. It is therefore possible according to the present invention to shorten the fine processing time to about one third.

It was; observed that the processed surface was irregular due to irregular reflection of light and was very dirty as compared with Example 12.

The fine processing time (from washing of the quartz substrate with the a-Si film deposited thereon to peeling off of the resist) was greatly shortened also as compared with the conventional process which employed a resist.

Example 13

In Example 13, fine processing was performed on an Al film (having a thickness of 5000 Å) formed on a 4-inch Si substrate by sputtering, using the devices shown in FIGS. 2 through 4 and 16, the device shown in FIG. 9 as the latent image unit 202 and the device shown in FIG. 7 as the etching unit, on the basis of the manufacturing process shown in FIG. 1.

First, the first step was conducted. The substrate 101 with the Al film deposited thereon was placed on the material holding base 502 as the material to be processed by the same procedures as those of Example 11. The surface activating chamber 503 was vacuum-evacuated to $10^{-7}$ torr or less.

Next, the inner pressure of the surface activating chamber 503 was set to 0.1 torr by introducing hydrogen sulfide ($H_2S$) into the surface activating chamber 503 from the gas inlet 504 at a flow rate of 100 sccm and by controlling the evacuation rate of the vacuum-evacuation apparatus 510. The plasma 509 was generated by applying 300 W high-frequency power to the counter electrode from the high-frequency power source 505, and the surface of the substrate 101 was exposed to the plasma 509 for two minutes, by which chemical reaction took place on the surface and the activated layer 103 was thereby formed (see FIG. 1B).

After the activated layer 103 was formed, the same processing as that of Example 11 was performed, and then the second process was performed.

In the second process, the Si substrate with the Al film deposited thereon was placed on the material holding base 902a in the latent image unit shown in FIG. 9 by the same procedures as those of Example 11, and the latent image chamber 903 was vacuum-evacuated to $10^{-7}$ torr or less by the vacuum-evacuation apparatus 910.

Thereafter, oxygen introduced from the gas introducing port 904 as the second reactive gas at a flow rate of 10 sccm was sprayed on the surface of the Al film from the gas ejecting nozzle 926, by which the inner pressure of the latent image chamber 903 was set to $3 \times 10^{-3}$ torr.

Next, an electron beam was converged on the surface of the Al film 102 in a spot having a diameter of 0.4 μm as the selectively illuminating energy by operating an electron beam generating unit 927, i.e., by generating electrons by the electron gun 929 and then by accelerating the generated electron beam 931 to 2 kV by the electron optical system 930, while the stage 902b on which the material holding base 902a was placed was moved two-dimensionally by the drive device 902c synchronously with the opening/closing of the electron beam shutter (not shown), by which the latent image layer 105 made up of lines and spaces of 0.4 μm was formed without using the mask.

After illumination, supply of the gas was stopped, and the latent image chamber 903 was vacuum-evacuated to $10^{-7}$ torr or less. Thereafter, the gate valve 200b was opened, and the Si substrate 101 was taken out by the robot 411. The gate valve 200b was closed, and the Si substrate 101 was carried into the conveying chamber 403.

Next, the third step was performed. The etching chamber 703 was vacuum-evacuated to $10^{-7}$ torr or less beforehand by the vacuum evacuation apparatus 710 shown in FIG. 7. The gate valve 200c was opened, and the material 101 to be processed was moved into the etching chamber 703 by the robot 411 and was placed on the material holding base 702. The gate valve 200c was closed, and the etching chamber 703 and the plasma chamber 715 were vacuum-evacuated to $10^{-7}$ torr or less by the vacuum-evacuation apparatus 710.

Thereafter, the inner pressure was set to $5 \times 10^{-3}$ torr by introducing $NF_3$ and $Cl_2$ into the plasma chamber 715 from the gas introducing port 704 each at a flow rate of 20 sccm and by controlling the evacuation rate of the vacuum evacuation apparatus 710. That is, the same process as the third process of Example 11 was performed to remove the activated layer 103 (see FIG. 1D).

After the activated layer was removed, supply of the gases was stopped, and the etching chamber 703 and the plasma chamber 715 were vacuum-evacuated to $10^{-7}$ torr or less.

Next, the fourth step was conducted. The inner pressure of the plasma chamber 715 was set to $6 \times 10^{-4}$ torr by introducing $Cl_2$ into the plasma chamber 715 at a flow rate of 30 sccm from the gas inlet 704 shown in FIG. 7 and by controlling the evacuation rate of the vacuum evacuation apparatus 710. The plasma 719a was generated in the same manner as that of Example 11, and the surface of the Al film 102 was illuminated with the plasma stream 719b for one minute for etching.

After etching, supply of the etching gas was stopped, and the etching chamber 703 and the plasma chamber 715 were vacuum-evacuated to $10^{-7}$ torr or less. Thereafter, the gate valve 200c was opened, and the Si substrate 101 was moved into the load lock unit 204 by the robot 411. After the load lock unit 204 was opened to the atmosphere, the Si substrate 101 was taken out.

The etching depth was measured using the step gauge. It was found that the Al film in the etched portion was completely removed. It was observed by the scanning type electronic microscope (SEM) that the lines and spaces of 0.4 μm were formed and that the side surface was not etched and that excellent anisotropic fine processing was obtained (see FIG. 1E).

Example 14

In Example 14, fine processing was performed on the same material to be processed as that employed in Example 13 using the same devices as those used in Example 13 except for the latent image unit 202 as well as the latent image unit 202 shown in FIG. 10 on the basis of the same manufacturing process as that of Example 13.

First, the first step was conducted in the same manner as that of Example 13 and then the second step was performed.

In the second step, the Si substrate 101 with the Al film deposited thereon was placed on the material holding base 1002a of the device in the latent image unit shown in ]FIG. 10 by the same procedures as those of Example 11, and the latent image chamber 1003 was vacuum-evacuated to $10^{-7}$ torr or less by the vacuum-evacuation apparatus 1010.

Thereafter, oxygen introduced from the gas introducing port 1004 at a flow rate of 10 sccm was sprayed on the surface of the Al film from the gas ejecting nozzle 1026, by which the inner pressure of the latent image chamber 1003 was set to $3\times10^{-3}$ torr.

Next, an ion beam was converged on the surface of the Al film 102 in a spot having a diameter of 0.3 μm by operating an ion beam generating unit 1027, i.e., by generating $Al^+$ ions from the ion source 1029 and then by accelerating the generated ion beam 1031 to 2 kV by the ion optical system 1030, while the stage 1002b on which the material holding base 1002a was placed was moved two-dimensionally by the drive device 1002c synchronously with the opening/closing of the ion beam shutter (not shown), by which the latent image layer 105 made up of lines and spaces of 0.3 μm was formed without using the mask.

After illumination, supply of the gas was stopped, and the latent image chamber 1003 was vacuum-evacuated to $10^{-7}$ torr or less. Thereafter, the gate valve 200b was opened, and the Si substrate 101 was taken out by the robot 411. The gate valve 200b was closed, and the Si substrate 101 was carried into the conveying chamber 403.

Next, the third and fourth processes were performed in the same manner as that of Example 13 to finely process the Al film. The etching depth was measured using the step gauge. It was found that the Al film in the etched portion was completely removed. It was observed by the scanning type electronic microscope (SEM) that the lines and spaces of 0.3 μm were formed and that the side surface was not etched and excellent anisotropic fine processing was provided (see FIG. 1E).

Example 15

In Example 15, the latent image layer 105 was removed in the third process, and etching was conducted using the remaining portion as a mask in the fourth process. Fine processing was performed on the same type of Si substrate as that employed in Example 11 using the same devices as those of Example 11.

The activated layer 103 made of silicon sulfide compound was formed on the surface of the Si substrate 101 by conducting the first step in the same manner as that of Example 11.

Next, the second step was performed in the manner described below: the Si substrate 101 with the activated layer 103 formed thereon was placed on the material holding base 602 in the same manner as that of Example 11, and the latent image chamber 603 was vacuum-evacuated to $10^{-7}$ torr or less. Thereafter, the inner pressure of the latent image chamber 603 was set to 10 torr by introducing hydrogen into the latent image chamber 603 from the gas introducing port 604 at a flow rate of 800 sccm and by controlling the evacuation rate of the vacuum evacuation apparatus 610.

Next, a laser beam of a wavelength of 193 nm generated by the ArF excimer laser 605 was uniformly illuminated onto the mask 609 having a desired pattern as a selectively illuminating energy by the illumination optical system 614, and the pattern of the mask 609 was formed on the material to be processed 101 by the projection optical system 606. The material 101 was illuminated with such a patterned laser beam for three minutes (at an illumination light intensity of 30 mW/cm$^2$ at the surface of the Si substrate 101), by which the latent image layer 105 was formed.

After illumination, supply of the gas was stopped, and the latent image chamber 603 was vacuum-evacuated to $10^{-7}$ torr or less. Thereafter, the gate valve 200b was opened, and the material 101 to be processed was taken out by the robot 411. The gate valve 200b was closed, and the material 101 was moved into the conveying chamber 403.

Next, the third and fourth steps were performed in sequence. The Si substrate 101 was placed on the material holding base 702 shown in FIG. 7 in the same manner as that of Example 11, and the etching chamber 703 and the plasma chamber 715 were vacuum-evacuated to $10^{-7}$ torr or less. Thereafter, the inner pressure was set to $6\times10^{-4}$ torr by respectively introducing $Cl_2$ and $NF_3$ into the plasma chamber 715 from the gas introducing port 704 at flow rates of 30 sccm and 2 sccm and by controlling the evacuation rate of the vacuum evacuation apparatus 710.

Next, a microwave of 2.45 GHz and 400 W and a magnetic field having a flux density of 875 gauss were supplied to the plasma chamber 715 in the same manner as that described in the third step of Example 11 so as to generate the plasma 719a by the combination of electric fields of the microwave and the magnetic field. The material to be processed was illuminated by the plasma stream 719b for one minute for etching.

After etching, supply of the etching gases was stopped, and the etching chamber 703 and the plasma chamber 715 were vacuum-evacuated to $10^{-7}$ torr or less. Thereafter, the gate valve 200c was opened, and the Si substrate 101 was carried into the load lock chamber 204 by the robot 411. After the load lock chamber 204 was opened to the atmosphere, the Si substrate 101 was taken out.

The etched depth measured using a step gauge was 4500 Å, which was the same as that obtained in Example 11. It was observed by the scanning type electronic microscope (SEM) that a pattern reverse to that of Example 11 was etched and that the side of the etched portion was not etched. That is, excellent anisotropic fine processing was obtained at a high speed (see FIG. 1E).

Example 16

In Example 16, a Cu thin film patterning was conducted on the surface of a Si substrate. In Example 16, a latent image was formed by illuminating light in the first step, and a thin film was formed by electrolytic plating in the second step.

The first step was first performed using the latent image forming device shown in FIG. 6. The gate valve 200b was opened, and the Si substrate 101 was introduced into the latent image chamber 603 and placed on the sample holding base 602. The gate valve 200b was closed, and the latent image chamber 603 was vacuum-evacuated to $10^{-7}$ torr or less by the vacuum-evacuating apparatus 610. Oxygen was introduced into the latent image chamber 603 from the gas inlet 604 at a flow rate of 800 sccm, and the evacuation rate of the vacuum-evacuating apparatus 610 was controlled such that the inner pressure of the latent image chamber 603 was 10 torr. Next, a laser beam having a wavelength of 248 nm and generated by the KrF excimer laser 605 was uniformly illuminated on the mask 609 having a desired pattern by the illumination optical system 614, and the patterned image of the mask 609 was formed on the substrate 101 by the projection optical system 606. The surface of the substrate 101 was illuminated with light for 10 minutes (at an illumination light intensity of 100 mW/cm² at the surface of the substrate 101) so as to form the latent image layer 2101 (see FIG. 17A). After illumination, supply of the gas was stopped, and the latent image chamber 603 was vacuum-evacuated to $10^{-7}$ torr or less. Thereafter, nitrogen gas was introduced into the latent image chamber 603 to open it to the atmosphere, the gate valve 200b was opened, and the Si substrate with the latent image layer 2101 formed thereon was taken out.

Next, the second step was conducted using the plating device shown in FIG. 18. The solution 2314, composed of 1 liter of copper sulfate ($CuSO_4$-$5H_2O$) 100 g/l, 1 liter of copper (Cu) 25 g/l and 1 liter of sulphuric acid ($H_2SO_4$) 100 g/l, was filled in the solution tank 2305. Electrolytic plating was conducted while the solution was being stirred by applying a d.c. current at a cathode current density of 20 mA/cm² from the d.c. power source using the Si substrate and the Pt plate as the cathode 2307 and the anode 2306. After electrolytic plating was performed at the room temperature (25° C.) for five minutes, the substrate was taken out and observed. The Si substrate had no latent image layer but had a Cu film formed thereon in a thickness of 5000 Å. That is, a fine structure made up of a Cu film having a desired pattern was obtained.

Example 17

In Example 17, a Cu thin film patterning was conducted on the surface of a Fe film on the Si substrate. This example consists of the first step in which a latent image was formed by illuminating light, and the second step in which a thin film was formed by electrolysis plating.

The first step was first performed using the latent image forming device shown in FIG. 8. The Si substrate 101 with a 3000 Å Fe film formed thereon by sputtering was placed on the sample holding base 802a in the same manner as that of Example 16, and the gate valve 200b was closed. The latent image chamber 603 was vacuum-evacuated to $10^{-7}$ torr or less by the vacuum-evacuating apparatus 610. The inner pressure of the latent image chamber 603 was set to $10^{-7}$ torr by introducing $NO_2$ into the latent image chamber 603 from the gas introducing port 604 at a flow rate of 800 sccm and by controlling the evacuation rate of the vacuum evacuation apparatus 610. Next, a laser beam generated by the KrF excimer laser was illuminated onto the surface of the substrate 101 in a spot of a diameter of 30 μm by the projection optical system 806 while the intensity thereof was being limited by the shutter 823. Also, the stage 802b on which the material holding base 802a was placed was moved two-dimensionally by the drive device 802c synchronously with the opening/closing of the shutter 823, by which the latent image layer 2101 having the same pattern as that of Example 16 was formed without using the mask (see FIG. 14). The composition of the latent image layer was iron oxide. After illumination, supply of the gas was stopped, and the latent image chamber 603 was vacuum-evacuated to $10^{-7}$ torr or less. Thereafter, nitrogen gas was introduced into the latent image chamber 603 to increase the inner pressure to the atmospheric pressure, the gate valve 200b was opened, and the Si substrate having a Cr film in which the latent image layer 101 was formed was taken out.

Next, the second step was conducted using the plating device shown in FIG. 18. The plating liquid 2314 having the same composition as that employed in Example 16 was filled in the solution tank 2305, and the Si substrate 101 having a Fe film in which the latent image was formed was immersed into the plating liquid 2314 (in this example, since electrolysis plating was conducted, neither an anode nor a cathode was used). Next, the solution was heated to 50° C. and left for a while. The substrate was taken out and observed. The Si substrate had no latent image layer but had a Cu film formed on the Fe film in a thickness of 1000 Å. That is, a fine structure made up of a Cu film having a desired pattern was obtained.

Example 18

In Example 18, a Ni thin-film patterning was performed in the surface of a Ta film formed on the Si substrate. This example consists of the first step in which a latent image was formed by illuminating an electron beam, and the second step in which a thin film was formed by electrolytic plating.

The first step was first performed using the latent image forming device shown in FIG. 9. The Ta substrate 101 with a 3000 Å Fe film formed thereon by sputtering was placed on the sample holding base 902a in the same manner as that of Example 16, and the gate valve 200b was closed. The latent image chamber 903 was vacuum-evacuated to $10^{-7}$ torr or less by the vacuum-evacuating apparatus 910. Oxygen introduced from the gas introducing port 904 at a flow rate of 10 sccm was sprayed onto the surface of the Cr film from the gas ejecting nozzle 2521, by which the inner pressure of the latent image chamber 903 was set to $3 \times 10^{-3}$ torr. Next, an electron beam was converged on the surface of the Ta film in a spot having a diameter of 0.4 μm by operating the electron beam generating unit 927, i.e., by generating electrons by the electron gun 929 and then by accelerating the generated electron beam 931 to 2 kV by the electron optical system 930, while the stage 902b on which the material holding base 902a was placed was moved two-dimensionally by the drive device 902c synchronously with the opening/closing of the electron beam shutter (not shown), by which the latent image layer 2101 having a desired pattern was formed without using the mask. The composition of the latent image layer was tantalum oxide. After illumination, supply of the gas was stopped, and the latent image chamber 903 was vacuum-evacuated to $10^{-7}$ torr or less. Thereafter, nitrogen gas was introduced into the latent image chamber 903 to open it to the atmosphere, the gate valve 200b was opened, and the Si substrate :having a Ta film in which the latent image layer 2101 was formed was taken out.

Next, the second step was conducted using the plating device shown in FIG. 18. The plating solution 2314, composed of 1 liter of nickel sulfate ($NiSO_4$.$6H_2O$) 240 g/l, 1 liter of nickel chloride ($NiCl_2$.$6H_2O$) 45 g/l, and 1 liter of boric acid ($H_3BO_3$) 35 g/l, was filled in the solution tank 2305. Electrolytic plating was conducted while the solution was being stirred by applying a d.c. current at a cathode current density of 40 mA/cm² from the d.c. power source using the Si substrate having the Ta film in which the latent image was formed and the Pt plate as the cathode 2307 and the anode 2306. After electrolytic plating was performed at the solution temperature of 45° C. for ten minutes, the substrate was taken out and observed. The Si substrate had no latent image layer but had a Cu film formed on the Ta film in a thickness of 5000 Å. That is, a fine structure made up of a Cu film having a desired pattern was obtained.

Example 19

In Example 19, a Cu thin film patterning was conducted on the surface of a Si substrate. Example 19 consists of the first step in which a latent image was formed by illuminating an ion beam, and the second step in which a thin film was formed by electrolytic plating.

The first step was first performed using the latent image forming device shown in FIG. 10. The Si substrate 101 was placed on the sample holding base 1002a in the same manner as that of Example 1, and the gate valve 200b was closed. The latent image chamber 1003 was vacuum-evacuated to $10^{-7}$ torr or less by the vacuum-evacuating apparatus 1010. Oxygen introduced from the gas introducing port 1004 at a flow rate of 10 sccm was sprayed onto the surface of the Si substrate from the gas ejecting nozzle 1026, by which the inner pressure of the latent image chamber 1003 was set to $3\times10^{-3}$ torr. Next, an ion beam was converged on the surface of the Si substrate 101 in a spot having a diameter of 0.3 μm by operating the ion beam generating unit 1027, i.e., by generating $Si^+$ ions from the ion source 1029 and then by accelerating the generated ion beam 1031 to 2 kV by the ion optical system 1030, while the stage 1002b on which the material holding base 1002a was placed was moved two-dimensionally by the drive device 1002c synchronously with the opening/closing of the ion beam shutter (not shown), by which the latent image layer 2101 having a desired pattern was formed without using the mask. After illumination, supply of the gas was stopped, and the latent image chamber 1003 was vacuum-evacuated to $10^{-7}$ torr or less. Thereafter, nitrogen gas was introduced into the latent image chamber 1003 so as to open it to the atmosphere, the gate valve 200b was opened, and the Si substrate 101 with the latent image layer 2101 formed thereon was taken out.

Next, the second step was conducted using the plating device shown in FIG. 18. The solution 2314, composed of 1 liter of copper sulfate ($CuSO_4\text{-}5H_2O$) 100 g/l, 1 liter of copper (Cu) 25 g/l and 1 liter of sulphuric acid ($H_2SO_4$) 100 g/l, was filled in the solution tank 2305. Electrolytic plating was conducted while the solution was being stirred by applying a d.c. current at a cathode current density of 20 mA/cm² from the d.c. power source using the Si substrate and the Pt plate as the cathode 2307 and the anode 2306. After electrolytic plating was performed at the room temperature (25° C.) for five minutes, the substrate was taken out and observed. The Si substrate had no latent image layer but had a Cu film formed thereon in a thickness of 5000 Å. That is, a fine structure made up of a Cu film having a desired pattern was obtained.

Example 20

FIGS. 19A through 19G are schematic cross-sectional views of a substrate, illustrating the step flow of the method of forming an etching pattern on the surface of a Si substrate.

FIGS. 20 through 23 and 14 are respectively schematic cross-sectional views of a cleaning chamber 3200, a sputtering film forming chamber 3300, a plasma film forming chamber 3400, an etching chamber 3500 and a surface modifier (latent image) chamber 3600.

Figure 20:
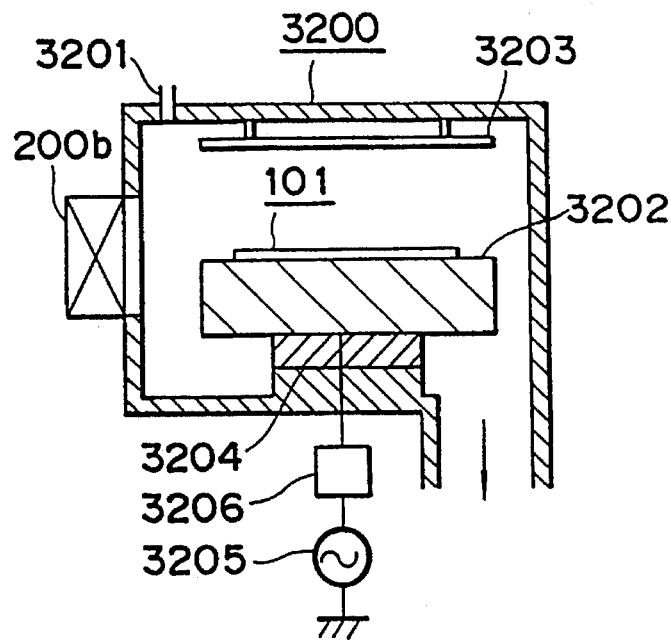
FIG. 20 schematically illustrates a cleaning apparatus.

In FIG. 20, reference numeral 3201 denotes a gas inlet provided in the upper portion of the cleaning chamber 3200 to introduce a cleaning gas into the cleaning chamber 3200; 3202, a substrate holding base for holding a substrate placed in the cleaning chamber 3200; 3203, a counter electrode which opposes the holding base 3202; 3204, an insulator for providing insulation of the holding base 3202 against the vacuum container which constitutes the cleaning chamber; 3205, a high-frequency power source of 13.56 MHz and 200 W, connected to the holding base 3202; 3206, a matching box for connecting the holding base 3202 to the high-frequency power source 3205 in such a way that the maximum transfer of energy occurs therebetween; and 200b, a gate valve.

Figure 21:
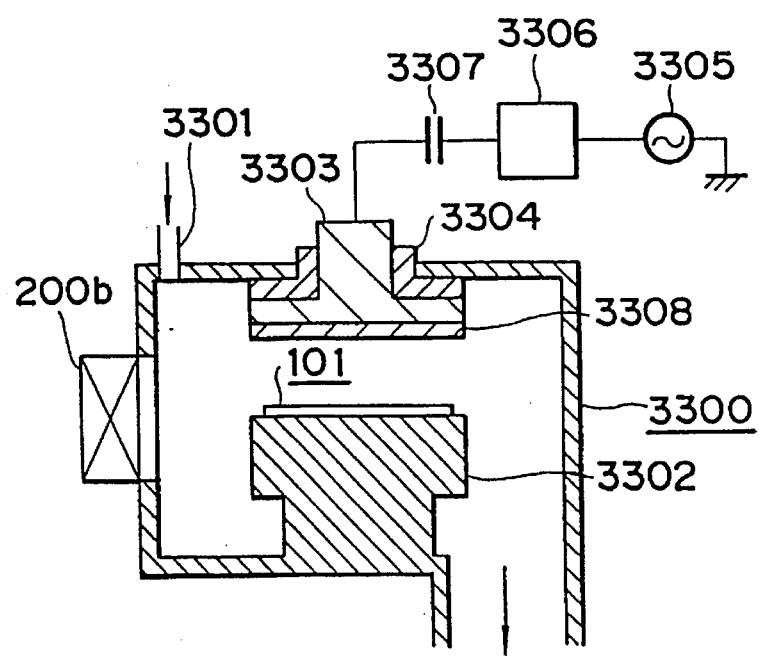
FIG. 21 schematically illustrates a sputter film forming chamber.

In FIG. 21, reference character 3201 denotes a gas inlet through which a sputtering gas is introduced into the sputtering film forming chamber 3300; 3302, a holding base for holding a substrate 1 placed in the sputtering film forming chamber 3300; 3303, a counter electrode provided in opposed relation to the holding base 3302 to apply high-frequency power thereto; 3304, an insulator for providing insulation of the opposed electrode 3303 against the vacuum container which constitutes the sputtering film forming chamber 3300; 3305, a high-frequency power source of 13.56 MHz and 500 W; 3306, a matching box for connecting the holding base 3302 to the high-frequency power source 3305 in such a way that the maximum transfer of energy occurs therebetween; 3307, a capacitor for providing d.c. insulation of the counter electrode 3304; 3308, a sputtering target; and 200b, a gate valve.

Figure 22:
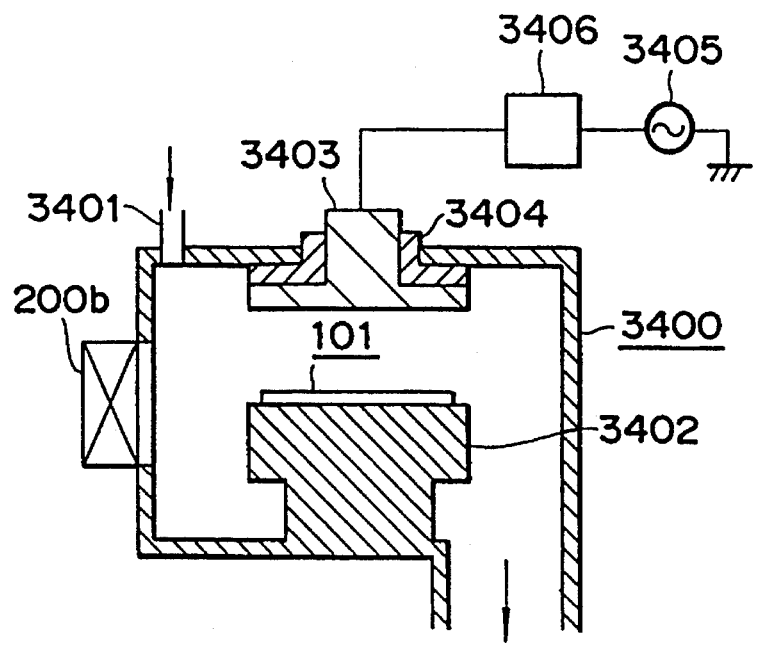
FIG. 22 schematically illustrates a plasma film forming chamber.

In FIG. 22, reference character 3401 denotes a gas inlet through which a deposition gas is introduced into the plasma film forming chamber 3400; 3402, a holding base for holding a substrate 101 placed in the plasma film forming chamber 3400; 3403, a counter electrode provided in opposed relation to the holding base 3402 to apply high-frequency power thereto; 3404, an insulator for providing insulation of the opposed electrode 3403 against the vacuum container which constitutes the plasma film forming chamber 3400; 3405, a high-frequency power source of 13.56 MHz and 350 W; 3406, a matching box for connecting the holding base 3402 to the high-frequency power source 3405 in such a way that the maximum transfer of energy occurs therebetween; and 200b, a gate valve.

Figure 23:
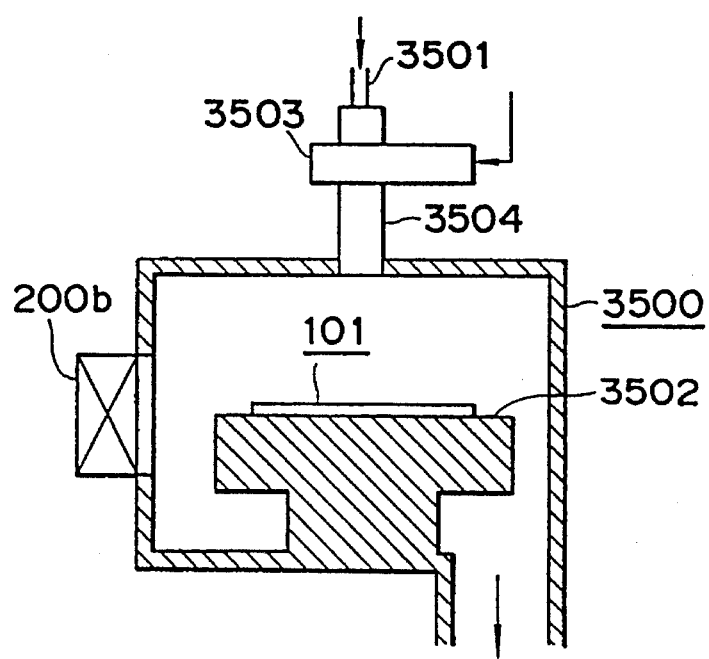
FIG. 23 schematically illustrates an etching chamber.

In FIG. 23, reference character 3502 denotes a holding base for holding the substrate 101 placed in the etching chamber 3500; 3503, a microwave plasma gas exciting device for generating an excitation gas supplied to the etching chamber 3500; 3501, a gas inlet through which an etching gas is supplied to the microwave plasma gas exciting device 3503; 3504, a transfer pipe provided in opposed relation to the holding base 3502 so that the excitation gas generated by the microwave plasma gas exciting device 3503 is transferred to the etching chamber 3500; and 200b, a gate valve.

Figure 14:
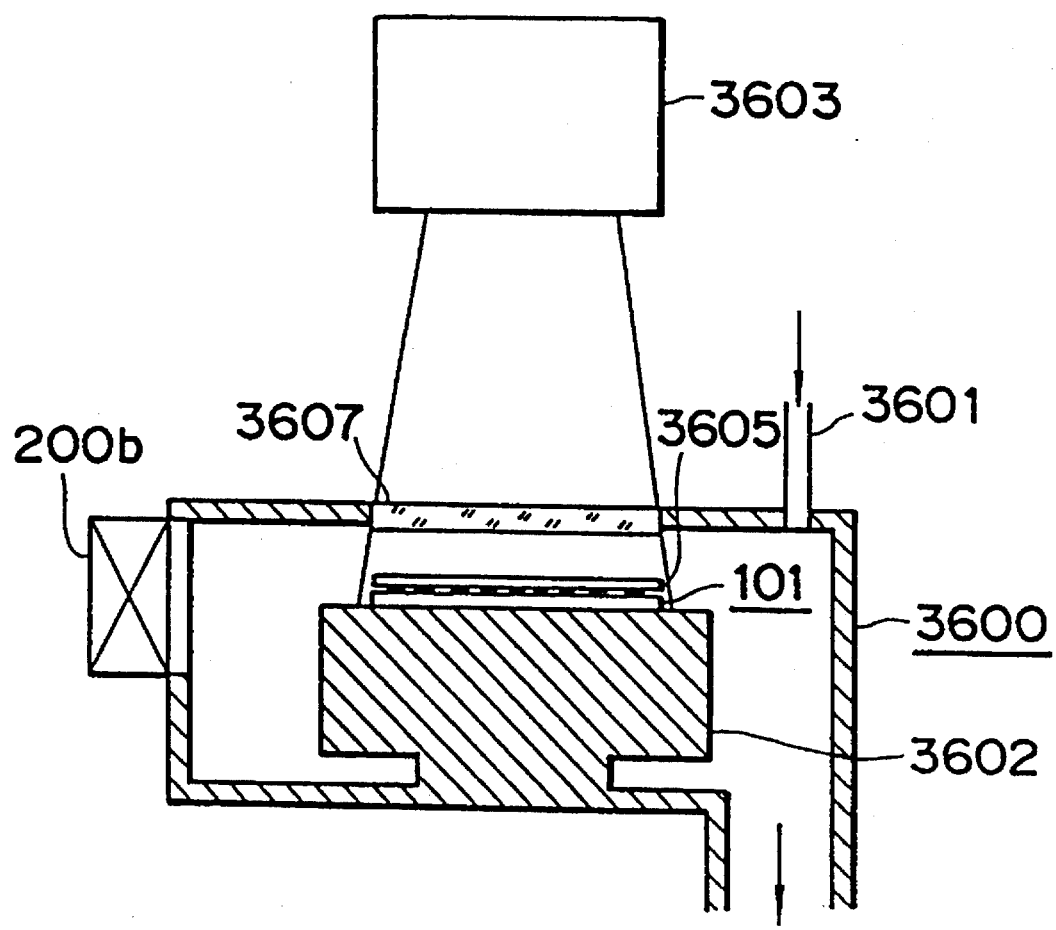
FIG. 14 is a schematic sectional view of a latent image forming unit.

In FIG. 14, reference character 3601 denotes a gas inlet through which a modifier gas is introduced into the latent image chamber 3600; 3602, a holding base for holding the substrate 101 placed in the latent image chamber 3600; 3603, a low-pressure mercury lamp which is the light source; 3604, an illumination optical system for illuminating the quartz plate with the light generated by the light source 3603 through a Cr patterned mask (or a reticle); 3606, a projection optical system for forming the mask pattern onto the surface of the substrate 101; 3607, a window through which the light emitting from the projection optical system 3606 is introduced into the latent image chamber 3600; and 200b, a gate valve. In each of the aforementioned chambers, the light source 3603, the illumination optical system 3604, the mask 3605, the projection optical system 3606 and the latent image chamber 3600 are provided in the upper portion of the chamber.

The step flow of Example 20 will now be described with reference to FIGS. 19, 20, 22, 23 and 14.

In this example Si substrate was used as the substrate 101.

First, surface cleaning was performed in the cleaning chamber shown in FIG. 20 in the manner described below: the substrate 101 was placed on the holding base 3202, and the cleaning chamber 3200 was vacuum-evacuated to $10^{-7}$ torr or less by the vacuum-evacuating apparatus (not shown). A surface cleaning gas, e.g., Ar, was introduced into the cleaning chamber 3200 from the gas inlet 3201 at a flow rate of 50 sccm, and the evacuation rate of the vacuum-evacuation apparatus (not shown) was controlled such that the inner pressure of the cleaning chamber 3200 was 0.08 torr. Next, a high-frequency voltage of 13.56 MHz and 100 W was applied to the holding base 3202 with the matching box 3206 being adjusted so as to generate a plasma in a space between the holding base 3202 and the counter electrode 3203. Since the holding base 3202 was d.c. insulated by a capacitor (not shown) of the matching box 3206, a negative d.c. bias voltage of about −60 V was generated between the holding base 3202 and the counter electrode 3203 due to a difference in the mobility between electrons and ions, accelerating Ar ions. The accelerated Ar ions collided against the surface of the Si substrate 101, and by physical sputtering removed the dirt present on the surface thereof. The process time lasted about 60 seconds.

Figure 19A:
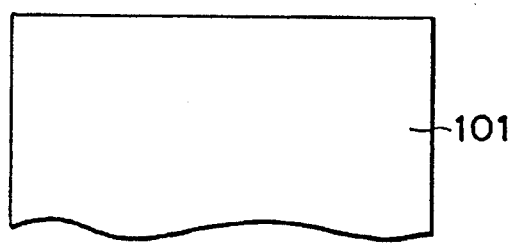
FIGS. 19A to 19G illustrate steps of a fine processing method according to another embodiment of the present invention.
Figure 19B:
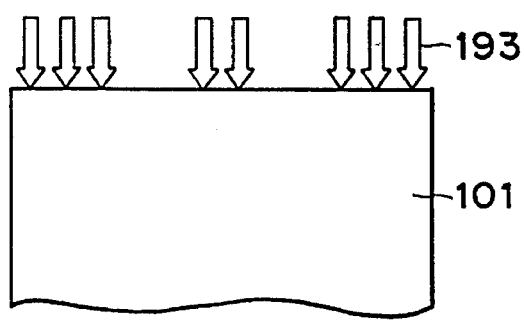
Figure 19C:
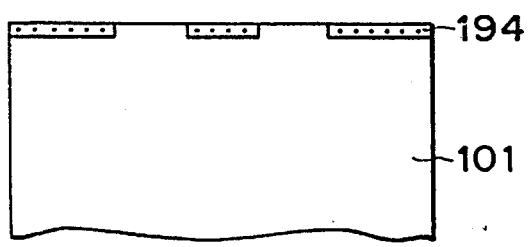

Next, selective illumination in a modifier gas was performed using the latent image chamber 3600 to partially form a surface modifying layer on the surface of the Si substrate 101 (see FIG. 19B). In this case, a $SiO_2$ film which will be used as a protective film (etching mask) in the subsequent etching process was formed in the manner described below: the Si substrate 101 was placed on the holding base 3602 and the latent image chamber 3600 was vacuum-evacuated to $10^{-7}$ torr or less by the vacuum-evacuating apparatus (not shown). $O_2$ gas was introduced into the latent image chamber from the gas inlet 3601, and the vacuum-evacuating apparatus was controlled such that the inner pressure of the latent image chamber was 760 torr. The surface of the Si substrate 101 was illuminated with the ultraviolet radiation of the low-pressure mercury lamp serving as the light source 3603 through the mask 3605 placed on the substrate 101. The window 3607 made of quartz was used because it passed ultraviolet radiation therethrough without absorbing it. On the surface of the Si substrate 101 on which the mask image was formed, Si illuminated with the light chemically reacted with oxygen. Thus, exposure to the light for ten minutes formed a protective film 194 of $SiO_2$ partially on the surface of the Si substrate in a thickness of 17.5 Å, as shown in FIG. 19C. Since this chemical reaction did not occur on the portion of the surface which was not illuminated with the light, a negative pattern of a mask was formed on the surface of the Si substrate. In other words, Si was modified into $SiO_2$, and a latent image was thereby formed.

Figure 24:
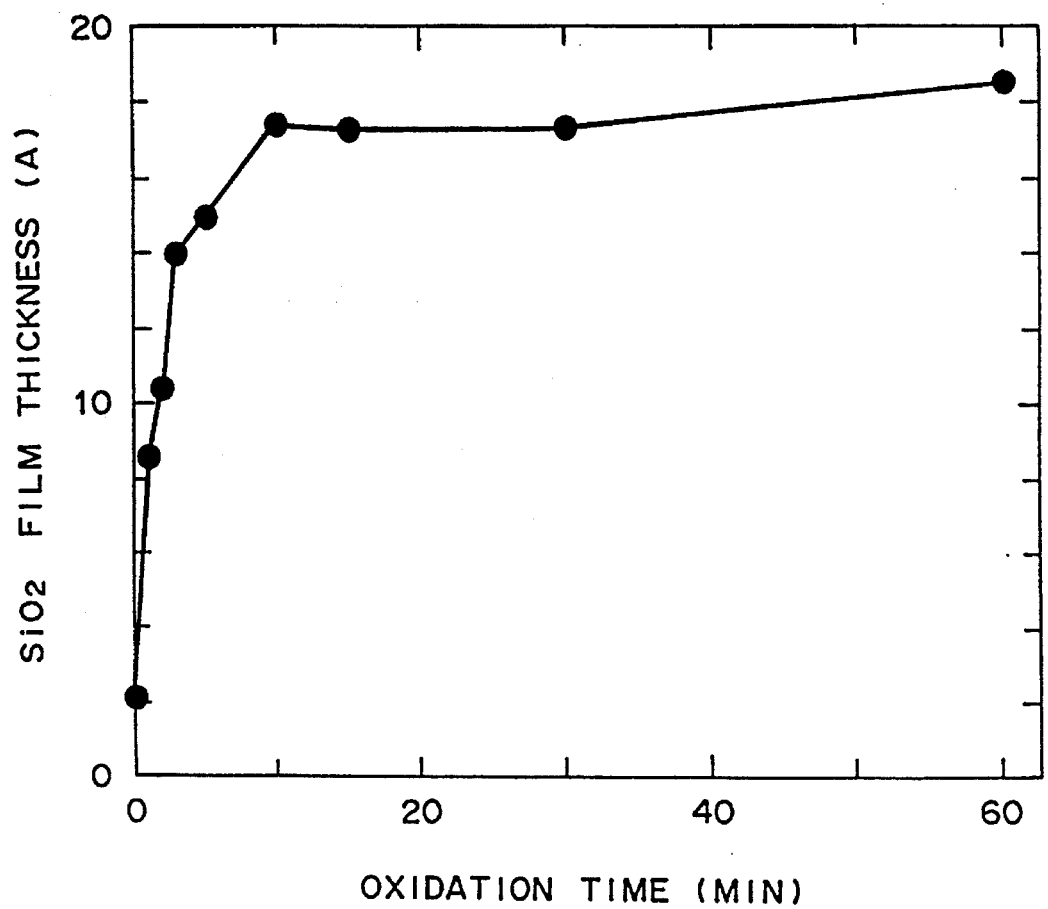
FIG. 24 is a graph showing dependence of an $SiO_2$ film thickness on oxidation time.

FIG. 24 is a graph illustrating the relation between the thickness of $SiO_2$ film and the oxidation time. As can be seen from FIG. 24, the growth rate when the oxidation time is less than 10 minutes greatly differs from that when the oxidation time is more than 10 minutes. That is, oxidation progresses fast in the first ten minutes, and slows down thereafter. In this Example, for the purpose of effectively utilizing the fast oxidation rate of the first ten minutes, the surface modifying (oxidation) time was set to ten minutes.

Figure 19D:
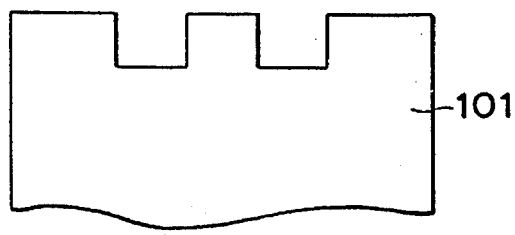

Subsequently, chemical dry etching was conducted on the sample using the etching chamber 3500 shown in FIG. 23 in the manner described below: the substrate 101 was placed on the holding base 3502, and the etching chamber 3500 was vacuum-evacuated to $10^{-7}$ torr or less by the vacuum-evacuating apparatus (not shown). $CF_4+O_2$ was introduced into the microwave plasma gas exciting device 3503 from the gas inlet 3501, and the vacuum-evacuation apparatus (not shown) was controlled such that the inner pressure of the etching chamber 3500 was 0.25 torr. Microwaves of 2.45 GHz and 700 W generated by a microwave generating device (not shown) were supplied to the microwave plasma gas exciting device 3503 to generate a plasma of the etching gas. The excitation seeds excited by the plasma were supplied to the surface of the substrate 101 through the transfer pipe 3504 made of quartz and having the overall length of 20 cm and an inner diameter of 40 mm until the $SiO_2$ film serving as the etching mask disappeared. The etching time lasted 20 seconds. In that case, since the etching selective ratio of Si relative to the $SiO_2$ film 194 serving as the etching mask of the Si substrate 101 shown in FIG. 19C was 100, the aforementioned etching process did not provide sufficient etching depth of the Si substrate 101, as shown in FIG. 19D.

Figure 19E:
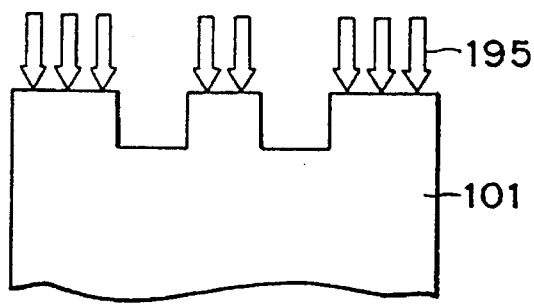
Figure 19F:
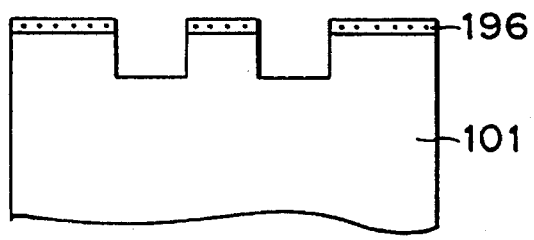

Hence, the etching mask forming process was conducted again on the surface of the Si substrate 101 in the latent image chamber 3600 shown in FIG. 14 under the same conditions as those of the previous surface modified layer forming process by illuminating ultraviolet radiation 195 on the surface thereof for ten minutes, as shown in FIG. 19E, to form a $SiO_2$ 196 of 17.5 Å at the same position of the Si substrate 101 as that of the previous process (FIG. 19F).

Figure 19G:
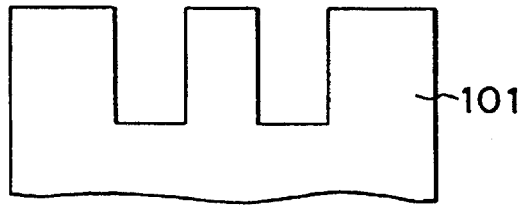

Thereafter, etching was conducted on this sample in the etching chamber 3500 shown in FIG. 23 under the same conditions as those of the previous etching process to form an etching pattern having a sufficient depth, as shown in FIG. 19G. This second etching lasted 20 seconds. In this Example, to form a $SiO_2$ film having a thickness of 35 Å in total, surface modification was conducted twice, each lasted ten minutes. If surface modification is conducted once to form such a $SiO_2$ film, it will last three hours.

Thus, fine processing could be performed more practically in this Example.

Example 21

FIGS. 25A through 25H are schematic cross-sectional views illustrating the process flow when an Al electrode pattern is formed on the quartz substrate 101.

The process flow of Example 21 will now be described with reference to FIGS. 20, 21, 23 and 6.

In this Example, the quartz plate 101 was placed on the holding base 3302 of the sputtering film forming chamber 3300 shown in FIG. 21, and the sputtering film forming chamber 3300 was vacuum-evacuated to $10^{-7}$ torr or less by the vacuum-evacuating apparatus (not shown). Ar was introduced into the sputtering film forming chamber 3300 from the gas inlet 3301, and the evacuation rate of the vacuum-evacuation apparatus (not shown) was controlled such that the inner pressure of the cleaning chamber 3300 was 0.5 torr. Next, a high-frequency voltage of 13.56 MHz and 500 W was applied to the counter electrode 3303 while the matching box 3306 was being adjusted so as to generate a plasma in a space between the holding base 3302 and the counter electrode 3303. Consequently, the introduced gas was plasma decomposed and the aluminum target mounted on the counter electrode 3303 as a sputtering target was sputtered to deposit on the quartz plate 101 a film 182 of Al having a thickness of 6000 Å.

Thereafter, surface cleaning was conducted on the quartz plate 101 in the cleaning chamber shown in FIG. 20 in the manner described below: the quartz plate 101 was placed on the holding base 3202, and the cleaning chamber 3200 was vacuum-evacuated to $10^{-7}$ torr or less by the vacuum-evacuating apparatus (not shown). A surface cleaning gas, e.g., Ar, was introduced into the cleaning chamber 3200 from the gas inlet 3201 at a flow rate of 50 sccm, and the evacuation rate of the vacuum-evacuation apparatus (not shown) was controlled such that the inner pressure of the cleaning chamber 3200 was 0.08 torr. Next, a high-frequency voltage of 13.56 MHz and 100 W was applied to the holding base 3202 while the matching box 3206 was being adjusted so as to generate a plasma in a space between the holding base 3202 and the counter electrode 3:2,03. Since the holding base 3202 was d.c. insulated by a capacitor (not shown) of the matching box 3206, a negative d.c. bias voltage of about −60 V was generated between the holding base 3202 and the counter electrode 3203 due to a difference in the mobility between electrons and ions, accelerating Ar ions. The accelerated Ar ions collided against the surface of the film to be etched 182, and by physical sputtering removed the dirt present on the surface thereof. The process time lasted about 60 seconds.

Figure 25A:
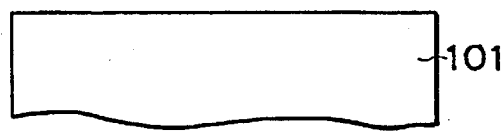
FIGS. 25A to 25H illustrate steps of a fine processing method according to still another embodiment of the present invention.
Figure 25E:
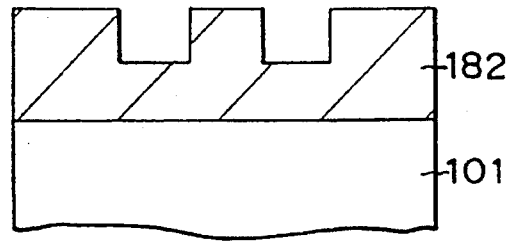
Figure 25B:
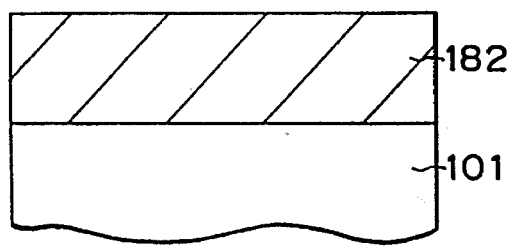

Next, selective illumination in a modifier gas was performed using the latent image chamber 603 shown in FIG. 6 to partially form a surface modifying layer on the surface of the film to be etched 182. In this case, an AlOx film which will be used as a protective film (etching mask) in the subsequent etching process was formed in the manner described below: the quartz substrate 101 was placed on the holding base 602 and the latent image chamber 603 was vacuum-evacuated to $10^{-7}$ torr or less by the vacuum-evacuating apparatus (not shown). $NO_2$ gas was introduced into the latent image chamber 603 from the gas inlet 604, and the vacuum-evacuating apparatus was controlled such that the inner pressure of the latent image chamber 603 was 1 torr. A laser beam of a wavelength of 248 nm oscillated by the KrF excimer laser serving as the light source 605 was uniformly illuminated on the mask 609 by the illumination optical system 614, and the patterned mask image was formed on the surface of the Al film through the window 607 by the projection optical system 606 (FIG. 25C). The window 607 made of quartz was used because it passed the laser beam having a wavelength of 248 nm therethrough without absorbing it. On the surface of the film 182 to be etched 101 on which the mask image was formed, Al illuminated with the light 183 photochemically reacted with $NO_2$. Thus, exposure to the light for ten minutes formed a first protective film 184 of AlOx partially on the surface of the film 182 to be etched in a thickness of 15 Å, as shown in FIG. 25D. Since this chemical reaction did not occur on the portion of the surface which was not illuminated with the light, a negative pattern of a mask was formed on the surface of the film 182 to be etched. In other words, Al was modified into AlOx, and a latent image was thereby formed.

Subsequently, chemical dry etching was conducted on the sample using the etching chamber 3500 shown in FIG. 23 in the manner described below: the quartz substrate 101 was placed on the holding base 3502, and the etching chamber 3500 was vacuum-evacuated to $10^{-7}$ torr or less by the vacuum-evacuating apparatus (not shown). $Cl_2$ was introduced into the microwave plasma gas exciting device 3503 from the gas inlet 3501 at a flow rate of 500 sccm, and the vacuum-evacuation apparatus (not shown) was controlled such that the inner pressure of the etching chamber 3503 was 0.2 torr. Microwaves of 2.45 GHz and 700 W generated by a microwave generating device (not shown) were supplied to the microwave plasma gas exciting device 3503 to generate a plasma of the etching gas. The excitation molecules $Cl_2$ and Cl excited by the plasma were supplied to the surface of the substrate 101 through the transfer pipe 3504 made of quartz and having the overall length of 20 cm and an inner diameter of 40 mm until the AlOx film serving as the etching mask disappeared. The etching time lasted 3 minutes. In that case, since the etching selective ratio relative to the AlOx film 184 serving as the etching mask of the Al film 182 shown in FIG. 25D was 150, the aforementioned etching process did not provide sufficient etching depth of the Al film 182, as shown in FIG. 25E.

Figure 25F:
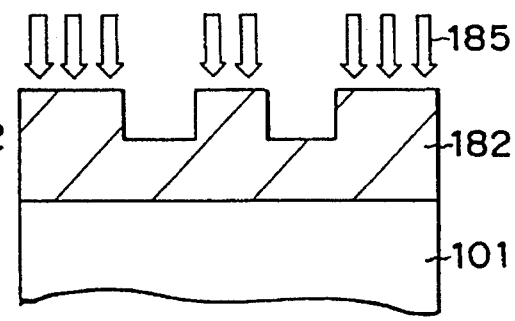
Figure 25C:
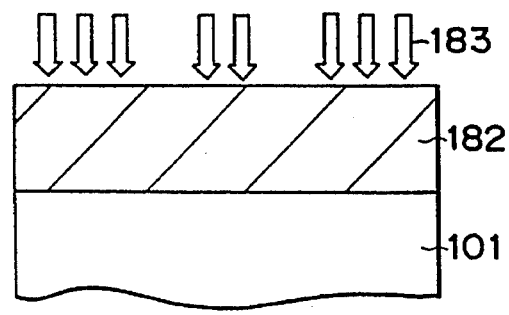
Figure 25G:
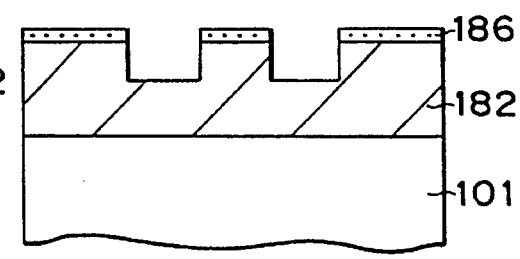
Figure 25D:
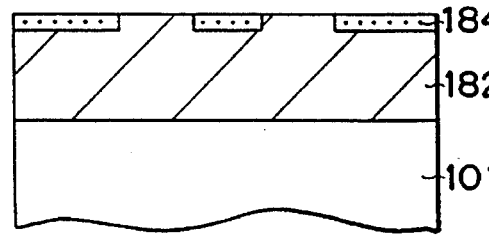

Hence, the etching mask forming process was conducted again on the surface of the film 182 to be etched in the latent image chamber 603 shown in FIG. 6 under the same conditions as those of the previous surface modified layer forming process by illuminating light 185 on the surface thereof for ten minutes, as shown in FIG. 25F, to form an AlOx film 186 of 15 Å at the same position of the film 182 to be etched as that of the previous process (FIG. 25G).

Figure 25H:
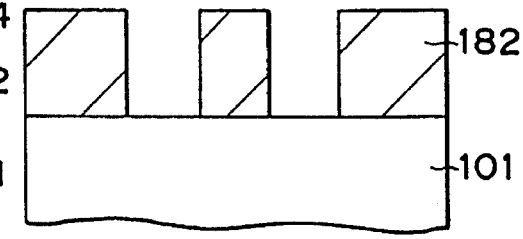

Thereafter, etching was conducted for three minutes on this substrate 101 in the etching chamber 3500 shown in FIG. 23 under the same conditions as those of the previous etching process to form an etching pattern having a sufficient depth, as shown in FIG. 25H.

Example 22

In this Example, an amorphous silicon photo sensor was manufactured according to the present invention. The manufacturing procedures of this photo sensor will be described below with reference to FIGS. 26A through 26D which illustrate the process flow thereof.

Figure 26A:
FIGS. 26A to 26D illustrate steps for an example of an amorphous silicon sensor to which the present invention is applied.

First, a 3000 Å thick Al film 4092 was formed on a glass substrate 4091 by sputtering in the same manner as that of Example 21, as shown in FIG. 26A.

Figure 26B:

Next, a 15 Å thick AlOx film was formed, and etching was then conducted using this AlOx film as the mask to form a lower electrode (Al film) 4092, as shown in FIG. 26B.

Figure 26C:
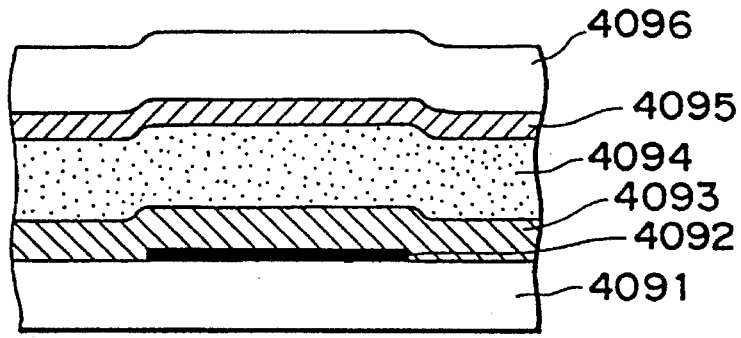
Figure 26D:
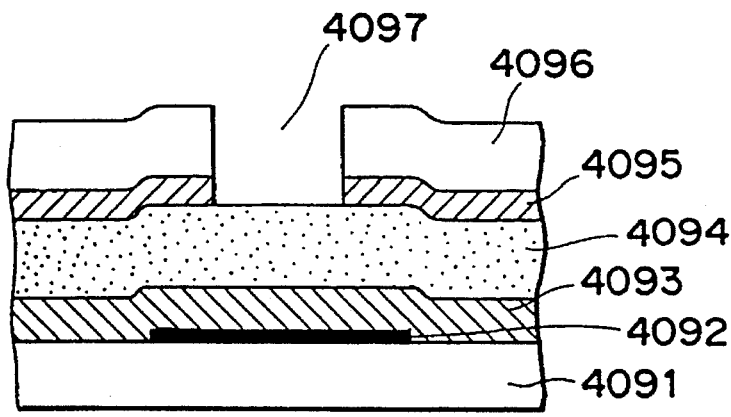

Thereafter, an a-SiN film 4093, an a-Si film 4094 and a $n^+$-a-Si film 4095 were formed in sequence in that order in the plasma film forming chamber shown in FIG. 22, as shown in FIG. 26C.

First, the glass substrate 4091 with the Al electrode pattern 4092 formed thereon was placed on the material holding base 3402 and heated to 250° C. beforehand by a heater (not shown) in the plasma film forming chamber 3400 shown in FIG. 22, and the plasma film forming chamber 3400 was vacuum-evacuated to 10–7 torr or less by the vacuum-evacuating apparatus (not shown). In that state, the substrate was heated to 250° C.

Next, $SiH_4$, $H_2$ and $NH_3$ were respectively introduced into the plasma film forming chamber 3400 from the gas inlet 3401 at flow rates of 10 sccm, 90 sccm and 300 sccm, and the vacuum-evacuating apparatus (not shown) was controlled such that the inner pressure of the plasma film forming chamber 3400 was 0.2 torr.

Next, a high-frequency voltage of 13.56 MHz and 30 W was applied to the counter electrode 3403 while the matching box 3406 was being adjusted so as to generate a plasma in a space between the material holding base 3402 and the counter electrode 3403. Consequently, the introduced gas was plasma decomposed, and the a-SiN film 4093 was thereby formed in a thickness of 3000 Å, as shown in FIG. 26C.

Thereafter, Si and $H_2$ were introduced at flow rates of 60 sccm and 540 sccm, and the a-Si film 4094 was formed in a thickness of 6000 Å under the conditions of a pressure of 0.5 torr and power of 50 W. Thereafter, $SiH_4$ and $PH_3$ of 100 ppm diluted by H2 and $H_2$ were respectively introduced at flow rates of 3 sccm, 150 sccm and 30 sccm, and the $n^+$-a-Si film 4095 was formed in a thickness of 1500 Å under the conditions of a pressure of 0.5 torr and power of 200 W.

Subsequently, an Al film 4096 shown in FIG. 26C was formed in a thickness of 5000 Å in the same manner as that of Example 21.

Next, a 15 Å thick AlOx film was formed in the same manner as that of Example 21, and etching was conducted using this AlOx film as the mask. A series of these processes were repeated twice to form a light incident window 4097 and an upper electrode (Al film) 4096 shown in FIG. 26D.

In this way, high-performance amorphous silicon photo sensors could be manufactured at a high yield.

As will be understood from the foregoing description, in the fine processing method and apparatus therefor according to the present invention, a chemically activated layer is formed in the first step by applying energy to the surface of a material to be processed, and a latent image layer is formed in the second step at a high speed by selectively illuminating an energy beam.

The aforementioned activated layer is formed in either of the following methods: a chemically activated layer is formed by illuminating light on the material to be processed. A thermochemically activated layer is formed by applying heat energy. A chemically activated layer is formed by exposing the surface of the material to a plasma. Alternatively, a combination of these methods is used to form the activated layer. In either method, the device of forming a required activated layer has a simple structure.

Furthermore, since plasma is used in the etching process, highly accurate and high-speed etching is possible. This makes a series of processes for performing fine processing on the material to be processed more accurate and faster as compared with the conventional series of processes which employ photo etching.

Furthermore, fine processing which ensures less damage is made possible by reducing the level of energy of ions which reach the material to be processed from the excitation gas or plasma.

Furthermore, since no resist is used, the amount of dust generated is less, and fine processing of very good yield is made possible.

Furthermore, the thickness of the protective film used as the etching mask can be adjusted by performing the surface modified layer (latent image) forming process and the etching process in sequence a plurality of times. Since the amount (depth) of etching depends on the total thicknesses of the protective films, when sufficiently deep etching is desired, a protective film having a desired total thickness can be obtained. It is therefore possible to readily obtain a desired amount (depth) of etching.

What is claimed is:

1. An apparatus for fine processing comprising:

a holding base for supporting a material to be processed;

an active layer forming chamber for forming an active layer on the surface of said material, said chamber comprising a light source for irradiating said material with ultraviolet rays in a reaction gas and an inlet portion for the reaction gas;

a latent image forming chamber comprising a light source for selectively irradiating said active layer with energy to form a latent image and an inlet portion for a reaction gas to be utilized for forming the latent image;

a shield mask forming chamber comprising an inlet portion for reation gas to be utilized for removing either said latent image layer or said active layer to form a shield mask;

an etching chamber comprising an inlet portion for an etching gas for etching the portion other than a masked portion using the portion left unetched as a shield mask, and a plasma generating portion; and a conveying portion for conveying said holding base to said active layer forming chamber, said latent image forming chamber, said shield mask forming chamber and said etching chamber.

2. An apparatus according to claim 1, wherein said shield mask forming chamber removes the portion other than said latent image layer portion to form a shield mask.

3. An apparatus according to claim 1, wherein said shield mask forming chamber comprises a plasma irradiation chamber.

4. An apparatus according to claim 1, wherein said shield mask forming chamber comprises an excited species irradiation chamber.

5. An apparatus according to claim 1, wherein said holding base comprises a heater for heating said material so that said material being irradiated with ultraviolet rays is also heated to promote a photochemical reaction.

6. An apparatus according to claim 1, wherein said latent image forming chamber comprises a laser beam irradiation source for effecting selective irradiation.

7. An apparatus according to claim 1, wherein said latent image forming chamber comprises an ion beam irradiation source for effecting selective irradiation.

8. An apparatus according to claim 1, wherein said latent image forming chamber comprises an electron beam irradiation source for effecting selective irradiation.

9. An apparatus for fine processing comprising:

a first reaction chamber comprising means for supporting said material to be processed, means for irradiating said material with light, means for introducing a reaction gas into said first reaction chamber and vacuum evacuation means and used for forming an active layer on the surface of said material to be processed;

a second chamber comprising means for supporting said material to be processed, means for introducing a reaction gas into said second reaction chamber, vacuum evacuation means and means for selectively irradiating the surface of said material with energy and used for forming a latent image layer in the energy-irradiated portion;

a third chamber comprising means for supporting said material to be processed, means for introducing a reaction gas into said third reaction chamber, vacuum evacuation means and means for introducing a plasma into said third reaction chamber and used for removing either said latent image layer or said active layer to define the portion left unremoved as a shield mask and etching the portion other than the masked portion; and a conveying portion comprising a gate valve, capable of communicating with said first, second and third reaction chambers, for conveying said to-be-processed material inside said first, second and third reaction chambers without exposing said material to the atmosphere.

10. An apparatus according to claim 9, wherein only the portion other than said latent image layer is removed to define the portion left unremoved as a shield mask and the portion other than the masked portion is etched in said third chamber.

11. An apparatus according to claim 9, further comprising a plasma generating chamber for generating the plasma, wherein only excited gas is supplied from said plasma generating chamber into said third reaction chamber.

12. An apparatus according to claim 9, further comprising a plasma generating chamber for generating the plasma, wherein the plasma is supplied from said plasma generating chamber into said third reaction chamber.

13. An apparatus for fine processing comprising:

a holding base for supporting a material to be processed;

an active layer forming chamber comprising a heater for forming an active layer on the surface of said material by heating said material in a reaction gas, and an inlet portion for the reaction gas;

a latent image forming chamber comprising a light source for selectively irradiating said active layer with energy to form a latent image layer, and an inlet portion for a reaction gas to be utilized for forming the latent image;

an etching chamber comprising an inlet portion for an etching gas for etching the portion other than a masked portion using the portion left unetched as a shield mask, and a plasma generating portion; and a conveying portion for conveying said holding base to said active layer forming chamber, said latent image forming chamber and said etching chamber.

14. An apparatus according to claim 13, wherein said shield mask forming chamber removes the portion other than said latent image layer portion to form a shield mask.

15. An apparatus according to claim 13, wherein said shield mask forming chamber comprises a plasma irradiation chamber.

16. An apparatus according to claim 13, wherein said shield mask forming chamber comprises an excited species irradiation chamber.

17. An apparatus according to claim 13, wherein said holding base comprises a heater for heating said material.

18. An apparatus according to claim 13, wherein said latent image forming chamber comprises a laser beam irradiation chamber for effecting selective irradiation.

19. An apparatus according to claim 13, wherein said latent image forming chamber comprises an ion beam irradiation chamber for effecting selective irradiation.

20. An apparatus according to claim 13, wherein said latent image forming chamber comprises an electron beam irradiation chamber for effecting selective irradiation.

21. An apparatus for fine processing comprising:

a first reaction chamber comprising means for supporting said material to be processed, means for heating said material, means for introducing a reaction gas into said first reaction chamber and vacuum evacuation means and used for forming an active layer on the surface of said material to be processed;

a second chamber comprising means for supporting said material to be processed, means for introducing a reaction gas into said second reaction chamber, vacuum evacuation means and means for selectively irradiating the surface of said material with energy and used for forming a latent image layer in the energy-irradiated portion;

a third chamber comprising means for supporting said material to be processed, means for introducing a reaction gas into said third reaction chamber, vacuum evacuation means and means for introducing a plasma into said third reaction chamber and used for removing either said latent image layer or said active layer to define the portion left unremoved as a shield mask and etching the portion other than the masked portion; and means for conveying said to-be-processed material inside said first, second and third reaction chambers without exposing said material to the atmosphere.

22. An apparatus according to claim 21, wherein only the portion other than said latent image layer is removed from to define the portion left unremoved as a shield mask and the portion other than the masked portion is etched in said third chamber.

23. An apparatus according to claim 21, further comprising a plasma generating chamber for generating the plasma, wherein only excited gas is supplied from said plasma generating chamber into said third reaction chamber.

24. An apparatus according to claim 21, further comprising a plasma generating chamber for generating the plasma, wherein the plasma is supplied from said plasma generating chamber into said third reaction chamber.

25. An apparatus for fine processing comprising a first vaccumizable airtight reaction chamber for carrying out a first step, a second vaccumizable airtight reaction chamber for carrying out a second step and a third vaccumizable airtight reaction chamber for carrying out a third and a fourth steps, wherein said first reaction chamber includes:

a table which is provided therein and used for supporting a material to be processed;

means for supplying a treatment gas to be used for treating said material in said first step into said first reaction chamber; and means for supplying electromagnetic energy to generate a plasma in said treatment gas, wherein said second reaction chamber includes:

a table which is provided therein and has means for supporting said material to be processed;

means for supplying a treatment gas to be used for treating said material in said second step into said second reaction chamber;

means for vacuum-evacuating said second reaction chamber; and means capable of generating an energy beam, controlling said beam and irradiating said material with said beam, wherein said third reaction chamber includes:

a table which is provided therein and which has means for supporting said material to be processed;

means for supplying a treatment gas to be used for treating said material in said third and fourth steps into said third reaction chamber;

means for vacuum-evacuating said third reaction chamber; and means for generating a plasma within said third reaction chamber; or means which is provided outside said third reaction chamber and has a plasma chamber capable of generating a plasma of a treatment gas to be used for treatment in said third and said fourth steps and which is capable of supplying only excited gas or the plasma from said plasma chamber into said third reaction chamber;

and wherein said first, said second and said third reaction chambers are connected by means of gate valves to one another or are connected by means of gate valves to a vaccumizable airtight chamber including material conveying means and vacuum-evacuating means so that said first, said second, said third and said fourth steps are carried out successively without exposing said material to the atmosphere.

26. An apparatus for fine processing comprising:

a holding base for for supporting a material to be processed;

an active layer forming chamber comprising energy generating means for forming an active layer on the surface of said material by applying energy to a reaction gas, and an inlet portion for the reaction gas;

a latent image forming chamber comprising energy generating means for generating energy for selectively irradiating said active layer with the energy to form a latent image layer, and an inlet portion for a reaction gas to be utilized for forming the latent image;

a shield mask forming chamber comprising an inlet portion for a reaction gas to be utilized for removing either said latent image layer or said active layer to form a shield, and a plasma generating portion;

an etching chamber comprising an inlet portion for an etching gas for etching the portion other than the masked portion using the portion left unetched as the shield mask, and a plasma generating portion; and a conveying portion for conveying said holding base to said active layer forming chamber, said latent image forming chamber, said shield mask forming chamber and said etching chamber.

27. An apparatus according to claim 26, wherein said shield mask forming chamber removes the portion other than said latent image layer portion to form a shield mask.

28. An apparatus according to claim 26, wherein said shield mask forming chamber comprises a plasma irradiation chamber.

29. An apparatus according to claim 26, wherein said shield mask forming chamber comprises an excited species irradiation chamber.

30. An apparatus according to claim 26, wherein said holding base comprises a heater for heating said material so that said material being irradiated with the energy is also heated to promote a photochemical reaction.

31. An apparatus according to claim 26, wherein said latent image forming chamber comprises a laser beam irradiation source for effecting selective irradiation.

32. An apparatus according to claim 26, wherein said latent image forming chamber comprises an ion beam irradiation source for effecting selective irradiation.

33. An apparatus according to claim 26, wherein said latent image forming chamber comprises an electron beam irradiation source for effecting selective irradiation.

34. An apparatus for fine processing comprising:

a first reaction chamber comprising means for supporting said material to be processed, means for applying energy to said material, means for introducing a reaction gas into said first reaction chamber and vacuum evacuation means and used for forming an active layer on the surface of said material to be processed;

a second chamber comprising means for supporting said material to be processed, means for introducing a reaction gas into said second reaction chamber, vacuum evacuation means and means for selectively irradiating the surface of said material with energy and used for forming a latent image layer in the energy-irradiated portion;

a third chamber comprising means for supporting said material to be processed, means for introducing a reaction gas into said third reaction chamber, vacuum evacuation means and means for introducing a plasma into said third reaction chamber and used for removing either said latent image layer or said active layer to define the portion left unremoved as a shield mask and etching the portion other than the masked portion; and means for conveying said to-be-processed material inside said first, second and third reaction chambers without exposing said material to the atmosphere.

35. An apparatus according to claim 34, wherein only the portion other than said latent image layer is removed from to define the portion left unremoved as a shield mask and the portion other than the masked portion is etched in said third chamber.

36. An apparatus according to claim 34, further comprising a plasma generating chamber for generating the plasma, wherein only excited gas is supplied from said plasma generating chamber into said third reaction chamber.

37. An apparatus according to claim 34, further comprising a plasma generating chamber for generating the plasma, wherein the plasma is supplied from said plasma generating chamber into said third reaction chamber.

* * * * *

UNITED STATES PATENT AND TRADEMARK OFFICE
CERTIFICATE OF CORRECTION

PATENT NO.    : 5,573,891
DATED         : November 12, 1996
INVENTOR(S)   : Yasue Sato et al.

It is certified that error appears in the above-identified patent and that said Letters Patent is hereby corrected as shown below:

Title page,
Item [30], Foreign Application Priority Data,
    "Mar. 9, 1992   (JP)   Japan……………...3-050792" should read
    --Mar. 9, 1992   (JP)   Japan……………...4-050792 --.

Column 1,
Line 58, "garb" should read -- gas --.

Column 2,
Line 62, "in the device" should be deleted.

Column 5,
Line 6, "selectively." should read -- selectively --.

Column 8,
Line 52, "ofbeing" should read -- of being --.

Column 10,
Line 25, "100" should read -- 100, --; and
Line 59, "radiations" should read -- radiation --.

Column 15,
Line 46, "EMBODIMENTS" should read -- EMBODIMENT --.

Column 16,
Line 52, "EMBODIMENTS" should read -- EMBODIMENT --.

Column 20,
Line 20, "such as" should read -- such as a --; and
Line 62, "which is the material is" should read -- , which is the material to be processed, is --.

Column 21,
Line 12, "light," should read -- light, and --.

Column 22,
Line 32, "of" should be deleted.

Column 25,
Line 39, "593" should read -- 503 --.

UNITED STATES PATENT AND TRADEMARK OFFICE
CERTIFICATE OF CORRECTION

PATENT NO.    : 5,573,891
DATED         : November 12, 1996
INVENTOR(S)   : Yasue Sato et al.

It is certified that error appears in the above-identified patent and that said Letters Patent is hereby corrected as shown below:

Column 28,
Line 2, "70.3" should read -- 703 --.

Column 30,
Line 25, "anisotrpic" should read -- anisotropic --.

Column 31,
Line 65, "150 A" should read -- 150 Å --.

Column 32,
Line 38, "875gauss" should read -- 875 gauss --.

Column 40,
Line 12, "150 A" should read -- 150 Å --; and
Line 14, "Gauss" should read -- gauss --.

Column 42,
Line 12, "$SiI_x$" should read -- $(SiI_x)$ --; and
Line 22, "land" should read -- and --.

Column 43,
Line 7, "400" should read -- 4,000 --; and
Line 27, "was;" should read -- was --.

Column 45,
Line 13, "]FIG." should read -- FIG. --.

Column 48,
Line 55, ":having" should read -- having --.

Column 51,
Line 6, "10" should be deleted; and
Line 11, "Si" should read -- a Si --.

Column 53,
Line 23, "3:2, 03." should read -- 3203. --.

Column 56,
Line 14, "reation" should read -- reaction --;
Line 54, "second chamber" should read -- second reaction chamber --; and
Line 62, "third chamber" should read -- third reaction chamber --.

UNITED STATES PATENT AND TRADEMARK OFFICE
CERTIFICATE OF CORRECTION

PATENT NO. : 5,573,891
DATED : November 12, 1996
INVENTOR(S) : Yasue Sato et al.

It is certified that error appears in the above-identified patent and that said Letters Patent is hereby corrected as shown below:

Column 57,
Line 66, "second chamber" should read -- second reaction chamber --.

Column 58,
Line 6, "third chamber" should read -- third reaction chamber --;
Line 18, "from" should be deleted;
Lines 31, 32 and 33, "vaccumizable" should read -- vacuumizable --;

Column 59,
Line 9, "vaccumizable" should read -- vacuumizable --; and
Line 15, "for for" should read -- for --.

Column 60,
Line 18, "second chamber" should read -- second reaction chamber --;
Line 25, "third chamber" should read -- third reaction chamber --; and
Line 38, "from" should be deleted.

Signed and Sealed this

Fourteenth Day of September, 2004

JON W. DUDAS
*Director of the United States Patent and Trademark Office*